(12) United States Patent
Kim et al.

(10) Patent No.: US 10,304,912 B2
(45) Date of Patent: May 28, 2019

(54) DISPLAY DEVICE

(71) Applicant: Samsung Display Co., LTD., Yongin-si, Gyeonggi-Do (KR)

(72) Inventors: Byoungki Kim, Seoul (KR); Jongsung Bae, Hwaseong-si (KR); Hojin Yoon, Hwaseong-si (KR); Dae Woo Lee, Hwaseong-si (KR); Yun-Mo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 98 days.

(21) Appl. No.: 15/402,824

(22) Filed: Jan. 10, 2017

(65) Prior Publication Data

US 2017/0200774 A1 Jul. 13, 2017

(30) Foreign Application Priority Data

Jan. 11, 2016 (KR) .......................... 10-2016-0003304

(51) Int. Cl.
*H01L 27/32* (2006.01)
*G02B 26/00* (2006.01)
*H01L 51/52* (2006.01)

(52) U.S. Cl.
CPC ........ *H01L 27/3232* (2013.01); *G02B 26/005* (2013.01); *H01L 27/3244* (2013.01); *H01L 51/5271* (2013.01); *H01L 2227/323* (2013.01)

(58) Field of Classification Search
CPC ............. H01L 51/5206; H01L 51/5234; H01L 27/3232; H01L 27/3262; H01L 27/3276; H01L 51/5253; H01L 51/5271; H01L 2251/5338; H01L 51/5281; G02B 26/005; G03F 7/0007; G03F 7/2002; G03F 7/32; G03F 7/38
See application file for complete search history.

(56) References Cited

U.S. PATENT DOCUMENTS

| 2012/0243070 A1* | 9/2012 | Kuhlman | G02B 26/005 |
| | | | 359/290 |
| 2013/0257914 A1* | 10/2013 | Jung | G09G 3/348 |
| | | | 345/690 |

FOREIGN PATENT DOCUMENTS

| KR | 10-2009-0053530 A | 5/2009 |
| KR | 10-2009-0099744 A | 9/2009 |
| KR | 10-2009-0102113 A | 9/2009 |

* cited by examiner

*Primary Examiner* — Roy K Potter
(74) *Attorney, Agent, or Firm* — Innovation Counsel LLP

(57) ABSTRACT

A display device may include a light-emitting element and a controllable element. The light-emitting element may emit a light. The controllable element may neighbor the light-emitting element in a plan view of the display device and may include a fluid set. The fluid set may include at least one of a light-reflecting element set and a black element set. The controllable element may have a first average reflectance value in a first direction if the controllable element receives no voltage or receives a first voltage. The controllable element may have a second average reflectance value in the first direction if the controllable element receives a second voltage. The second voltage may be unequal to the first voltage. The second average reflectance value may be unequal to the first average reflectance value.

20 Claims, 47 Drawing Sheets

DISPLAY DEVICE

CROSS-REFERENCE TO RELATED APPLICATION(S)

This application claims priority under 35 U.S.C. § 119 to Korean Patent Application No. 10-2016-0003304, filed on Jan. 11, 2016 in the Korean Intellectual Property Office KIPO; the contents of the Korean Patent Application are herein incorporated by reference in their entireties.

BACKGROUND

1. Field

The technical field relates to a display device, such as an organic light emitting display device.

2. Description of the Related Art

Among various types of display devices, an organic light emitting diode (OLED) display device, or organic light emitting display device, may have several advantages, such as a relatively high luminance, a relatively wide viewing angle, and/or relatively desirable thinness. In the OLED display device, electrons and holes are injected into an organic thin layer through a cathode and an anode. The electrons and holes are recombined in the organic thin layer to generate excitons, thereby emitting a light of a certain wavelength.

SUMMARY

Embodiments are related to a display device, e.g., an organic light emitting display device, having a mirror mode and a non-mirror mode.

In an embodiment, the organic light emitting display device includes the following elements: a first substrate comprising a first region (or "light-emitting" region because of overlapping a light-emitting device) and a second region (or "reflection" region because of overlapping a reflecting device); a light-emitting element disposed in the first region (or light-emitting region) and configured to emit a light of a predetermined color (e.g., a red light, green light, or blue light); and a switchable element disposed in the second region (or reflection region), wherein reflectance (and/or reflectivity) of the switchable element may change according to voltage received by the switchable element.

In an embodiment, the switchable element may include a first switching element connected to a first gate line extending in a first direction and a second data line extending in a second direction crossing the first direction, a switchable electrode electrically connected to the first switching element, an insulation layer disposed on the switchable electrode, a spacer disposed on boundary portion of the light-emitting region and the reflection region and an oil solution and an aqueous solution interposed in a space formed by the insulation layer and the spacer.

In an embodiment, the oil solution may include reflection material.

In an embodiment, the insulation layer may be hydrophobic.

In an embodiment, the light-emitting element may include second switching element connected to a third gate line extending in the first direction and a fourth data line extending in the second direction crossing the first direction, a first electrode electrically connected to the second switching element, a light-emitting layer disposed on the first electrode and a second electrode covering the light-emitting layer.

In an embodiment, the first switching element may be disposed on the same layer as the second switching element. The switchable electrode may be disposed on the same layer as the first electrode.

In an embodiment, the organic light emitting display device may further include a middle insulation layer covering the light-emitting element. The first switching element may be disposed on the same layer as the second switching element. The switchable electrode may be disposed on the middle insulation layer.

In an embodiment, when a voltage is not applied to the switchable element, the switchable element may form a reflection surface on the reflection region.

In an embodiment, the organic light emitting display device may further include a second substrate including a light-emitting region and a reflection region and facing the first substrate. The light-emitting element may be disposed on the first substrate. The switchable element may be disposed on the second substrate.

In an embodiment, the oil solution may include reflection material.

In an embodiment, when a voltage is not applied to the switchable element, the switchable element may form a reflection surface on the reflection region.

In an embodiment, the organic light emitting display device may further include a reflection member disposed on the reflection region. The oil solution may include black material.

In an embodiment, when a voltage is applied to the switchable element, the switchable element may form a reflection surface on the reflection region.

In an embodiment, the switchable element may include a micro-capsule comprising a first particle comprising black material and a second particle comprising reflection material, a lower electrode disposed under the micro-capsule and an upper electrode facing the lower electrode and disposed on the micro-capsule.

In an embodiment, the first particle may be charged by "+" electric charge and the second particle may be charged by "−" electric charge.

In an embodiment, when a "−" voltage is applied to the lower electrode, the switchable element may form a reflection surface on the reflection region.

In an embodiment, the first particle may be charged by "−" electric charge and the second particle may be charged by "+" electric charge.

In an embodiment, when a "+" voltage is applied to the lower electrode, the switchable element may form a reflection surface on the reflection region.

In an embodiment, the organic light emitting display device may further include a second substrate including a light-emitting region and a reflection region and facing the first substrate. The switchable element may be disposed on the second substrate.

In an embodiment, wherein the switchable element may be disposed on the first substrate.

An embodiment may be related to a display device. The display device may include a light-emitting element and a controllable element. The light-emitting element, e.g., an organic light-emitting device, may emit a light. The controllable element may neighbor the light-emitting element in a plan view of the display device and may include a fluid set. The fluid set may include at least one of a light-reflecting element set and a black element set. The controllable element may have a first average reflectance value in a first direction (e.g., a predetermined direction) if the controllable element receives no voltage or receives a first voltage. The controllable element may have a second average reflectance value in the first direction (e.g., the predetermined direction) if the controllable element receives a second voltage. The second voltage may be unequal to the first voltage. The second average reflectance value may be unequal to the first average reflectance value. The first direction (e.g., the predetermined direction) may be perpendicular to an image display surface of the display device. The features may be appreciated from, for example, FIG. 2, FIG. 3, FIG. 12, FIG. 13, FIG. 20, FIG. 21, FIG. 28, FIG. 29, FIG. 37, FIG. 38, FIG. 43, FIG. 44, and related description.

The fluid set may include the light-reflecting element set (and may include no black element set). The fluid set may have a first size in the plan view of the display device if the controllable element receives no voltage or receives the first voltage. The fluid set may have a second size if the controllable element receives the second voltage. The first size may be greater than the second size. The first average reflectance value may be greater than the second average reflectance value. The features may be appreciated from, for example, FIG. 2, FIG. 3, FIG. 12, FIG. 13, FIG. 20, FIG. 21, and related description.

The display device may include an insulating-material member. The light-emitting element may include a first electrode and a light-emitting layer (e.g., an organic light-emitting layer). The first electrode may directly contact the light-emitting layer and may directly contact a first flat side of the insulating material member. The fluid set may directly contact a second flat side of the insulating-material member. The second flat side of the insulating-material member may be opposite the first flat side of the insulating-material member. The features may be appreciated from, for example, FIG. 2, FIG. 3, and related description.

The controllable element may include an aqueous set, which may directly contact the fluid set and the second flat side of the insulating-material member. The fluid set may include oil. The features may be appreciated from, for example, FIG. 2, FIG. 3, and related description.

The display device may include a first insulation layer. The light-emitting element may include a first electrode and a light-emitting layer. The first electrode may directly contact the light-emitting layer and the first insulation layer. The controllable element may include a second electrode and an isolation layer. The isolation layer may directly contact the fluid set and may directly contact the second electrode. The second electrode may directly contact the first insulation layer. The features may be appreciated from, for example, FIG. 2, FIG. 3, FIG. 12, FIG. 13, FIG. 20, FIG. 21, and related description.

A first flat side of the first insulation layer may directly contact the first electrode and may directly contact the second electrode. The features may be appreciated from, for example, FIG. 2, FIG. 3, and related description.

A first flat side of the first insulation layer may directly contact the first electrode. A second flat side of the first insulation layer may directly contact the second electrode. The second flat side of the first insulation layer may be opposite the first flat side of the first insulation layer. The features may be appreciated from, for example, FIG. 12, FIG. 13, FIG. 20, FIG. 21, and related description.

The first insulation layer may be a single-layer insulation layer. The features may be appreciated from, for example, FIG. 12, FIG. 13, and related description.

The first insulation layer may be a multilayer insulation layer. The features may be appreciated from, for example, FIG. 20, FIG. 21, and related description.

The display device may include a switching element, which may be positioned inside the first insulation layer, may directly contact the first insulation layer, and may be electrically connected to the second electrode. The features may be appreciated from, for example, FIG. 20, FIG. 21, and related description.

The display device may include a switching element, which may be positioned may be electrically connected to the second electrode and may be positioned between the first electrode and the second electrode. The features may be appreciated from, for example, FIG. 20, FIG. 21, and related description.

The controllable element may include a light-reflecting member, which may overlap the fluid set. The fluid set may include the black element set (and may include no light-reflecting element set). The fluid set may have a first size in the plan view of the display device if the controllable element receives no voltage or the first voltage. The fluid set may have a second size if the controllable element receives the second voltage. The first size may be greater than the second size. The first average reflectance value may be less than the second average reflectance value. The features may be appreciated from, for example, FIG. 28, FIG. 29, and related description.

The controllable element may include an isolation layer, an electrode, and a switching element. The isolation layer may be positioned between the fluid set and the electrode and may directly contact each of the fluid set and the electrode. The switching element may be electrically connected to the electrode and may be positioned between the electrode and the light-reflecting member. The features may be appreciated from, for example, FIG. 28, FIG. 29, and related description.

The fluid set may include both the light-reflecting element set and the black element set. One of the light-reflecting element set and the black element set may be positively electrically charged (and/or may carry a positive electric charge). Another of the light-reflecting element set and the black element set may be negatively electrically charged (and/or may carry a negative electric charge). The features may be appreciated from, for example, FIG. 37, FIG. 38, FIG. 43, FIG. 44, and related description.

The light-emitting element may be positioned closer to the light-reflecting element set than to the black element set if the controllable element receives the first voltage. The light-emitting element may be positioned closer to the black element set than to the light-reflecting element set if the controllable element receives the second voltage. The features may be appreciated from, for example, FIG. 37, FIG. 38, FIG. 43, FIG. 44, and related description.

The fluid set may include an insulating fluid set, which may directly contact the light-reflecting element set and may directly contact the black element set. The features may be appreciated from, for example, FIG. 37, FIG. 38, FIG. 43, FIG. 44, and related description.

The light-emitting element may be configured to emit a light of a predetermined color. The insulating fluid set may be of the predetermined color. The features may be appreciated from, for example, FIG. 37, FIG. 38, FIG. 43, FIG. 44, and related description.

The controllable element may include a first electrode. The light-reflecting element set may be positioned between the first electrode and the black element set if the controllable element receives the first voltage. The black element set may be positioned between the first electrode and the light-reflecting element set if the controllable element receives the second voltage. The features may be appreciated from, for example, FIG. 37, FIG. 38, FIG. 43, FIG. 44, and related description.

The fluid set may include a first fluid subset and second fluid subset. The first fluid subset may include a first portion of the light-reflecting element set and a first portion of the black element set. The second fluid subset may include a second portion of the light-reflecting element set and a second portion of the black element set. The controllable element may include a dielectric member. The dielectric member may be positioned between the first fluid subset and the second fluid subset and may directly contact each of the first fluid subset, the second fluid subset, and the first electrode. The features may be appreciated from, for example, FIG. 37, FIG. 38, FIG. 43, FIG. 44, and related description.

The display device may include an insulation layer, which may directly contact the first electrode. The light-emitting element may include a light-emitting layer and a second electrode. The second electrode may directly contact the light-emitting layer and may directly contact the insulation layer. The features may be appreciated from, for example, FIG. 37, FIG. 38, FIG. 43, FIG. 44, and related description.

Although the terms "first", "second", etc. are used to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

According to embodiments, a display device, e.g., an organic light emitting display device, includes a controllable element (e.g., a switchable element), wherein reflectance (and/or reflectivity) of the controllable element in a predetermined direction may be controlled and/or changed through controlling and/or changing voltage received by the controllable element. Thus, the display device may switch between a mirror mode and a non-mirror mode.

DETAILED DESCRIPTION

Embodiments are explained in detail with reference to the accompanying drawings. Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 1:
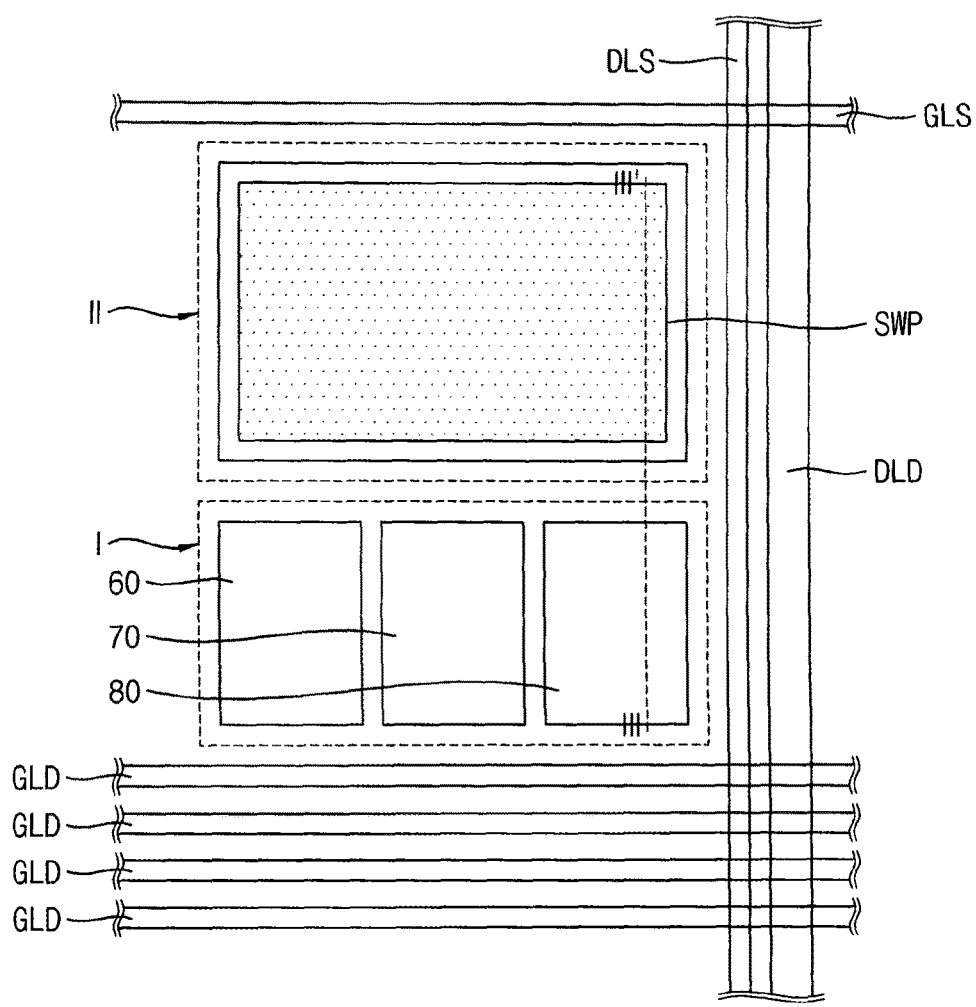
FIG. 1 is a plan view illustrating a display device, e.g., an organic light emitting display device, according to an embodiment.
Figure 2:
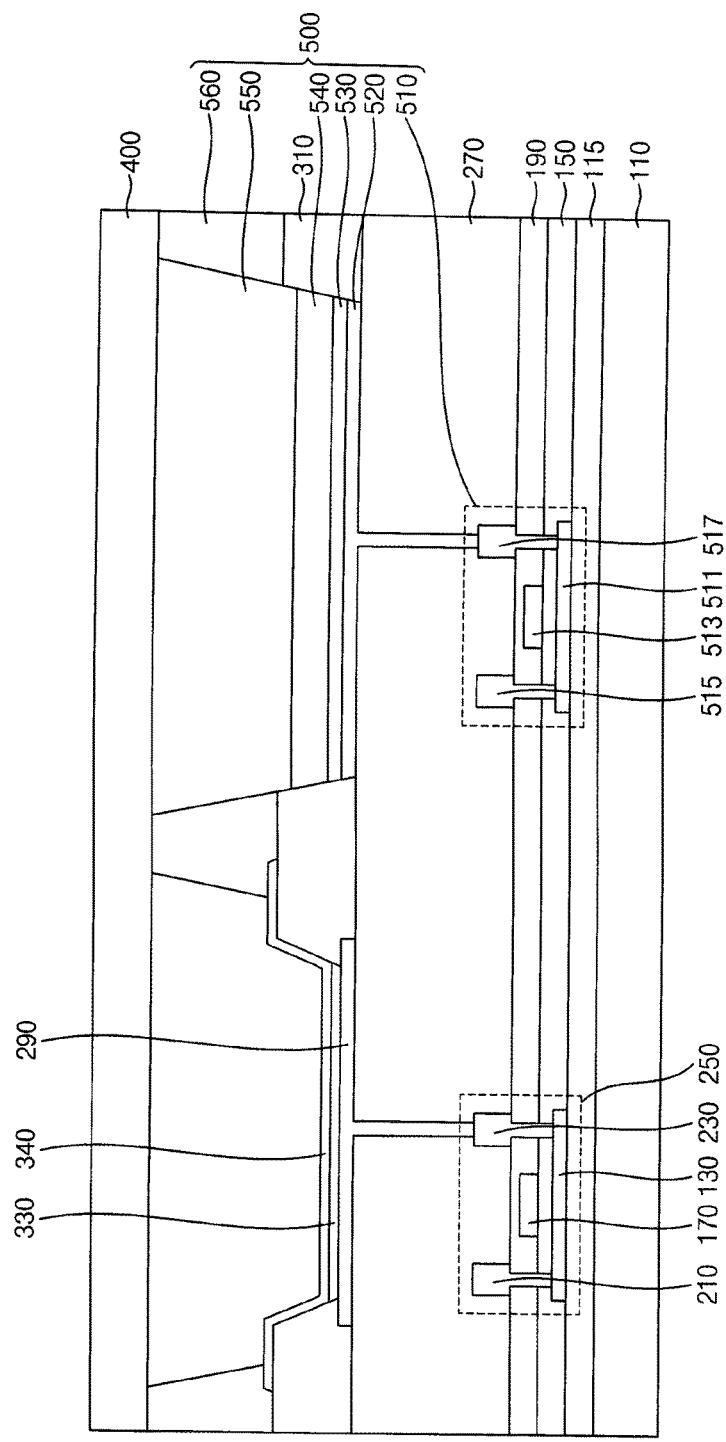
FIG. 2 is a cross-sectional view taken along a line III-III' of FIG. 1.
Figure 3:
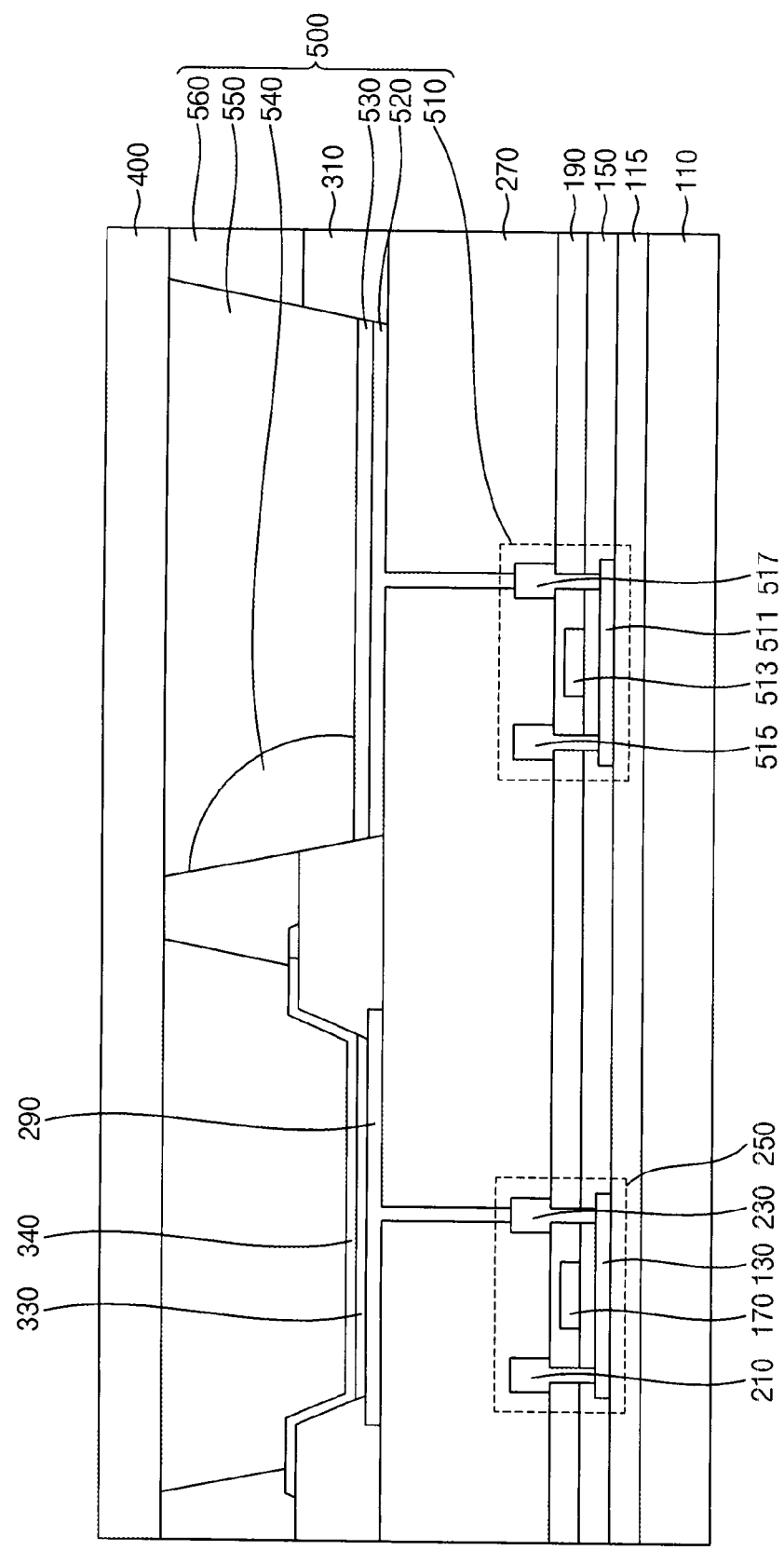
FIG. 3 is a cross-sectional view taken along a line III-III' of FIG. 1.

FIG. 1 is a plan view illustrating a display device, e.g., an organic light emitting display device, according to an embodiment. FIG. 2 is a cross-sectional view taken along a line III-III' of FIG. 1. FIG. 3 is a cross-sectional view taken along a line III-III' of FIG. 1.

Referring to FIGS. 1 and 2, an organic light emitting display device according to an embodiment may include a light-emitting region I and a reflection region II. Pixels 60, 70, and 80 may be positioned in the light-emitting region I, and a transparent window 90 may be positioned in the reflection region II. For example, the pixel 60 may be a pixel emitting a red color, the pixel 70 may be a pixel emitting a green color, and the pixel 80 may be a pixel emitting a blue color.

A switching part SWP may be disposed in the reflection region II. A controllable element, e.g., a switchable element 500, may be disposed in the switching part SWP. Average reflectance (and/or average reflectivity) of the switchable element 500 in a predetermined direction (e.g., in a direction perpendicular to an image display surface of the display device) may change according to voltages applied to the switchable element 500. The switchable element 500 may have a first average reflectance value in a first direction (e.g., a direction perpendicular to the substrate 400) if no voltage or a first voltage is applied to the switchable element 500. The switchable element 500 may have a second average reflectance value in the first direction if a second voltage is applied to the switchable element. The second voltage may be unequal to the first voltage, and the second average reflectance value may be unequal to the first average reflectance value. In an embodiment, the switchable element 500 may use an electrowetting technique. The electrowetting technique is a technique that uses changes of a contact angle and an interface shape of a fluid according to a change of a surface tension of the fluid when an electric field is applied to a surface of the fluid. In general, the contact angle of a droplet of the fluid on a hydrophobic solid surface may change according to a voltage applied to the droplet. For example, when a hydrophilic droplet is on the hydrophobic solid surface, the droplet may have a substantially spherical shape. However, when the solid surface changes from hydrophobic to hydrophilic by the applied voltage, an area of the contact surface between the droplet and the solid surface may be increased.

A display gate line GLD, a display data line DLD, a switchable gate line GLS and a switchable data line DLS are disposed adjacent to the light-emitting region I and the reflection region II.

The display gate line GLD and the display data line DLD are connected to a switching element 250, and the switchable gate line GLS and the switchable data line DLS are connected to a switchable switching element 510 of the switchable element 500.

Thus, an organic light emitting display device and a switchable element according to an embodiment may be independently operated respectively.

An organic light emitting display device according to an embodiment a first substrate 110, a buffer layer 115, a first insulation interlayer 150, a second insulation layer 190, a third insulation layer 270, a light emitting structure, a pixel defining layer 310, a switchable element 500 and a second substrate 400. Here, the light emitting structure includes a switching element 250, a first electrode 290, an emission layer 330 (e.g., an organic light-emitting layer), and a second electrode 340. The switching element 250 includes an active member 130, a gate electrode 170, a source electrode 210, and a drain electrode 230.

The organic light emitting display device 100 may include a plurality of pixel regions. One pixel region may include the light-emitting region I and the reflection region II. The reflection region II may substantially surround the light-emitting region I. The switching element 250, the first electrode 290, the emission layer 330 and a portion of the second electrode 340 may be disposed in the light-emitting region I. However, the switching element 250 may be disposed in the light-emitting region I.

A display image may be displayed in light-emitting region I. An image of an object that is located in the front of the organic light emitting display device 100 may be reflected in the reflection region II.

The light emitting structure may be disposed on the first substrate 110. The first substrate 110 may be formed of transparent materials. For example, the first substrate 110 may include quartz, synthetic quartz, calcium fluoride, fluoride-doping quartz, a soda-lime glass, a non-alkali glass etc. Alternatively, the first substrate 110 may be formed of a flexible transparent resin substrate. Here, the flexible transparent resin substrate for the first substrate 110 may include a polyimide substrate. For example, the polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structure. That is, in example embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the switching element 250, a capacitor, the first electrode 290, the light emitting layer 330, the second electrode 340, etc.) may be disposed on the insulation layer.

After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may serve as the first substrate 110 after the removal of the glass substrate. As the organic light emitting display device 100 includes the light-emitting region I and the reflection region II, the first substrate 110 may also include the light-emitting region I and the reflection region II.

A buffer layer 115 may be disposed on the first substrate 110. The buffer layer 115 may extend from the light-emitting region I into the reflection region II. The buffer layer 115 may prevent the diffusion (e.g., an out gassing) of metal atoms and/or impurities from the first substrate 110. Additionally, the buffer layer 115 may control a rate of a heat transfer in a crystallization process for forming the active member 130, thereby obtaining substantially uniform the active member 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be disposed.

The switching element 250 may include the active member 130, the gate electrode 170, the source electrode 210, and the drain electrode 230. For example, the active member 130 may be disposed on the first substrate 110. The active member 130 may be formed an oxide semiconductor, an inorganic semiconductor (e.g., amorphous silicon, polysilicon, etc.), an organic semiconductor, etc.

The first insulation layer 150 may be disposed on the active member 130. The first insulation layer 150 may cover the active member 130 in the light-emitting region I, and may extend in the first direction on the first substrate 110. That is, the first insulation layer 150 may be disposed on the entire first substrate 110. The first insulation layer 150 may be formed a silicon compound, a metal oxide, etc.

The gate electrode 170 may be disposed on a portion of the first insulation layer 150 under which the active member 130 is disposed. The gate electrode 170 may be formed of a metal, an alloy, metal nitride, conductive metal oxide, transparent conductive materials, etc.

The second insulation layer 190 may be disposed on the gate electrode 170. The second insulation layer 190 may cover the gate electrode 170 in the light-emitting region I, and may extend in the first direction on the first substrate 110. That is, the second insulation layer 190 may be disposed on the entire first substrate 110. The second insulation layer 190 may be formed of a silicon compound, a metal oxide, etc.

The source electrode 210 and the drain electrode 230 may be disposed on the second insulation layer 190. The source electrode 210 may be in contact with a first side of the active member 130 by removing a portion of the first and second insulation layers 150 and 190. The drain electrode 230 may be in contact with a second side of the active member 130 by removing a second portion of the first and second insulation layers 150 and 190. Each of the source electrode 210 and the drain electrode 230 may be formed of a metal, an alloy, metal nitride, conductive metal oxide, transparent conductive materials, etc.

In an embodiment, the gate electrode 170 is disposed on the active member 130. However, the gate electrode 170 may be disposed under the active member 130.

The pixel defining layer 310 may be disposed the on third insulation layer 270 to expose a portion of the first electrode 290. The pixel defining layer 310 may be formed of organic insulating material(s) and/or inorganic insulating material(s). In this case, the light emitting layer 330 may be disposed on a portion that the first electrode 290 is exposed by the pixel defining layer 310.

The light emitting layer 330 may be disposed on the exposed first electrode 290. The light emitting layer 330 may be formed using light emitting materials capable of generating different colors of light (e.g., a red color of light, a blue color of light, and a green color of light). However, the light emitting layer 330 may stack light emitting materials capable of generating different colors of light to emit white color of light.

The second electrode 340 may be disposed on the pixel defining layer 310 and the light emitting layer 330. The second electrode 340 may cover the pixel defining layer 310 and the light emitting layer 330 in the light-emitting region I and the reflection region II, and may extend in the first direction on the first substrate 110. That is, the second electrode 340 may be electrically connected to the first through third pixels. The second electrode 340 may be formed of a metal, an alloy, metal nitride, conductive metal oxide, a transparent conductive material, etc. These may be used alone or in a combination thereof. The first substrate 110 may be combined with the second substrate 400 by using a sealing member. In addition, a filler may be disposed between the first substrate 110 and the second substrate 400.

The second substrate 400 and the first substrate 110 may include substantially the same materials. For example, the second substrate 400 may be formed of quartz, synthetic quartz, calcium fluoride, fluoride-doping quartz, soda-lime glass, non-alkali glass etc. In some example embodiments, the second substrate 400 may be formed of a transparent inorganic material or flexible plastic. For example, the second substrate 400 may include a flexible transparent resin substrate. In this case, to increase flexibility of the organic light emitting display device 100, the second substrate 400 may include a stacked structure where at least one organic layer and at least one inorganic layer are alternately stacked.

The switchable element 500 includes a switchable switching element 510, a switchable electrode 520, an isolation layer (e.g., an insulation layer 530), a fluid set (e.g., an oil solution 540), an aqueous solution 550, and a spacer 560.

The switchable switching element 510 includes a switchable active member 511, a switchable gate electrode 513, a switchable source electrode 515 and a switchable drain electrode 517. The switchable switching element 510 is substantially same as the switching element 250, and thus repetitive explanation will be omitted.

The switchable electrode 520 is electrically connected to the switchable drain electrode 517. The switchable electrode 520 is disposed on a third insulation layer 270. The switchable electrode 520 is electrically connected to the switchable drain electrode 517 through the third insulation layer 270. In addition, the switchable electrode 520 may be electrically connected to the switchable switching element 510. The switchable electrode 520 may be formed of a metal, an alloy, metal nitride, conductive metal oxide, transparent conductive materials, etc.

The insulation layer 530 is disposed on the switchable electrode 520. The insulation layer 530 may be hydrophobic. Thus, when no voltage is applied to the switchable electrode 520, or when a predetermined voltage is not applied to the switchable electrode 520, the oil solution 540 may substantially completely cover the upper surface of the insulation layer 530. The aqueous solution 550 is separated from the insulation layer 530 by the oil solution 540.

However, when a voltage is applied to the switchable electrode 520, an electric potential is formed on the insulation layer 530, thereby changing the insulation layer 530 from hydrophobic to hydrophilic. Thus, the affinity between the insulation layer 530 and the oil solution 540 decreases, and instead the affinity between the insulation layer 530 and the aqueous solution 550 increases, thereby making the oil solution 540 unstable. For this reason, the oil solution 540 concentrates to departing from the unstable state, and the contact area between the insulation layer 530 and the oil solution 540 reduces to a minimal amount.

The oil solution 540 may include a material having predetermined reflectance (and/or predetermined reflectivity). For example, the oil solution 540 may include metal, such as one or more of gold (Au), silver (Ag), aluminum (Al), magnesium (Mg), platinum (Pt), Nickel (Ni), titanium (Ti), etc.

In addition, the oil solution 540 may include a material having pigment of a predetermined color. Thus, a light reflected by the oil solution 540 may display the predetermined color.

When a voltage is applied to the switchable electrode 520, the aqueous solution 550 is contacted with surface of the insulation layer 530. In addition, when a voltage is not applied to the switchable electrode 520, the aqueous solution 550 is separated from the insulation layer 530.

The spacer 560 is disposed on boundary portion of the light-emitting region I and the reflection region II. A side surface of the spacer 560 and the insulation layer 530 may define a space. The oil solution 540 and the aqueous solution 550 may be filled to the space defined by the side surface of the spacer 560 and the insulation layer 530.

The spacer 560 is disposed on boundary portion of the light-emitting region I and the reflection region II. The spacer 560 may prevent from overflowing of the oil solution 540 and the aqueous solution 550 to the light-emitting region I.

The second substrate 400 is formed on the first substrate 110 on which the spacer 560 is formed. The second substrate 400 may cover and encapsulate the space defined by the A side surface of the spacer 560 and the insulation layer 530.

The second substrate 400 and the first substrate 110 may include substantially the same materials. For example, the second substrate 400 may be formed of quartz, synthetic quartz, calcium fluoride, fluoride-doping quartz, soda-lime glass, non-alkali glass etc. In some example embodiments, the second substrate 400 may be formed of a transparent inorganic material or flexible plastic. For example, the second substrate 400 may include a flexible transparent resin substrate. In this case, to increase flexibility of the organic light emitting display device 100, the second substrate 400 may include a stacked structure where at least one organic layer and at least one inorganic layer are alternately stacked.

Referring to FIG. 2, when a voltage is not applied to the switchable electrode 520, an organic light emitting display device is operated in a mirror mode.

The insulation layer 530 is disposed on the switchable electrode 520. The insulation layer 530 may be hydrophobic. Thus, when a voltage is not applied to the switchable electrode 520, the oil solution 540 is contacted with upper surface of the insulation layer 530. The aqueous solution 550 is separated from the insulation layer 530 by the oil solution 540.

The oil solution 540 may include a material having predetermined reflectance (and/or predetermined reflectivity). For example, the oil solution 540 may include at least one of gold (Au), silver (Ag), aluminum (Al), magnesium (Mg), platinum (Pt), Nickel (Ni), titanium (Ti), etc. Thus, the organic light emitting display device may be operated in a mirror mode.

Referring to FIG. 3, when a voltage is applied to the switchable electrode 520, an organic light emitting display device is operated as a non-mirror mode.

When a voltage is applied to the switchable electrode 520, an electric potential is formed on the insulation layer 530, thereby changing the insulation layer 530 from hydrophobic to hydrophilic. Thus, the affinity between the insulation layer 530 and the oil solution 540 decreases, and instead the affinity between the insulation layer 530 and the aqueous solution 550 increases, thereby making the oil solution 540 unstable. For this reason, the oil solution 540 concentrates to departing from the unstable state, and the contact area between the insulation layer 530 and the oil solution 540 reduces to a minimal amount.

Thus, the oil solution 540 (including reflection material) is condensed, and thus the organic light emitting display device may be operated as a non-mirror mode.

FIGS. 4 to 11 are cross-sectional views illustrating a method of manufacturing the organic light emitting display device of FIG. 2.

Figure 4:
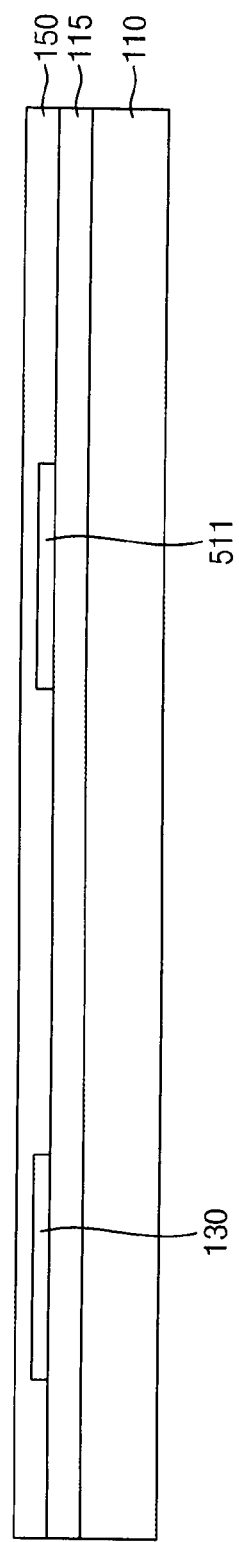
FIG. 4, FIG. 5, FIG. 6, FIG. 7, FIG. 8, FIG. 9, FIG. 10, and FIG. 11 are cross-sectional views illustrating a method of manufacturing the display device of FIG. 2.

Referring to FIG. 4, the buffer layer 115 is formed on the first substrate 110. Thereafter, the active member 130, the switchable active member 511 and the first insulation layer 150 are formed on the buffer layer 115.

The first substrate 110 may include quartz, synthetic quartz, calcium fluoride, fluoride-doping quartz, a soda-lime glass, a non-alkali glass etc.

The light emitting structure may be disposed on the first substrate 110. The first substrate 110 may be formed of transparent materials. For example, the first substrate 110 may include quartz, synthetic quartz, calcium fluoride, fluoride-doping quartz, a soda-lime glass, a non-alkali glass etc. Alternatively, the first substrate 110 may be formed of a flexible transparent resin substrate. Here, the flexible transparent resin substrate for the first substrate 110 may include a polyimide substrate. For example, the polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structure.

That is, in example embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the switching element 250, a capacitor, the first electrode 290, the light emitting layer 330, the second electrode 340, etc.) may be disposed on the insulation layer.

After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may serve as the first substrate 110 after the removal of the glass substrate. As the organic light emitting display device 100 includes the light-emitting region I and the reflection region II, the first substrate 110 may also include the light-emitting region I and the reflection region II.

A buffer layer 115 may be disposed on the first substrate 110. The buffer layer 115 may extend from the light-emitting region I into the reflection region II. The buffer layer 115 may prevent the diffusion (e.g., an out gassing) of metal atoms and/or impurities from the first substrate 110. Additionally, the buffer layer 115 may control a rate of a heat transfer in a crystallization process for forming the active member 130, thereby obtaining substantially uniform the active member 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be disposed.

The active member 130 and the switchable active member 511 may be formed an oxide semiconductor, an inorganic semiconductor (e.g., amorphous silicon, polysilicon, etc.), an organic semiconductor, etc.

The first insulation layer 150 may be disposed on the active member 130 and the switchable active member 511. The first insulation layer 150 may cover the active member 130 in the light-emitting region I, and may extend in the first direction on the first substrate 110. That is, the first insulation layer 150 may be disposed on the entire first substrate 110. The first insulation layer 150 may be formed a silicon compound, a metal oxide, etc.

Figure 5:
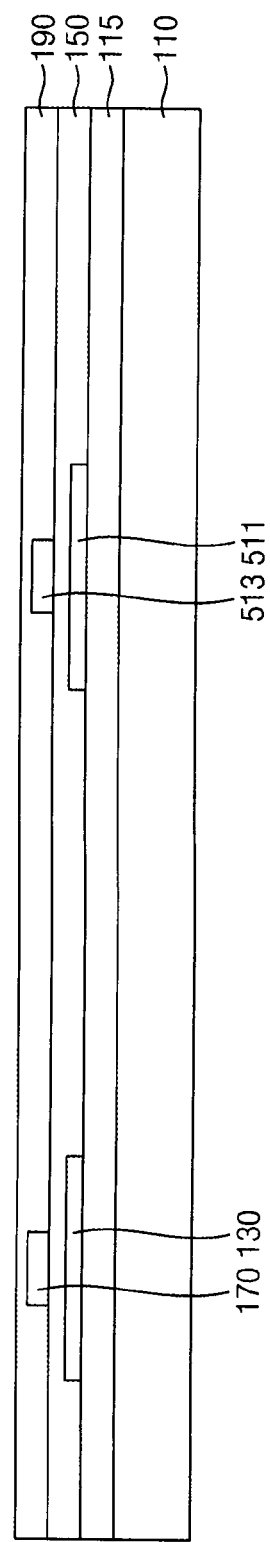

Referring to FIG. 5, the gate electrode 170, a switchable gate electrode 513 and the second insulation layer 190 are formed on the first substrate 110 on which the first insulation layer 150 is formed.

The gate electrode 170 and the switchable gate electrode 513 may be disposed on a portion of the first insulation layer 150 under which the active member 130 is disposed. The gate electrode 170 and the switchable gate electrode 513 may be formed of a metal, an alloy, metal nitride, conductive metal oxide, transparent conductive materials, etc.

The second insulation layer 190 may be disposed on the gate electrode 170 and the switchable gate electrode 513. The second insulation layer 190 may cover the gate electrode 170 and the switchable gate electrode 513 in the light-emitting region I, and may extend in the first direction on the first substrate 110. That is, the second insulation layer 190 may be disposed on the entire first substrate 110. The second insulation layer 190 may be formed of a silicon compound, a metal oxide, etc.

Figure 6:
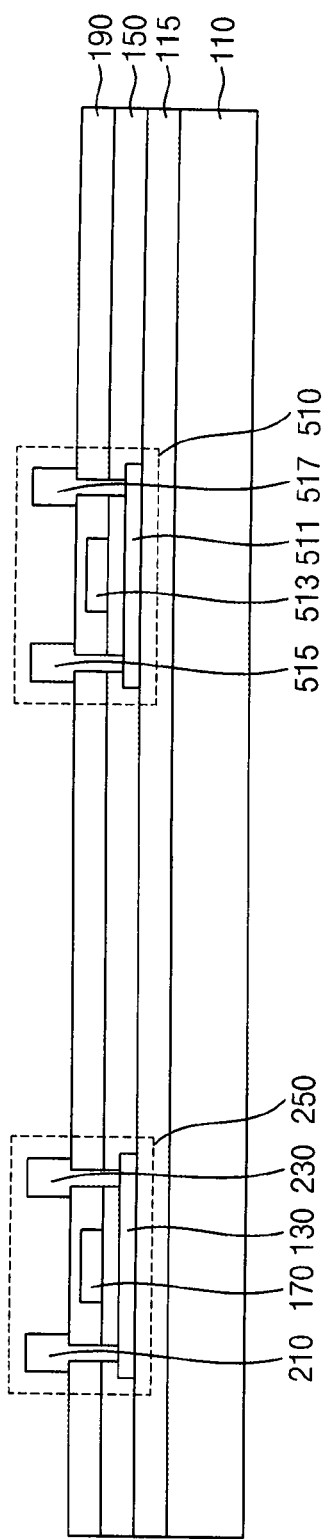

Referring to FIG. 6, the source electrode 210 and the drain electrode 230, a switchable source electrode 515 are formed on the first substrate 110 on which the second insulation layer 190 is formed.

The source electrode 210 and the drain electrode 230 may be disposed on the second insulation layer 190. The source electrode 210 may be in contact with a first side of the active layer 130 by removing a portion of the first and second insulation layers 150 and 190. The drain electrode 230 may be in contact with a second side of the active layer 130 by removing a second portion of the first and second insulation layers 150 and 190. Each of the source electrode 210 and the drain electrode 230 may be formed of a metal, an alloy, metal nitride, conductive metal oxide, transparent conductive materials, etc.

The switchable source electrode 515 and the switchable drain electrode 517 may be disposed on the second insulation layer 190. The switchable source electrode 515 may be in contact with a first side of the switchable active member 511 by removing a portion of the first and second insulation layers 150 and 190. The switchable drain electrode 517 may be in contact with a second side of the switchable active member 511 by removing a second portion of the first and second insulation layers 150 and 190. Each of the switchable source electrode 515 and the switchable drain electrode 517 may be formed of a metal, an alloy, metal nitride, conductive metal oxide, transparent conductive materials, etc.

In an embodiment, the gate electrode 170 is disposed on the active member 130. However, the gate electrode 170 may be disposed under the active member 130.

Figure 7:
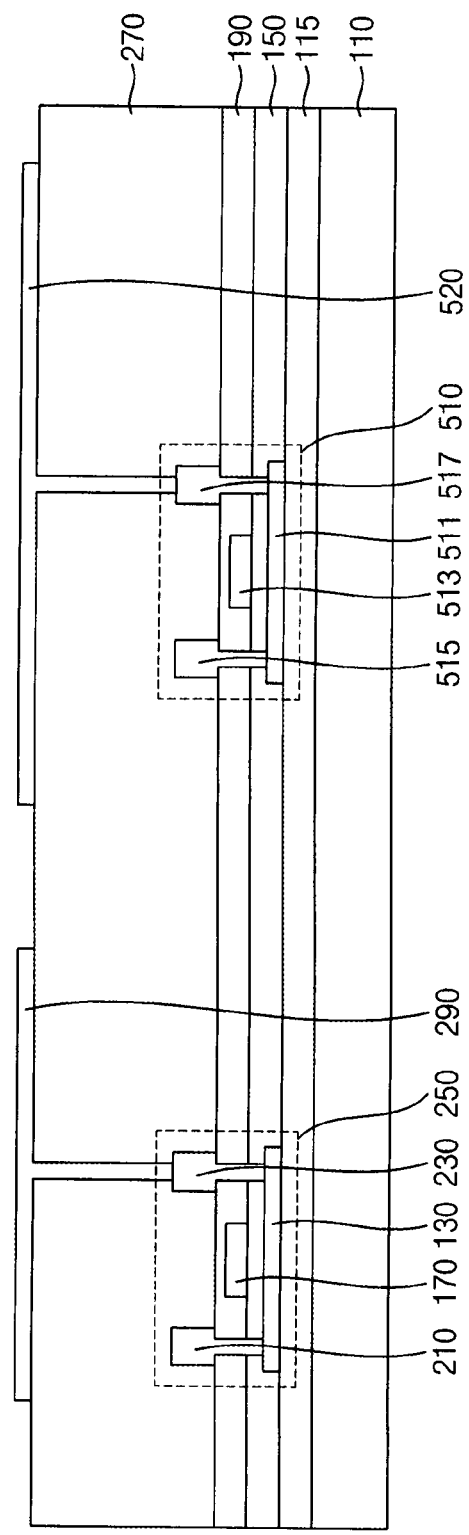

Referring to FIG. 7, the third insulation layer 270, the first electrode 290 and the switchable electrode 520 are formed on the first substrate 110 on which the source electrode 210, the drain electrode 230, the switchable source electrode 515 and the switchable drain electrode 517 are formed.

The third insulation layer 270 may be disposed on the source electrode 210, the drain electrode 230, the switchable source electrode 515 and the switchable drain electrode 517. The third insulation layer 270 may cover the source electrode 210, the drain electrode 230, the switchable source electrode 515 and the switchable drain electrode 517, and may extend in the first direction on the first substrate 110. That is, the third insulation layer 270 may be disposed on the entire first substrate 110. The third insulation layer 270 may be formed of a silicon compound, a metal oxide, etc.

The first electrode 290 may be disposed on the third insulation layer 270. The first electrode 290 may be in contact with the source electrode 210 by removing a portion of the third insulation layer 270. In addition, the first electrode 290 may be electrically connected to the switching element 250. The first electrode 290 may be formed of a metal, an alloy, metal nitride, conductive metal oxide, transparent conductive materials, etc.

The switchable electrode 520 may be disposed on the third insulation layer 270. The switchable electrode 520 may be in contact with the switchable drain electrode 517 by removing a portion of the third insulation layer 270. In addition, the switchable electrode 520 may be electrically connected to the switchable switching element 510. The switchable electrode 520 may be formed of a metal, an alloy, metal nitride, conductive metal oxide, transparent conductive materials, etc.

Figure 8:
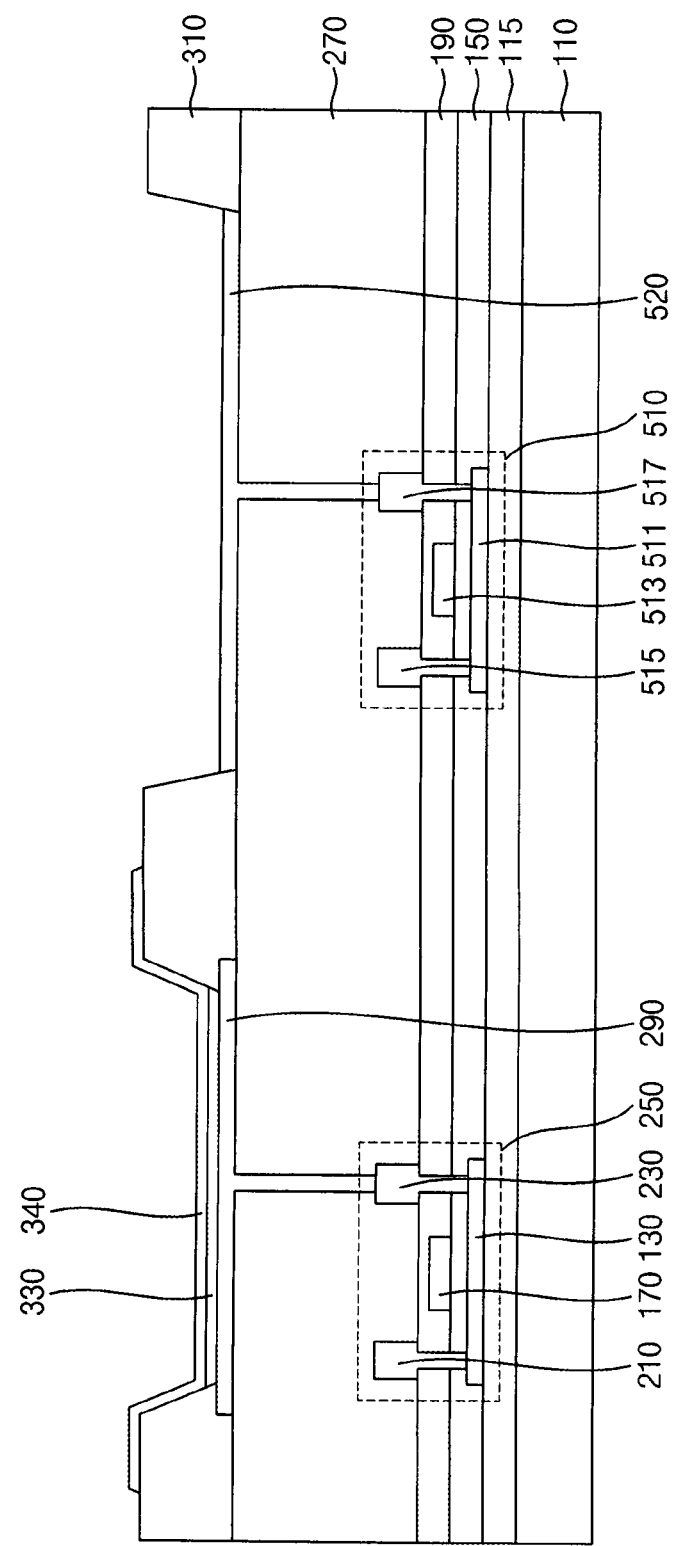

Referring to FIG. 8, the pixel defining layer 310, the light emitting layer 330 and the second electrode 340 are formed on the first substrate 110 on which the first electrode 290 and the switchable electrode 520 are formed.

The pixel defining layer 310 may be disposed the on third insulation layer 270 to expose a portion of the first electrode 290. The pixel defining layer 310 may be formed of organic materials or inorganic materials. In this case, the light emitting layer 330 may be disposed on a portion that the first electrode 290 is exposed by the pixel defining layer 310.

The light emitting layer 330 may be disposed on the exposed first electrode 290. The light emitting layer 330 may be formed using light emitting materials capable of generating different colors of light (e.g., a red color of light, a blue color of light, and a green color of light). However, the light emitting layer 330 may stack light emitting materials capable of generating different colors of light to emit white color of light.

The second electrode 340 may be disposed on the pixel defining layer 310 and the light emitting layer 330. The second electrode 340 may cover the pixel defining layer 310 and the light emitting layer 330 in the light-emitting region I and the reflection region II, and may extend in the first direction on the first substrate 110. That is, the second electrode 340 may be electrically connected to the first through third pixels. The second electrode 340 may be formed of a metal, an alloy, metal nitride, conductive metal oxide, a transparent conductive material, etc. These may be used alone or in a combination thereof. The first substrate 110 may be combined with the second substrate 350 by using a sealing member. In addition, a filler may be disposed between the first substrate 110 and the second substrate 350.

Figure 9:
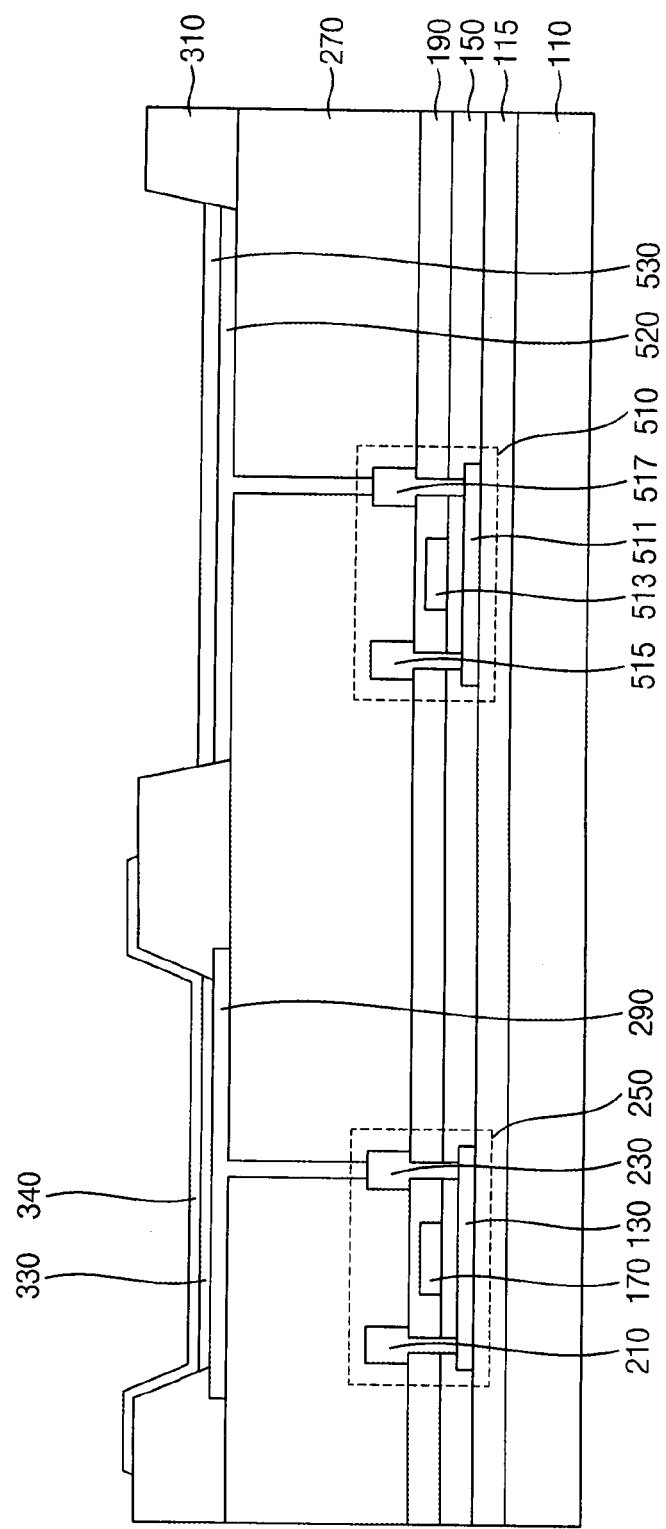

Referring to FIG. 9, an insulation layer 530 is formed on the first substrate 110 on which the switchable electrode 520 is formed.

The insulation layer 530 is disposed on the switchable electrode 520. The insulation layer 530 may be hydrophobic. Thus, when a voltage is not applied to the switchable electrode 520, the oil solution 540 is contacted with upper surface of the insulation layer 530. The aqueous solution 550 is separated from the insulation layer 530 by the oil solution 540.

Figure 10:
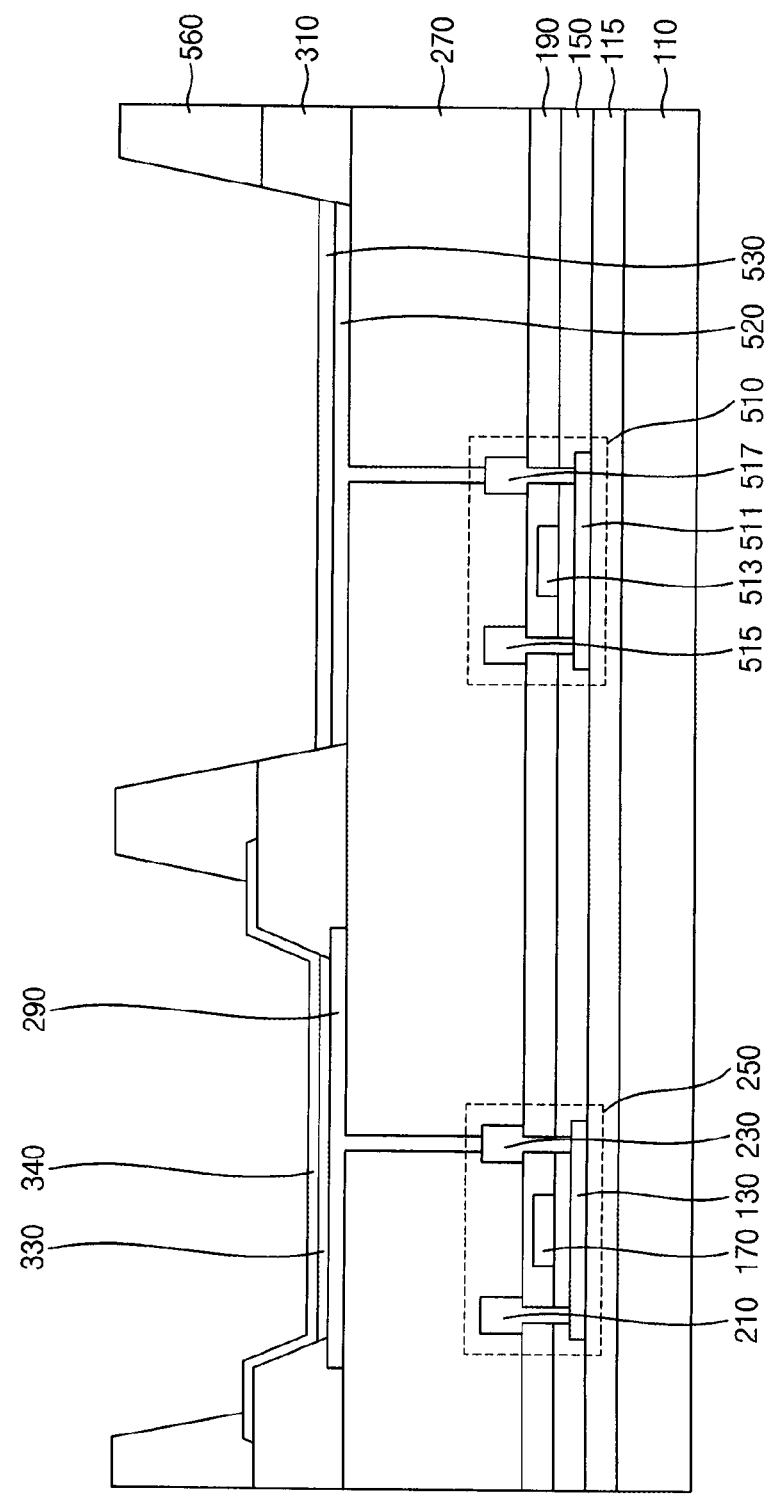

Referring to FIG. 10, a spacer 560 is formed on the first substrate 110 on which the insulation layer 530 is formed.

The spacer 560 is disposed on boundary portion of the light-emitting region I and the reflection region II. A side surface of the spacer 560 and the insulation layer 530 may define a space. The oil solution 540 and the aqueous solution 550 may be filled to the space defined by the side surface of the spacer 560 and the insulation layer 530.

The spacer 560 is disposed on boundary portion of the light-emitting region I and the reflection region II. The spacer 560 may prevent from overflowing of the oil solution 540 and the aqueous solution 550 to the light-emitting region I.

Figure 11:
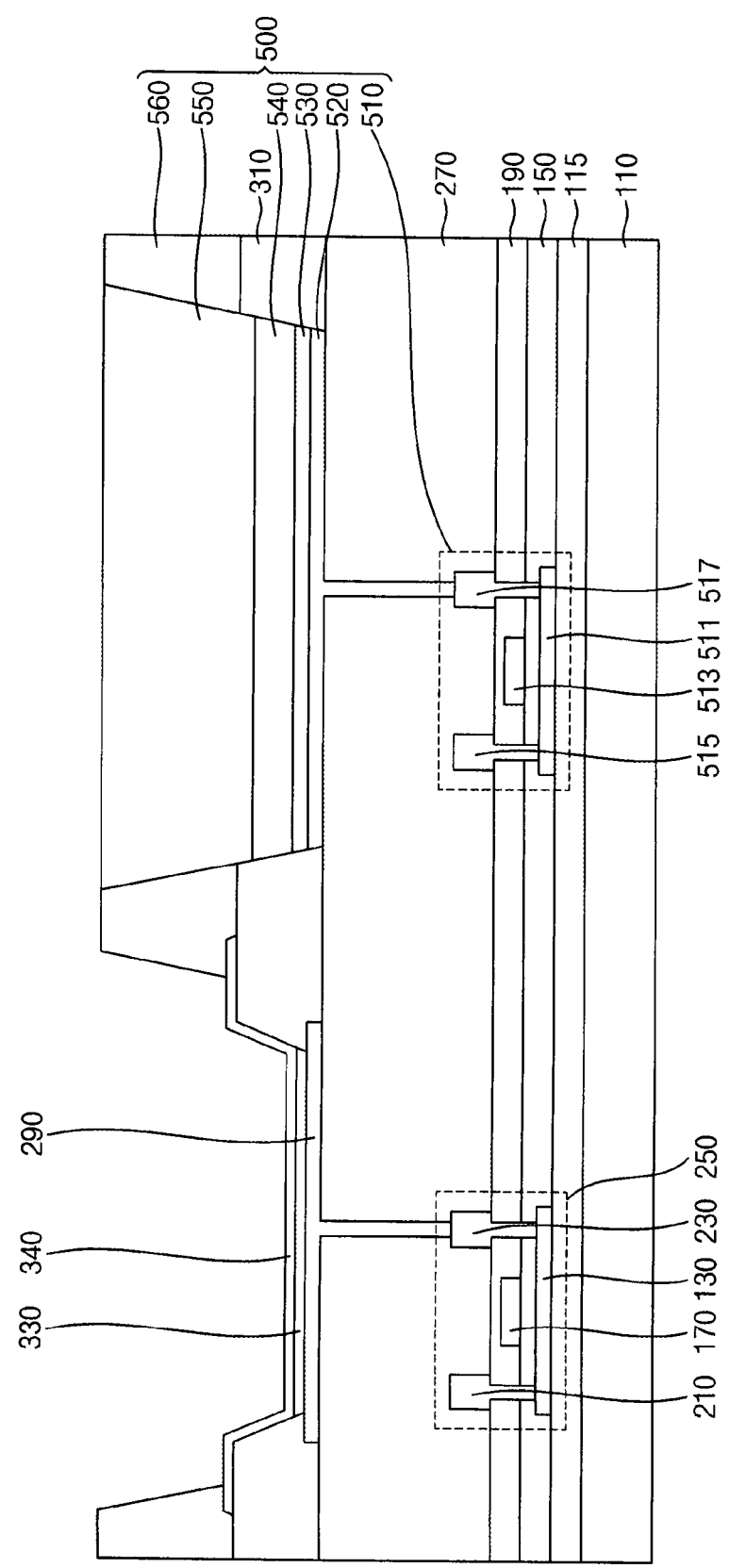

Referring to FIG. 11, the oil solution 540 and the aqueous solution 550 is filled on the first substrate 110 on which the spacer 560 is formed.

The spacer 560 is disposed on boundary portion of the light-emitting region I and the reflection region II. A side surface of the spacer 560 and the insulation layer 530 may define a space. The oil solution 540 and the aqueous solution 550 may be filled to the space defined by the side surface of the spacer 560 and the insulation layer 530.

Referring to FIG. 2, the second substrate 400 is formed on the first substrate 110 on which the oil solution 540 and the aqueous solution 550 is filled.

The second substrate 400 is formed on the first substrate 110 on which the spacer 560 is formed. The second substrate 400 may cover and encapsulate the space defined by the side surface of the spacer 560 and the insulation layer 530.

The second substrate 400 and the first substrate 110 may include substantially the same materials. For example, the second substrate 400 may be formed of quartz, synthetic quartz, calcium fluoride, fluoride-doping quartz, soda-lime glass, non-alkali glass etc. In some example embodiments, the second substrate 400 may be formed of a transparent inorganic material or flexible plastic. For example, the second substrate 400 may include a flexible transparent resin substrate. In this case, to increase flexibility of the organic light emitting display device 100, the second substrate 400 may include a stacked structure where at least one organic layer and at least one inorganic layer are alternately stacked.

Figure 12:
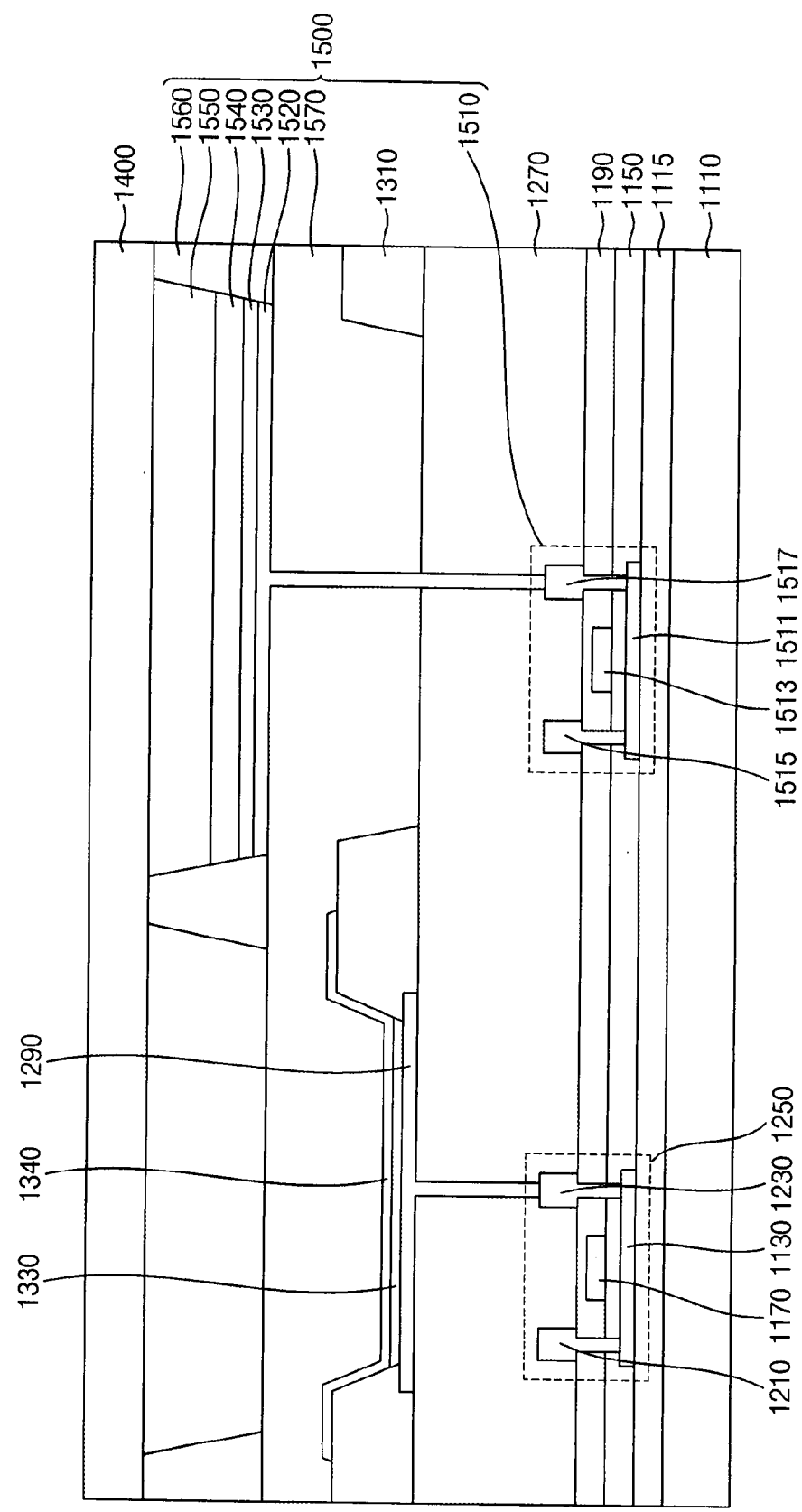
FIG. 12 is a cross-sectional view illustrating a display device, e.g., an organic light emitting display device, according to an embodiment.
Figure 13:
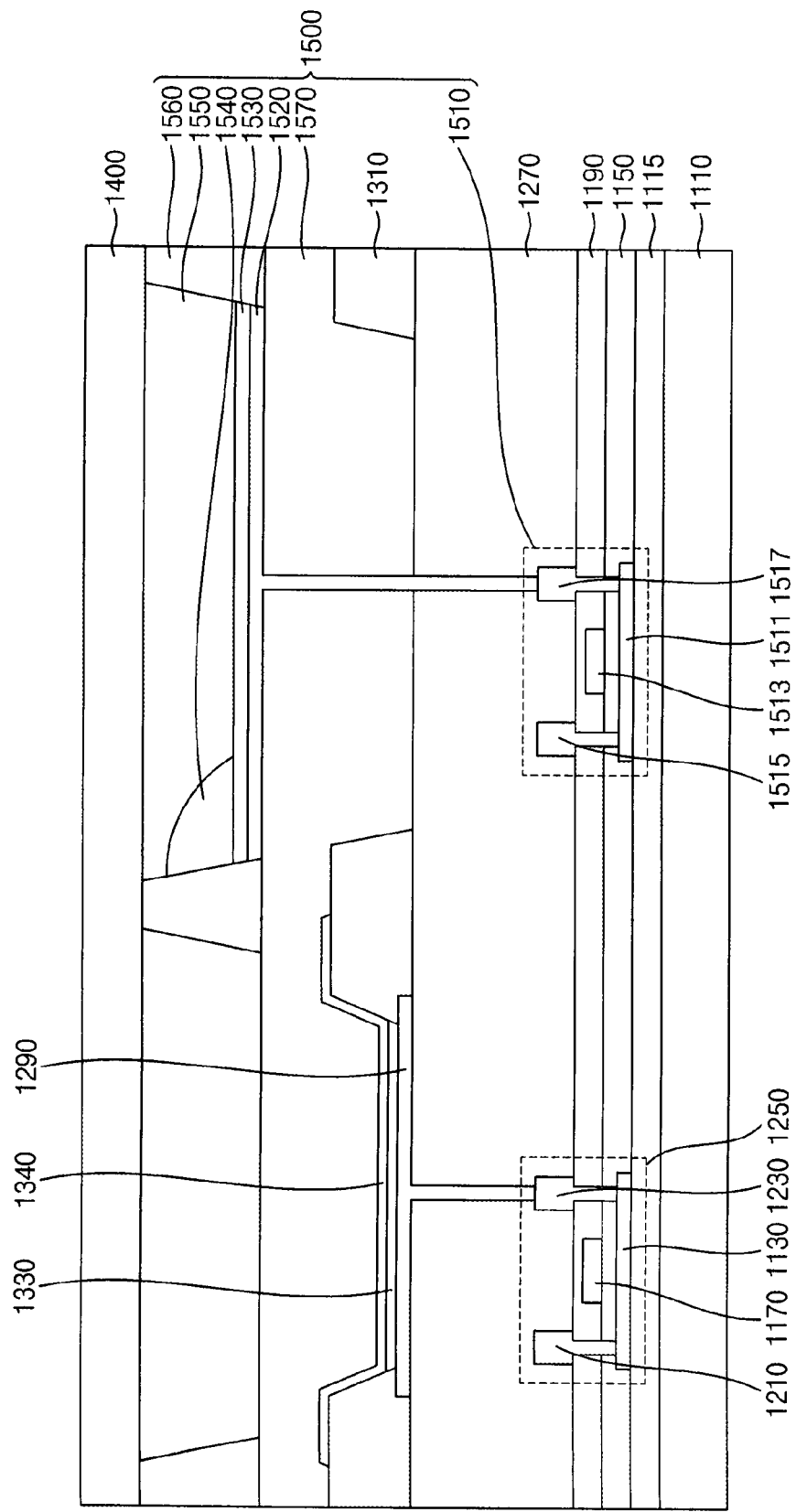
FIG. 13 is a cross-sectional view illustrating a display device, e.g., an organic light emitting display device, according to an embodiment.

FIG. 12 is a cross-sectional view illustrating an organic light emitting display device according to an embodiment. FIG. 13 is a cross-sectional view illustrating an organic light emitting display device according to an embodiment.

The organic light emitting display device according to an embodiment is substantially same as the organic light emitting display device of FIGS. 1 to 3 except for a switchable element 1500, and thus same reference numerals are used for same elements and repetitive explanation will be omitted.

Referring to FIGS. 12 and 13, an organic light emitting display device according to an embodiment includes a first substrate 1110, a buffer layer 1115, a first insulation interlayer 1150, a second insulation layer 1190, a third insulation layer 1270, a light emitting structure, a pixel defining layer 1310, a switchable element 1500, and a second substrate 1400. Here, the light emitting structure includes a switching element 1250, a first electrode 1290, an emission layer 1330, and a second electrode 1340. The switching element 1250 includes an active member 1130, a gate electrode 1170, a source electrode 1210 and a drain electrode 1230.

The middle insulation layer 1570 is disposed on the second electrode 1340. The middle insulation layer 1570 may include an organic material. However, an inventive concept is not limited thereto. Alternatively, the middle insulation layer 1570 may be a thin film encapsulation layer. For example, the middle insulation layer 1570 may be formed by stacking (e.g., sequentially stacking) a first inorganic layer, an organic layer, and a second inorganic layer.

For example, the organic layer may be formed of a polymer, and may also be a single layer or multiple layers (e.g., stacked layers) that is formed of, for example, one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce moisture from permeating into the light-emitting structure.

However, the middle insulation layer 1570 may be formed by stacking (e.g., sequentially stacking) a first inorganic layer, a first organic layer, a second inorganic layer, a second organic layer and a third inorganic layer.

The switchable electrode 1520 is electrically connected to the switchable drain electrode 1517. The switchable electrode 1520 is disposed on the middle insulation layer 1570. The switchable electrode 1520 is electrically connected to the switchable drain electrode 1517 through the middle insulation layer 1570. In addition, the switchable electrode 1520 may be electrically connected to the switchable switching element 1510. The switchable electrode 1520 may be formed of a metal, an alloy, metal nitride, conductive metal oxide, transparent conductive materials, etc.

The insulation layer 1530 is disposed on the switchable electrode 1520. The insulation layer 1530 may be hydrophobic. Thus, when a voltage is not applied to the switchable electrode 1520, the oil solution 1540 is contacted with upper surface of the insulation layer 1530. The aqueous solution 1550 is separated from the insulation layer 1530 by the oil solution 1540.

However, when a voltage is applied to the switchable electrode 1520, an electric potential is formed on the insulation layer 1530, thereby changing the insulation layer 1530 from hydrophobic to hydrophilic. Thus, the affinity between the insulation layer 1530 and the oil solution 1540 decreases, and instead the affinity between the insulation layer 1530 and the aqueous solution 1550 increases, thereby making the oil solution 1540 unstable. For this reason, the oil solution 1540 concentrates to departing from the unstable state, and the contact area between the insulation layer 1530 and the oil solution 1540 reduces to a minimal amount.

The oil solution 1540 may include a material having predetermined reflectance (and/or predetermined reflectivity). For example, the oil solution 1540 may include one or more of gold (Au), silver (Ag), aluminum (Al), magnesium (Mg), platinum (Pt), Nickel (Ni), titanium (Ti), etc.

In addition, the oil solution 1540 may include a material having pigment. Thus, when the oil solution 1540 includes a material having pigment, mirror organic light emitting display device displaying various color may be manufactured.

When a voltage is applied to the switchable electrode 1520, the aqueous solution 1550 is contacted with surface of the insulation layer 1530. In addition, when a voltage is not applied to the switchable electrode 1520, the aqueous solution 1550 is from the insulation layer 1530.

The spacer 1560 is disposed on boundary portion of the light-emitting region I and the reflection region II. A side surface of the spacer 1560 and the insulation layer 1530 may define a space. The oil solution 1540 and the aqueous solution 1550 may be filled to the space defined by the side surface of the spacer 1560 and the insulation layer 1530.

The spacer 1560 is disposed on boundary portion of the light-emitting region I and the reflection region II. The spacer 1560 may prevent from overflowing of the oil solution 1540 and the aqueous solution 1550 to the light-emitting region I.

The second substrate 1400 is formed on the first substrate 1110 on which the spacer 1560 is formed. The second substrate 1400 may cover and encapsulate the space defined by the side surface of the spacer 1560 and the insulation layer 1530.

The second substrate 1400 and the first substrate 1110 may include substantially the same materials. For example, the second substrate 1400 may be formed of quartz, synthetic quartz, calcium fluoride, fluoride-doping quartz, soda-lime glass, non-alkali glass etc. In some example embodiments, the second substrate 1400 may be formed of a transparent inorganic material or flexible plastic. For example, the second substrate 1400 may include a flexible transparent resin substrate. In this case, to increase flexibility of the organic light emitting display device 1100, the second substrate 1400 may include a stacked structure where at least one organic layer and at least one inorganic layer are alternately stacked.

Referring to FIG. 12, when a voltage is not applied to the switchable electrode 1520, an organic light emitting display device is operated as a mirror mode.

The insulation layer 1530 is disposed on the switchable electrode 1520. The insulation layer 1530 may be hydrophobic. Thus, when a voltage is not applied to the switchable electrode 1520, the oil solution 1540 is contacted with upper surface of the insulation layer 1530. The aqueous solution 1550 is separated from the insulation layer 1530 by the oil solution 1540.

The oil solution 1540 may include a material having predetermined reflectance (and/or predetermined reflectivity). For example, the oil solution 1540 may include one or more of gold (Au), silver (Ag), aluminum (Al), magnesium (Mg), platinum (Pt), Nickel (Ni), titanium (Ti), etc. Thus, the organic light emitting display device may be operated as a mirror.

Referring to FIG. 13, when a voltage is applied to the switchable electrode 1520, an organic light emitting display device is operated in a non-mirror mode.

When a voltage is applied to the switchable electrode 1520, an electric potential is formed on the insulation layer 1530, thereby changing the insulation layer 1530 from hydrophobic to hydrophilic. Thus, the affinity between the insulation layer 1530 and the oil solution 1540 decreases, and instead the affinity between the insulation layer 1530 and the aqueous solution 1550 increases, thereby making the oil solution 1540 unstable. For this reason, the oil solution 1540 concentrates to departing from the unstable state, and the contact area between the insulation layer 1530 and the oil solution 1540 reduces to a minimal amount.

Thus, the oil solution 1540 including reflection material is condensed, and thus the organic light emitting display device may be operated as a non-mirror mode.

FIGS. 14 to 19 are cross-sectional views illustrating a method of manufacturing the organic light emitting display device of FIG. 12.

The method of manufacturing the organic light emitting display device according to an embodiment is substantially same as the method of manufacturing the organic light emitting display device of FIGS. 4 to 8 except for a switchable electrode 1520, and thus same reference numerals are used for same elements and repetitive explanation will be omitted.

Figure 14:
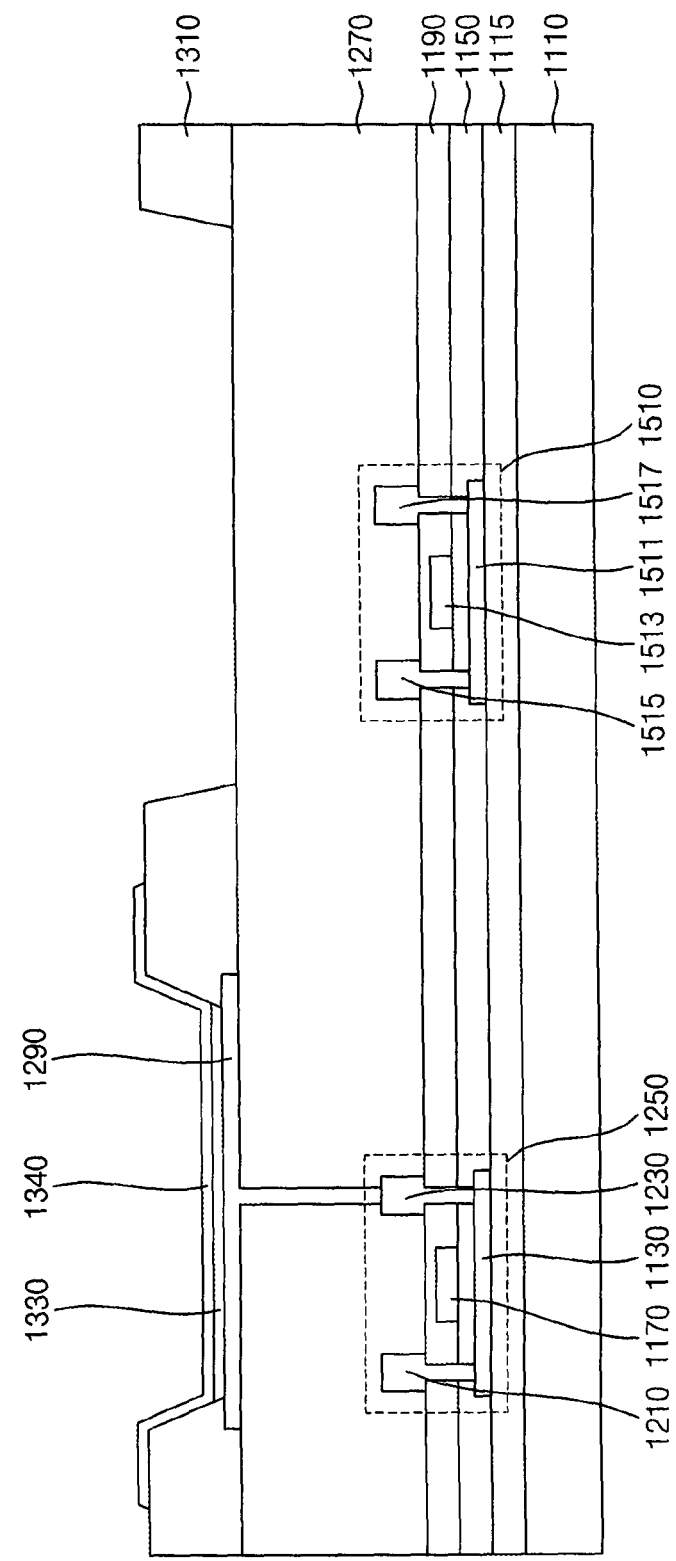
FIG. 14, FIG. 15, FIG. 16, FIG. 17, FIG. 18, and FIG. 19 are cross-sectional views illustrating a method of manufacturing the display device of FIG. 12.

Referring to FIG. 14, a switching element 1250, a first electrode 1290, a light emitting layer 1330, a second electrode 1340 and switchable switching element 1510 are formed on the first substrate 1110.

In an exemplary, a switchable electrode 1520 is not formed in the process of forming the first electrode 1290.

Figure 15:
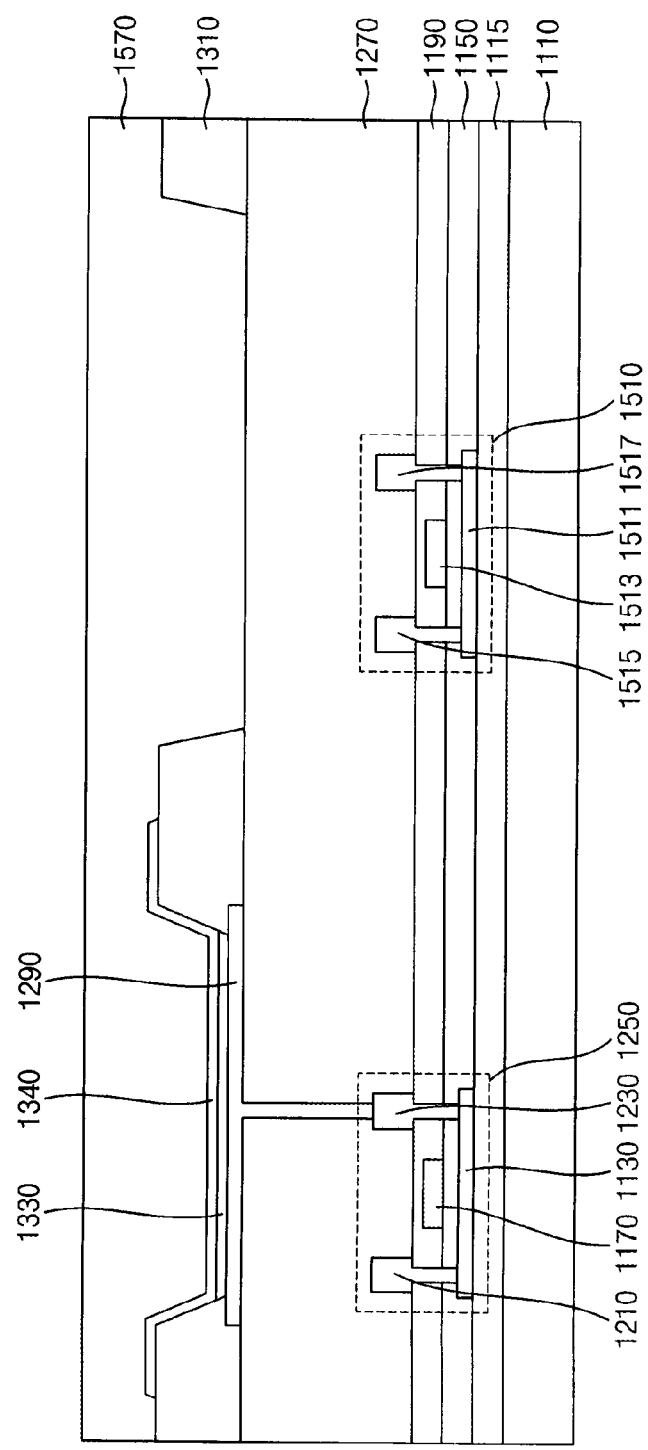

Referring to FIG. 15, the middle insulation layer 1570 is formed on the first substrate 1110 on which the second electrode 1340 is formed.

The middle insulation layer 1570 is disposed on the second electrode 1340. The middle insulation layer 1570 may include an organic material. However, an inventive concept is not limited thereto. Alternatively, the middle insulation layer 1570 may be a thin film encapsulation layer. For example, the middle insulation layer 1570 may be formed by stacking (e.g., sequentially stacking) a first inorganic layer, an organic layer, and a second inorganic layer.

For example, the organic layer may be formed of a polymer, and may also be a single layer or multiple layers (e.g., stacked layers) that is formed of, for example, one of polyethylene terephthalate, a polyimide, a polycarbonate, an epoxy, a polyethylene and a polyacrylate. The organic layer may also be formed of a polyacrylate; for example, the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer and the second inorganic layer may be single layers or stacked layers including a metal oxide or a metal nitride. For example, the first inorganic layer and the second inorganic layer may include one of silicon nitride (e.g., SiNx), aluminum oxide (e.g., Al2O3), silicon oxide (e.g., SiO2), and titanium oxide (e.g., TiO2). In this case, the second inorganic layer may be formed to or configured to prevent or reduce moisture from permeating into the light-emitting structure.

However, the middle insulation layer 1570 may be formed by stacking (e.g., sequentially stacking) a first inorganic layer, a first organic layer, a second inorganic layer, a second organic layer and a third inorganic layer.

Figure 16:
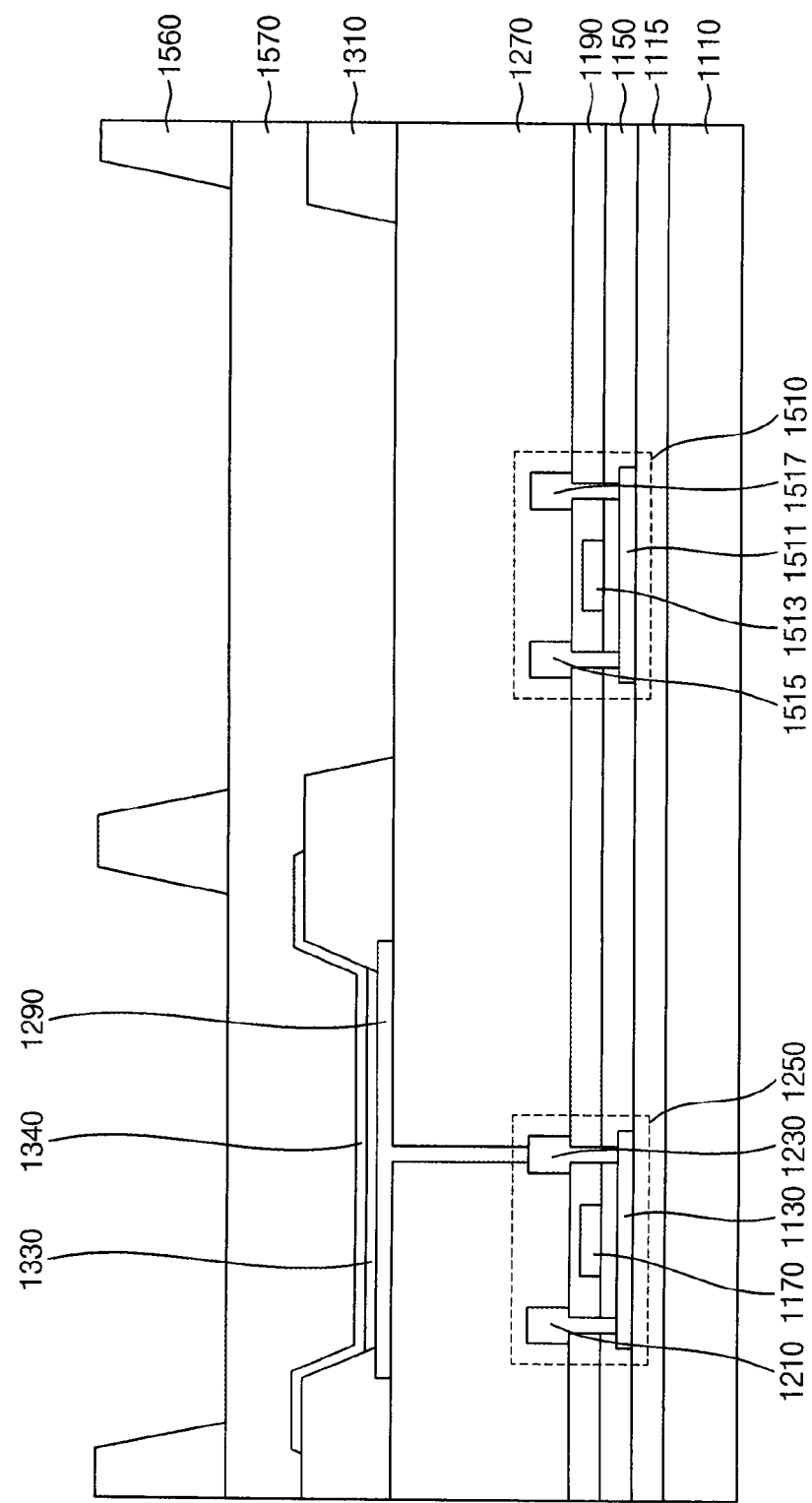

Referring to FIG. 16, a spacer 1560 is formed on the first substrate 1110 on which the middle insulation layer 1570 is formed.

The spacer 1560 is disposed on boundary portion of the light-emitting region I and the reflection region II. The spacer 1560 may prevent from overflowing of the oil solution 1540 and the aqueous solution 1550 to the light-emitting region I.

Figure 17:
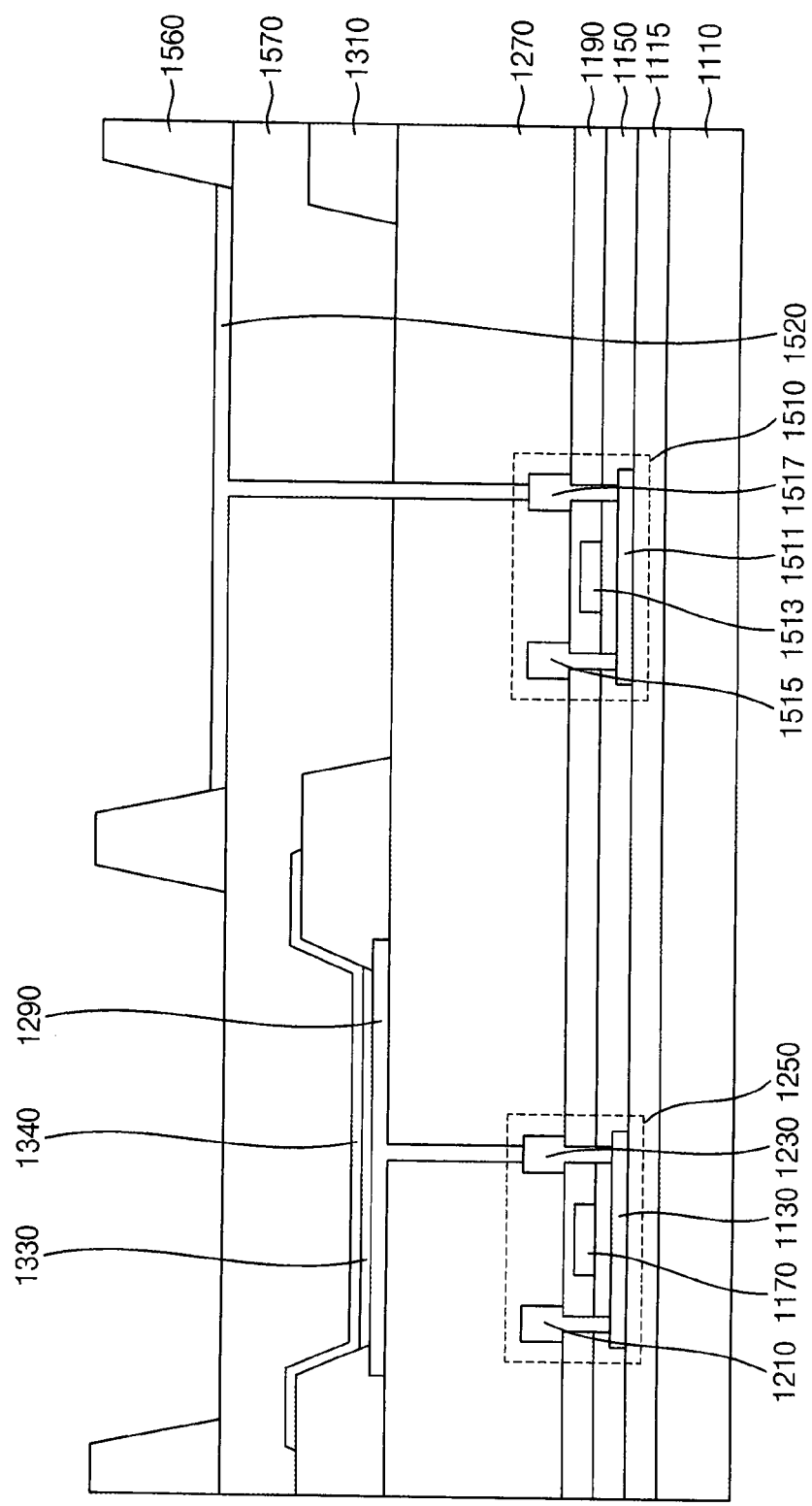

Referring to FIG. 17, the switchable electrode 1520 is formed on the first substrate 1110 on which the spacer 1560 is formed.

The switchable electrode 1520 is electrically connected to the switchable drain electrode 1517. The switchable electrode 1520 is disposed on the middle insulation layer 1570. The switchable electrode 1520 is electrically connected to the switchable drain electrode 1517 through the middle insulation layer 1570. In addition, the switchable electrode 1520 may be electrically connected to the switchable switching element 1510. The switchable electrode 1520 may be formed of a metal, an alloy, metal nitride, conductive metal oxide, transparent conductive materials, etc.

Figure 18:
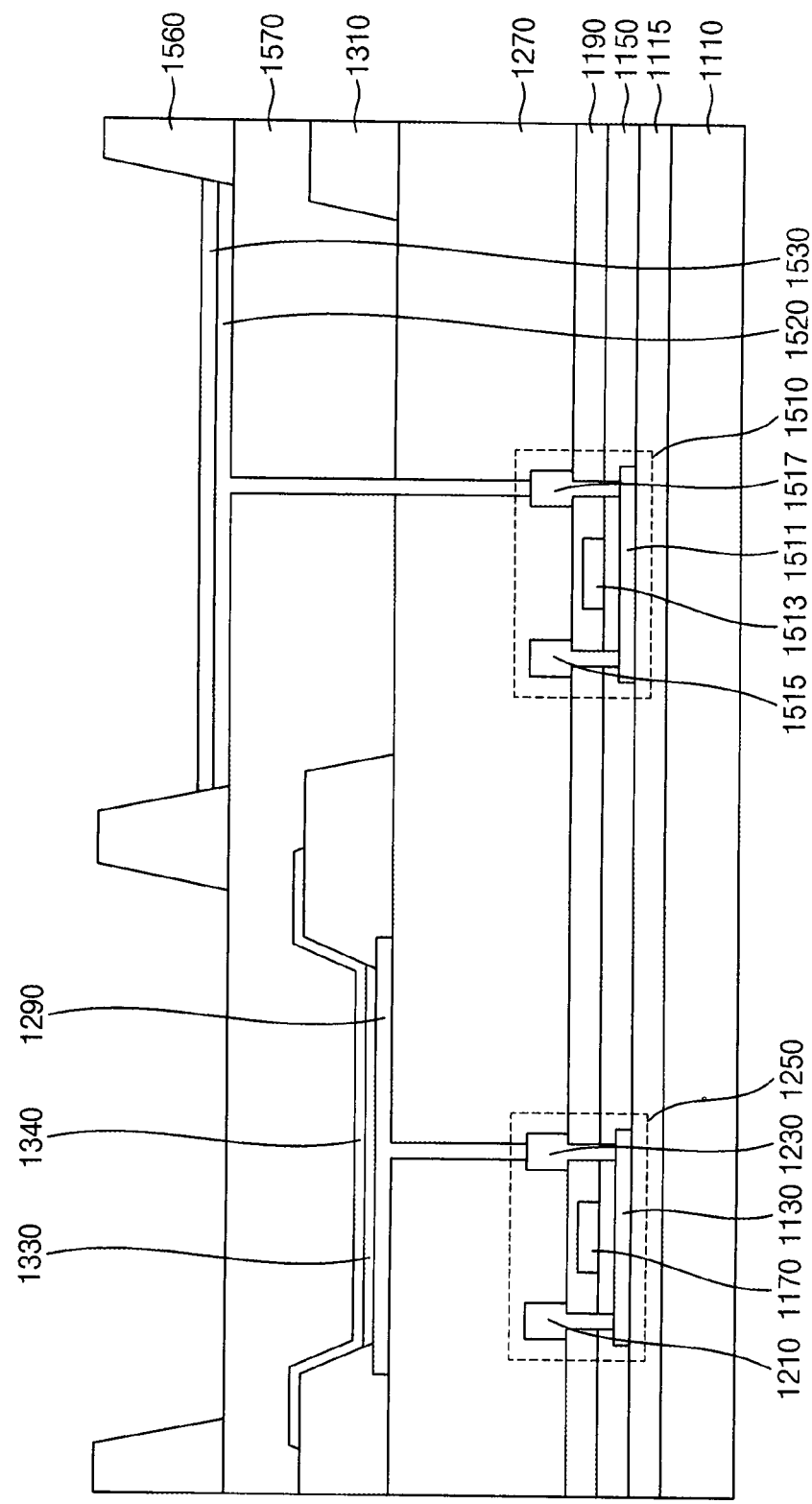

Referring to FIG. 18, an insulation layer 1530 is formed on the first substrate 1110 on which the switchable electrode 1520 is formed.

The insulation layer 1530 may be hydrophobic. Thus, when a voltage is not applied to the switchable electrode 1520, the oil solution 1540 is contacted with upper surface of the insulation layer 1530. The aqueous solution 1550 is separated from the insulation layer 1530 by the oil solution 1540.

Figure 19:
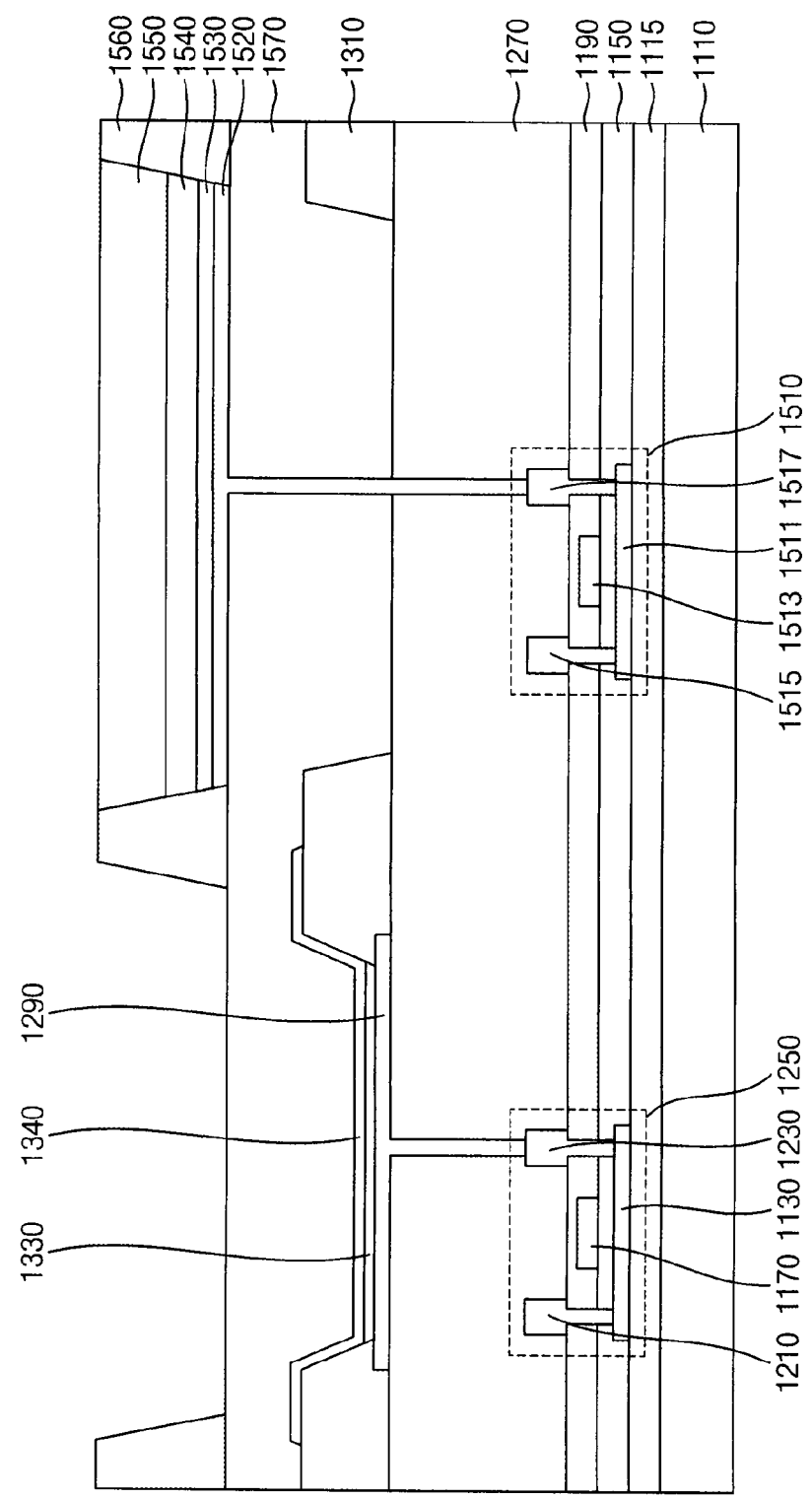

Referring to FIG. 19, an oil solution 1540 and an aqueous solution 1550 are filled on the first substrate 1110 on which the spacer 1560 is formed.

The spacer 1560 is disposed on boundary portion of the light-emitting region I and the reflection region II. A side surface of the spacer 1560 and the insulation layer 1530 may define a space. The oil solution 1540 and the aqueous solution 1550 may be filled to the space defined by the side surface of the spacer 1560 and the insulation layer 1530.

Referring to FIG. 12, the second substrate 1400 is formed on the first substrate 1110 on which the oil solution 1540 and the aqueous solution 1550 is filled.

The second substrate 1400 is formed on the first substrate 1110 on which the spacer 1560 is formed. The second substrate 1400 may cover and encapsulate the space defined by the side surface of the spacer 1560 and the insulation layer 1530.

The second substrate 1400 and the first substrate 1110 may include substantially the same materials. For example, the second substrate 1400 may be formed of quartz, synthetic quartz, calcium fluoride, fluoride-doping quartz, soda-lime glass, non-alkali glass etc. In some example embodiments, the second substrate 1400 may be formed of a transparent inorganic material or flexible plastic. For example, the second substrate 1400 may include a flexible transparent resin substrate. In this case, to increase flexibility of the organic light emitting display device 1100, the second substrate 1400 may include a stacked structure where at least one organic layer and at least one inorganic layer are alternately stacked.

Figure 20:
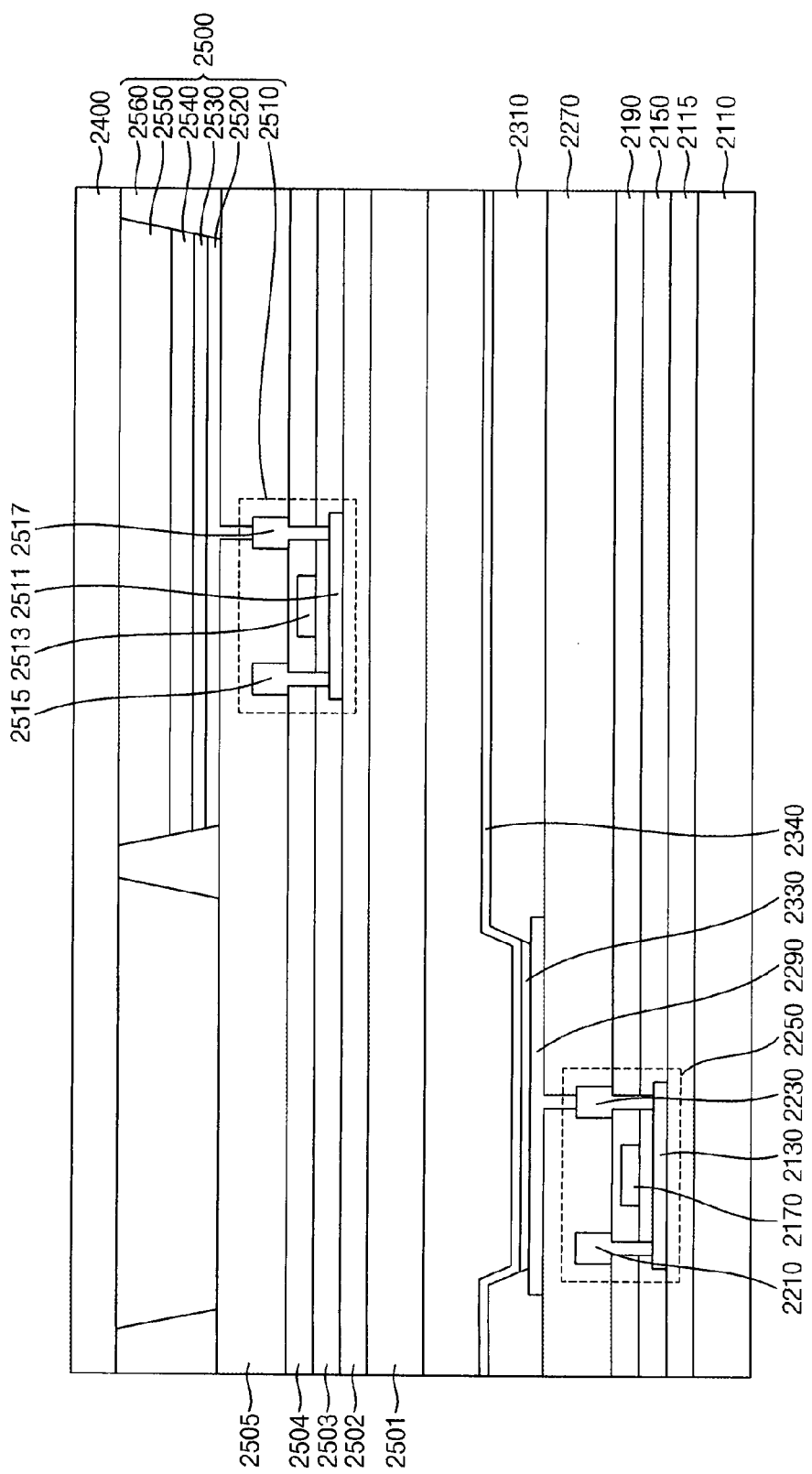
FIG. 20 is a cross-sectional view illustrating a display device, e.g., an organic light emitting display device, according to an embodiment.
Figure 21:
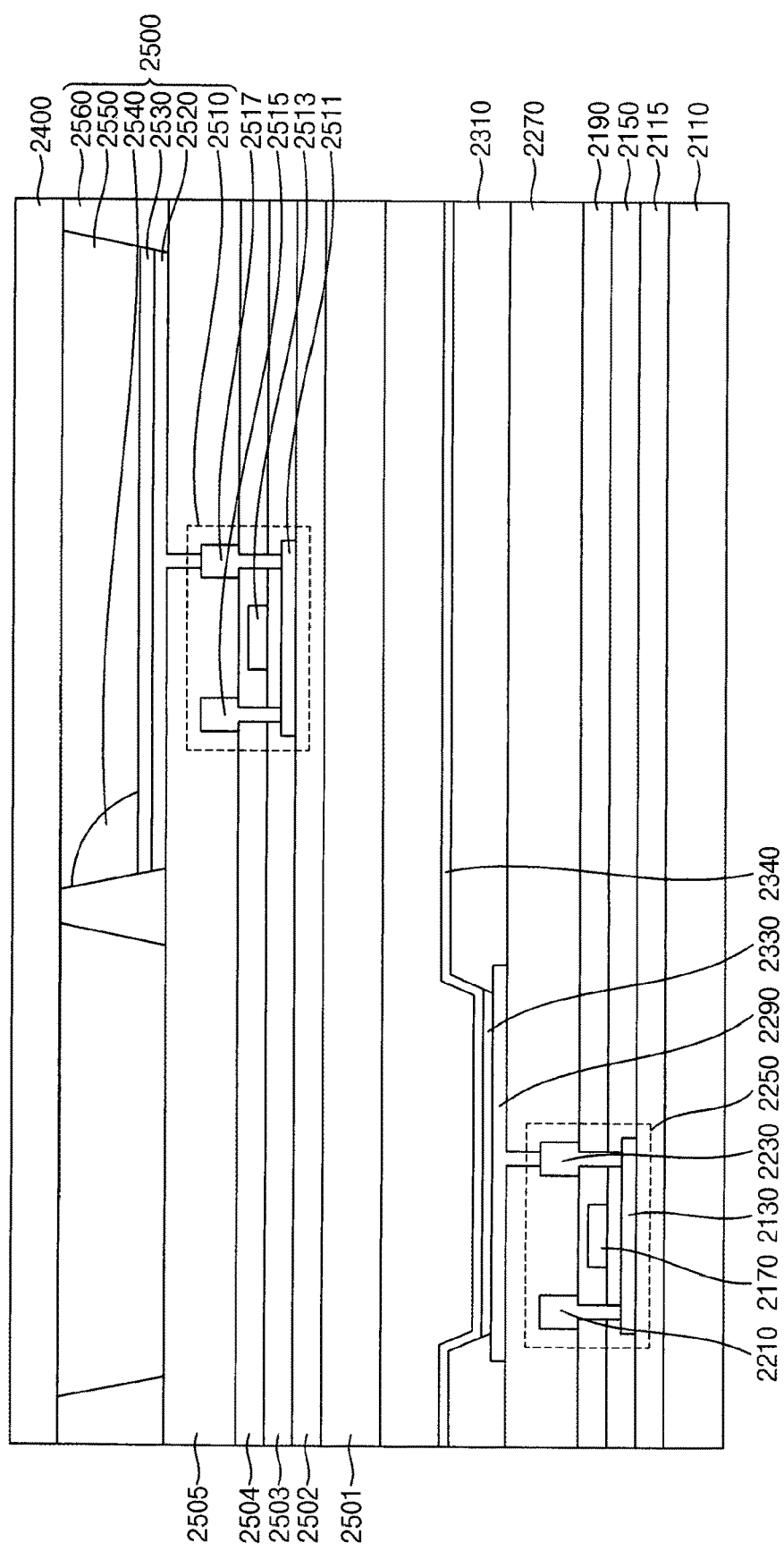
FIG. 21 is a cross-sectional view illustrating a display device, e.g., an organic light emitting display device, according to an embodiment.

FIG. 20 is a cross-sectional view illustrating an organic light emitting display device according to an embodiment. FIG. 21 is a cross-sectional view illustrating an organic light emitting display device according to an embodiment.

The organic light emitting display device according to an embodiment is substantially same as the organic light emitting display device of FIGS. 1 to 3 except for a switchable element 2500, and thus same reference numerals are used for same elements and repetitive explanation will be omitted.

Referring to FIGS. 20 and 21, an organic light emitting display device according to an embodiment a first substrate 2110, a buffer layer 2115, a first insulation interlayer 2150, a second insulation layer 2190, a third insulation layer 2270, a light emitting structure, a pixel defining layer 2310, a switchable element 2500 and a second substrate 2400. Here, the light emitting structure includes a switching element 2250, a first electrode 2290, an emission layer 2330 and a second electrode 2340. The switching element 2250 includes an active member 2130, a gate electrode 2170, a source electrode 2210 and a drain electrode 2230.

The switchable element 2500 according to an embodiment may be formed additional substrate. That is, the switchable element 2500 is formed on a middle substrate 2501 formed on the first substrate 2110 on which the second electrode 2340 is formed.

Referring to FIG. 20, when a voltage is not applied to the switchable electrode 2520, an organic light emitting display device is operated as a mirror mode.

The insulation layer 2530 is disposed on the switchable electrode 2520. The insulation layer 2530 may be hydrophobic. Thus, when a voltage is not applied to the switchable electrode 2520, the oil solution 2540 is contacted with upper surface of the insulation layer 2530. The aqueous solution 2550 is separated from the insulation layer 2530 by the oil solution 2540.

The oil solution 2540 may include a material having predetermined reflectance (and/or predetermined reflectivity). For example, the oil solution 2540 may include one or more of gold (Au), silver (Ag), aluminum (Al), magnesium (Mg), platinum (Pt), Nickel (Ni), titanium (Ti), etc. Thus, the organic light emitting display device may be operated as a mirror.

Referring to FIG. 21, when a voltage is applied to the switchable electrode 2520, an organic light emitting display device is operated in a non-mirror mode.

When a voltage is applied to the switchable electrode 2520, an electric potential is formed on the insulation layer 2530, thereby changing the insulation layer 2530 from hydrophobic to hydrophilic. Thus, the affinity between the insulation layer 2530 and the oil solution 2540 decreases, and instead the affinity between the insulation layer 2530 and the aqueous solution 2550 increases, thereby making the oil solution 2540 unstable. For this reason, the oil solution 2540 concentrates to departing from the unstable state, and the contact area between the insulation layer 2530 and the oil solution 2540 reduces to a minimal amount.

Thus, the oil solution 2540 including reflection material is condensed, and thus the organic light emitting display device may be operated as a non-mirror mode.

The switchable element according to an embodiment is formed additional substrate to form a switchable panel. Thus, a switchable panel according to an embodiment may be coupled to an organic light emitting display device or a liquid crystal display device to form various switchable display devices.

FIGS. 22 to 27 are cross-sectional views illustrating a method of manufacturing the organic light emitting display device of FIG. 20.

Figure 22:
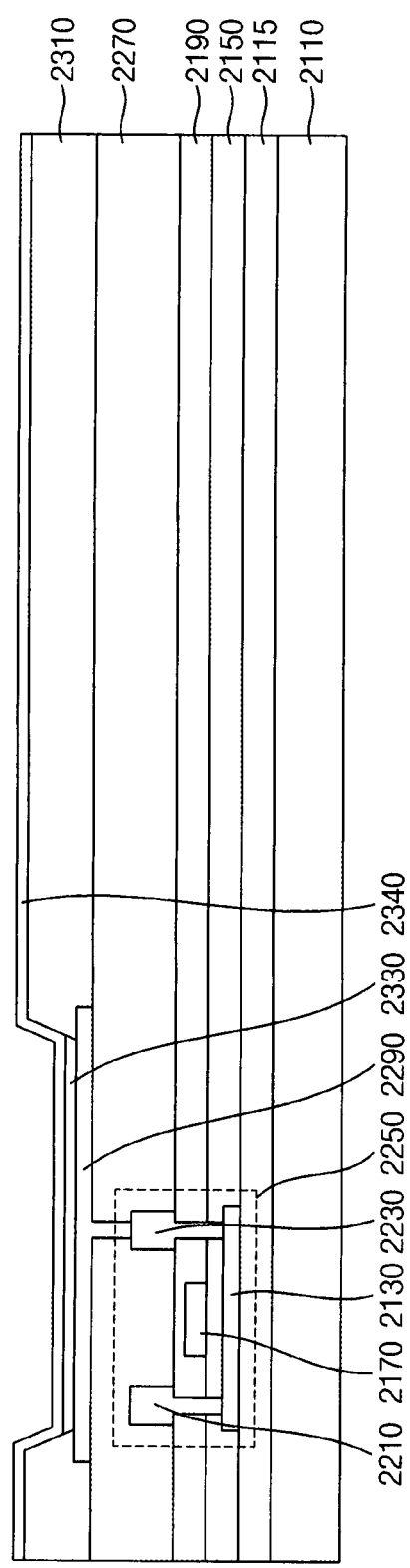
FIG. 22, FIG. 23, FIG. 24, FIG. 25, FIG. 26, and FIG. 27 are cross-sectional views illustrating a method of manufacturing the display device of FIG. 20.

Referring to FIG. 22, a switching element 2250, a first electrode 2290, a light emitting layer 2330 and a second electrode 2340 are formed on the first substrate 2110.

The method of manufacturing the organic light emitting display device according to an embodiment is substantially same as the method of manufacturing the organic light emitting display device of FIGS. 4 to 8 except for a switchable switching element, and thus repetitive explanation will be omitted.

Figure 23:
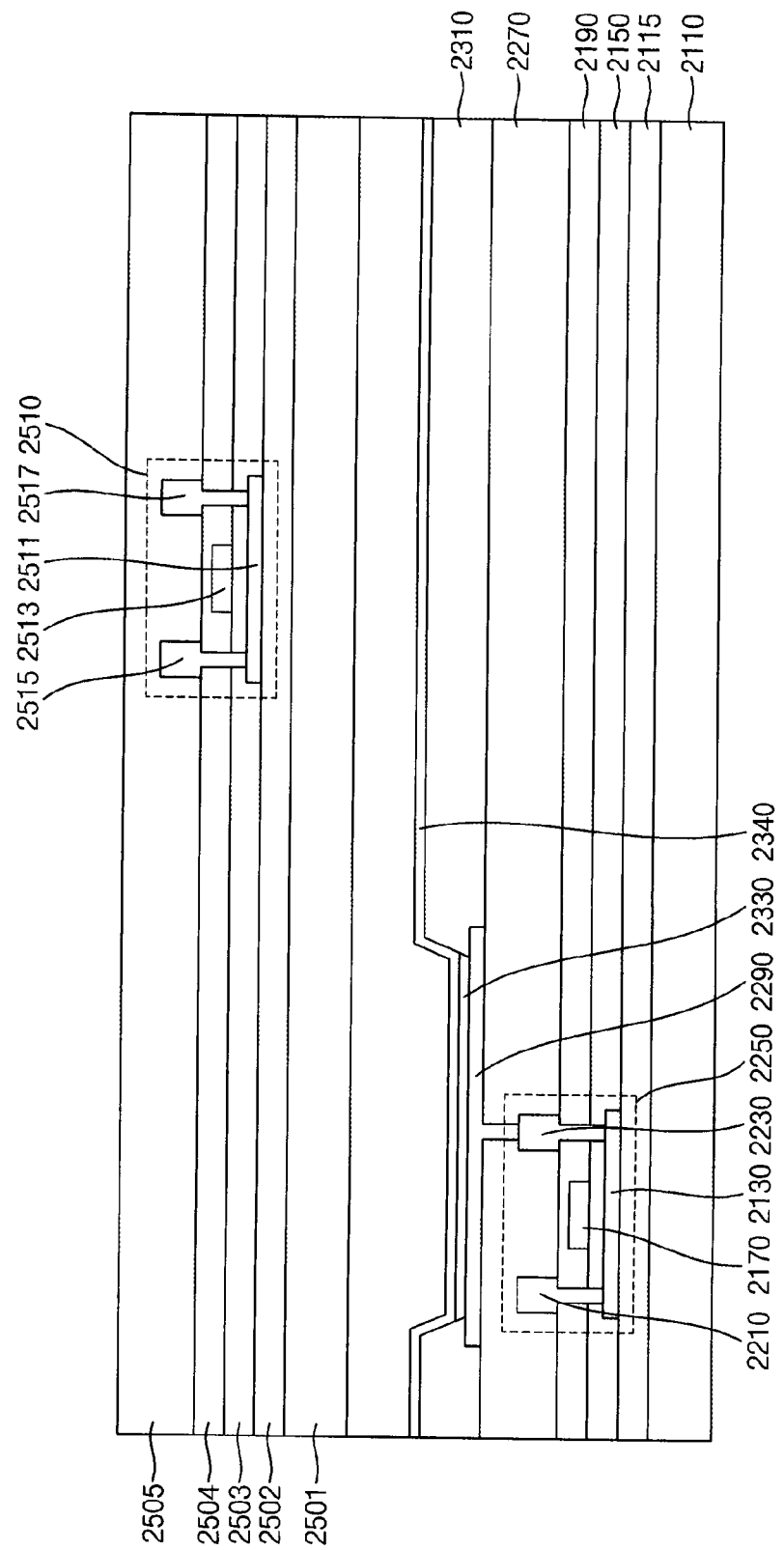

Referring to FIG. 23, a middle substrate 2501 is formed on the first substrate 2110 on which the second electrode 2340 is formed. Thereafter, a switchable switching element 2510 is formed on the middle substrate 2501.

The method of manufacturing the organic light emitting display device according to an embodiment is substantially same as the method of manufacturing the organic light emitting display device of FIGS. 4 to 7 except for the middle substrate 2501, and thus repetitive explanation will be omitted.

Figure 24:
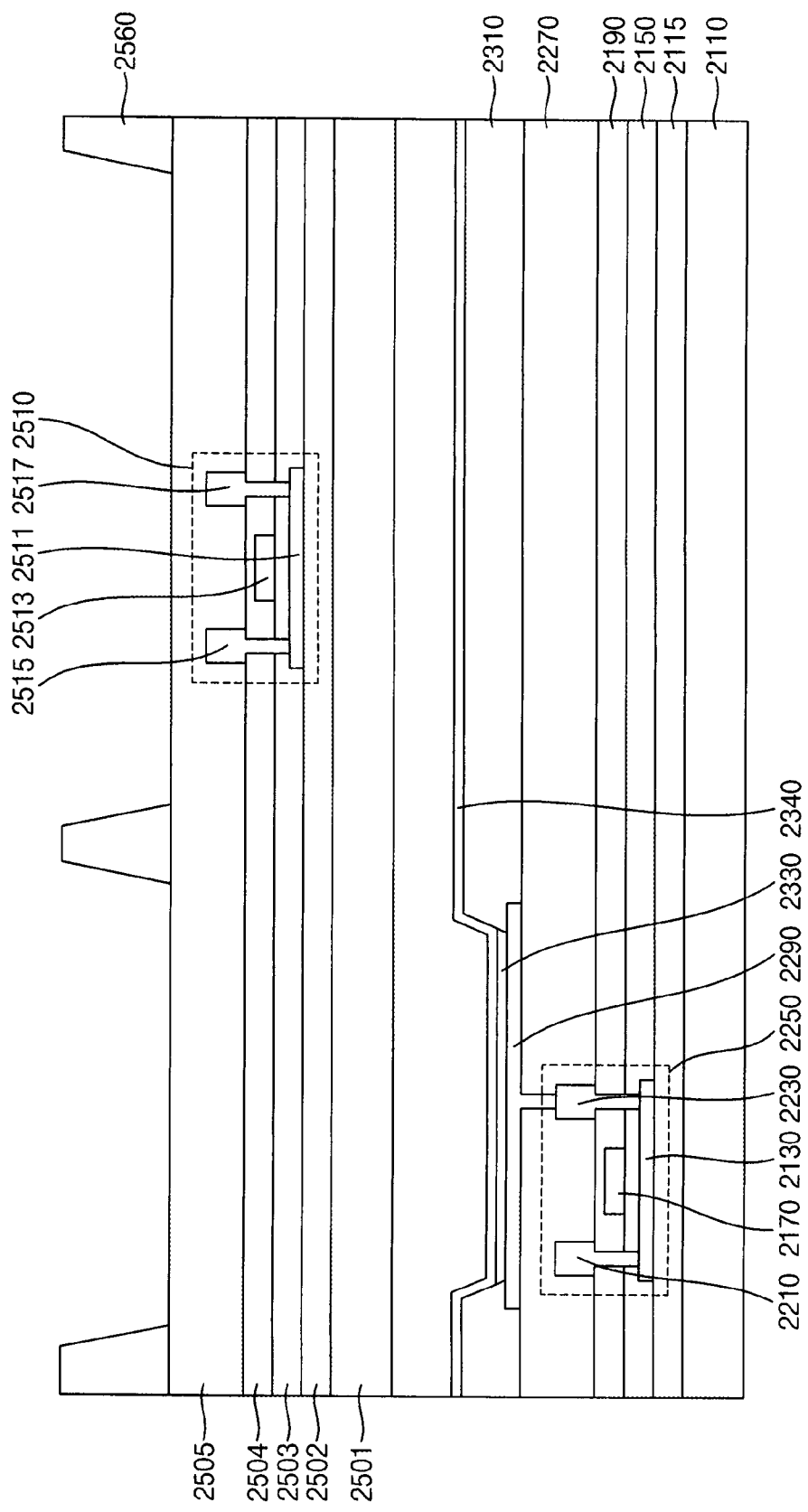

Referring to FIG. 24, a spacer 2560 is formed on the first substrate 2110 on which the switchable switching element 2510 is formed.

The spacer 2560 is disposed on boundary portion of the light-emitting region I and the reflection region II. The spacer 2560 may prevent from overflowing of the oil solution 2540 and the aqueous solution 2550 to the light-emitting region I.

Figure 25:
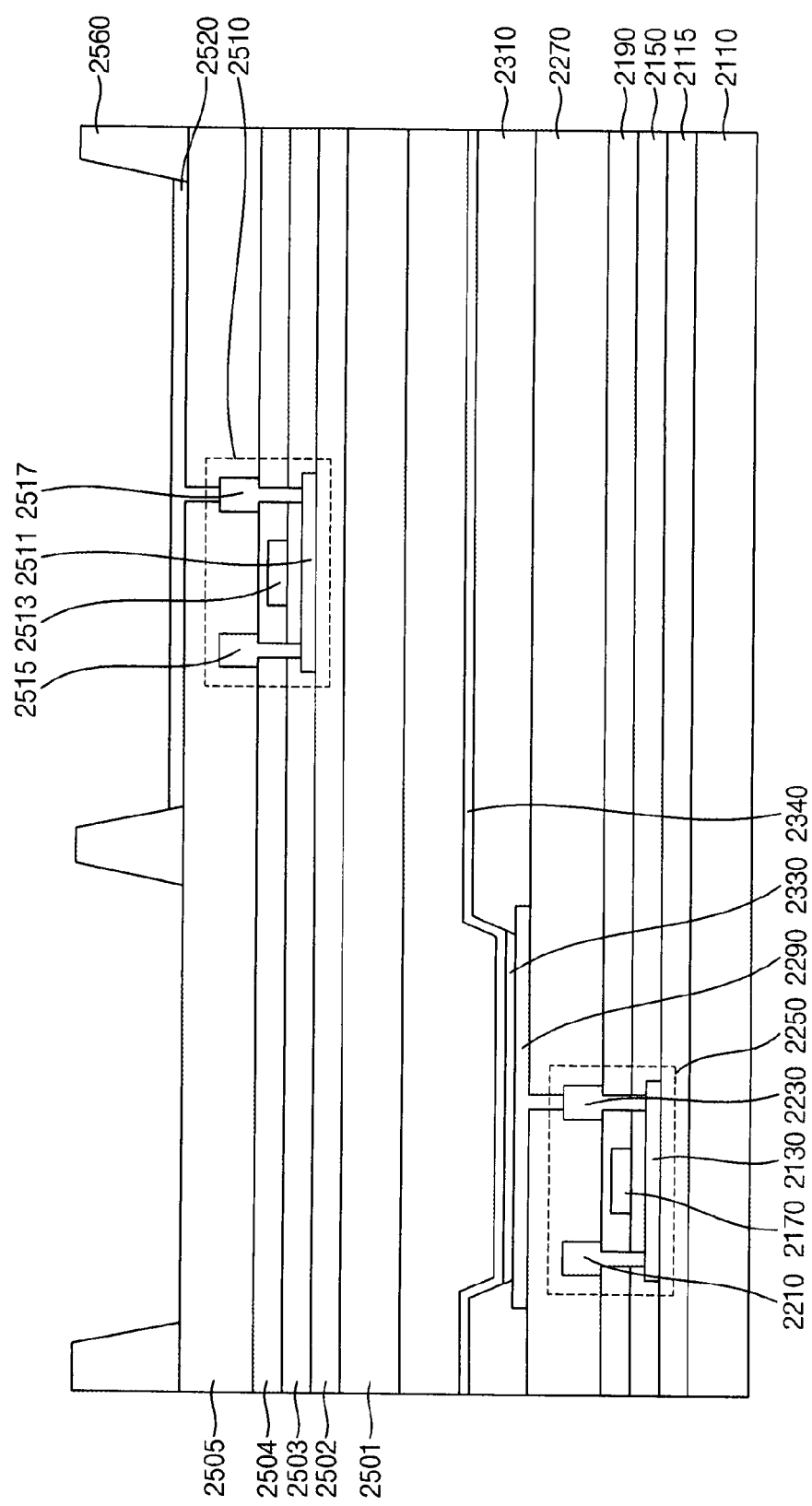

Referring to FIG. 25, a switchable electrode 2520 is formed on the first substrate 2110 on which the spacer 2560 is formed.

The switchable electrode 2520 is electrically connected to the switchable drain electrode 2517. In addition, the switchable electrode 2520 may be electrically connected to the switchable switching element 2510. The switchable electrode 2520 may be formed of a metal, an alloy, metal nitride, conductive metal oxide, transparent conductive materials, etc.

Figure 26:
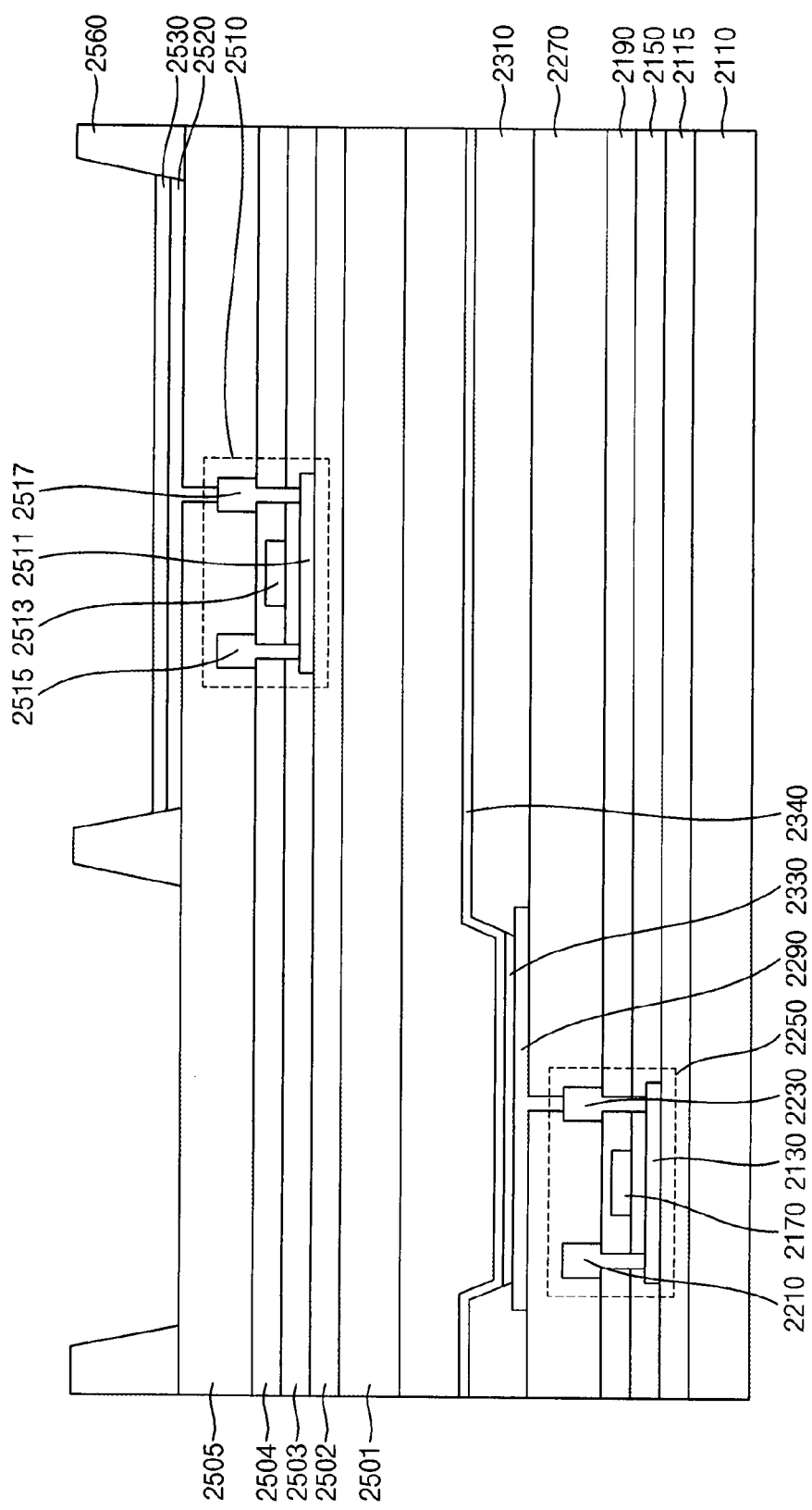

Referring to FIG. 26, an insulation layer 2530 is formed on the first substrate 2110 on which the switchable electrode 2520 is formed.

The insulation layer 2530 may be hydrophobic. Thus, when a voltage is not applied to the switchable electrode 2520, the oil solution 2540 is contacted with upper surface of the insulation layer 2530. The aqueous solution 2550 is separated from the insulation layer 2530 by the oil solution 2540.

Figure 27:
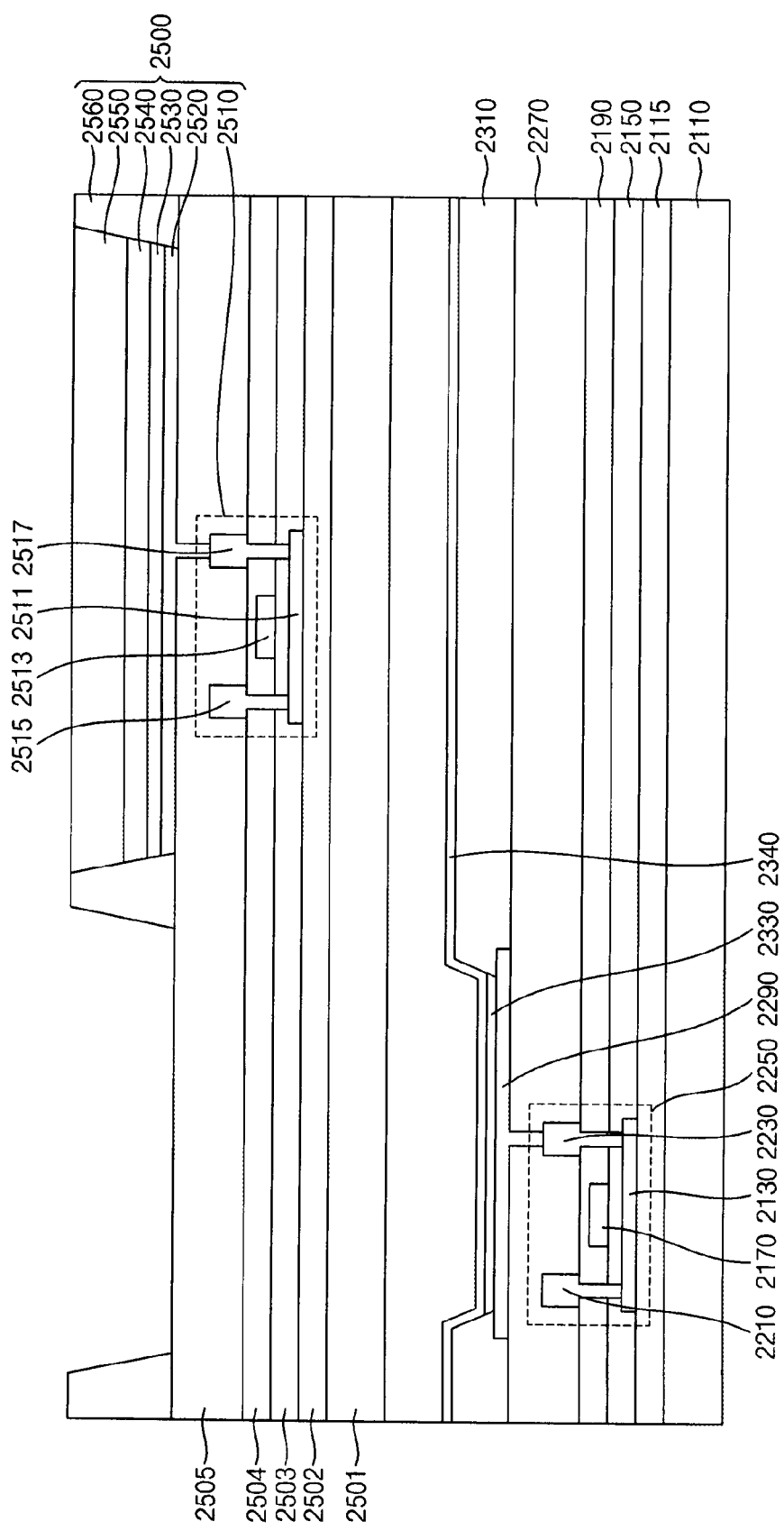

Referring to FIG. 27, an oil solution 2540 and an aqueous solution 2550 are filled on the first substrate 2110 on which the spacer 2560 is formed.

The spacer 2560 is disposed on boundary portion of the light-emitting region I and the reflection region II. A side surface of the spacer 2560 and the insulation layer 2530 may define a space. The oil solution 2540 and the aqueous solution 2550 may be filled to the space defined by the side surface of the spacer 2560 and the insulation layer 2530.

Referring to FIG. 20, the second substrate 2400 is formed on the first substrate 2110 on which the oil solution 2540 and the aqueous solution 2550 is filled.

The second substrate 2400 is formed on the first substrate 2110 on which the spacer 2560 is formed. The second substrate 2400 may cover and encapsulate the space defined by the side surface of the spacer 2560 and the insulation layer 2530.

The second substrate 2400 and the first substrate 2110 may include substantially the same materials. For example, the second substrate 2400 may be formed of quartz, synthetic quartz, calcium fluoride, fluoride-doping quartz, soda-lime glass, non-alkali glass etc. In some example embodiments, the second substrate 2400 may be formed of a transparent inorganic material or flexible plastic. For example, the second substrate 2400 may include a flexible transparent resin substrate. In this case, to increase flexibility of the organic light emitting display device 2100, the second substrate 2400 may include a stacked structure where at least one organic layer and at least one inorganic layer are alternately stacked.

Figure 28:
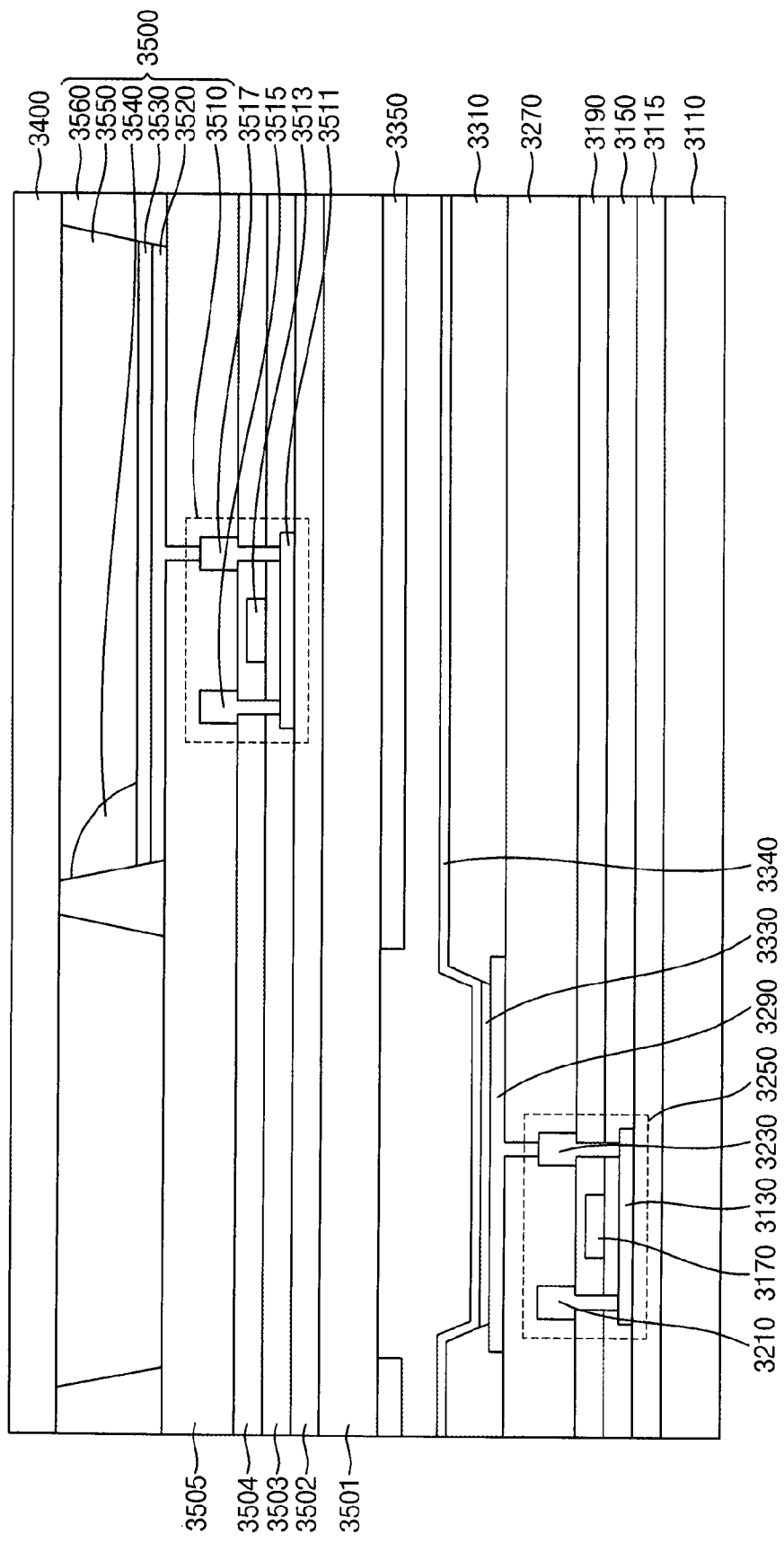
FIG. 28 is a cross-sectional view illustrating a display device, e.g., an organic light emitting display device, according to an embodiment.
Figure 29:
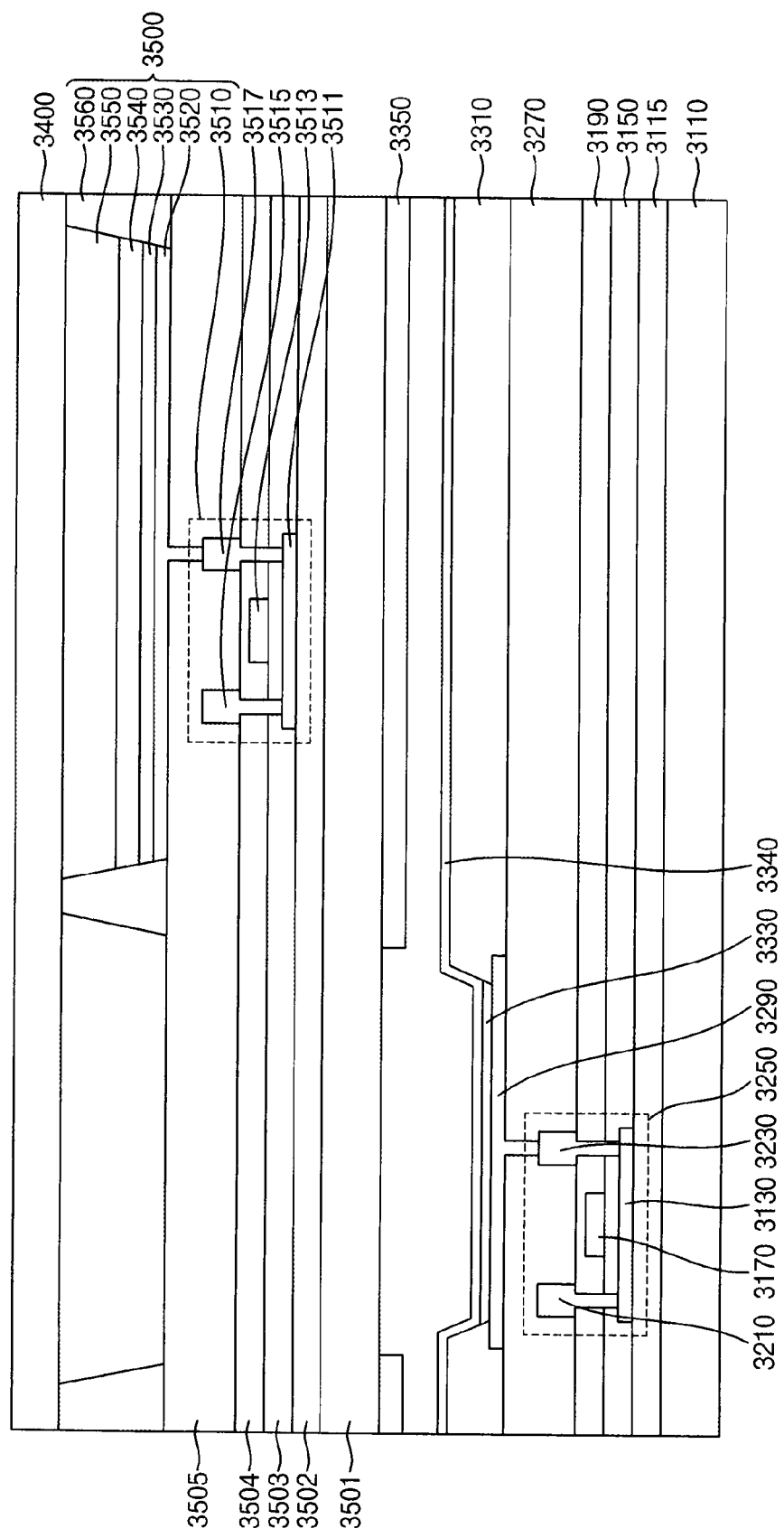
FIG. 29 is a cross-sectional view illustrating a display device, e.g., an organic light emitting display device, according to an embodiment.

FIG. 28 is a cross-sectional view illustrating an organic light emitting display device according to an embodiment. FIG. 29 is a cross-sectional view illustrating an organic light emitting display device according to an embodiment.

The organic light emitting display device according to an embodiment is substantially same as the organic light emitting display device of FIGS. 20 and 21 except for a reflection member 3350 (i.e., light-reflecting member 3350), and thus same reference numerals are used for same elements and repetitive explanation will be omitted.

Referring to FIGS. 28 and 29, an organic light emitting display device according to an embodiment includes a reflection member 3350 disposed on a middle substrate 3501.

The reflection member 3350 may include a material having predetermined reflectance (and/or predetermined reflectivity). For example, the reflection member 3350 may include one or more of gold (Au), silver (Ag), aluminum (Al), magnesium (Mg), platinum (Pt), Nickel (Ni), titanium (Ti), etc. In an embodiment, the reflection member 3350 may be formed of an alloy, metal nitride, conductive metal oxide, etc. For example, the reflection member 3350 may include one or more of an alloy containing aluminum, aluminum nitride (AlNx), an alloy containing silver, tungsten nitride (WNx), an alloy containing copper, chrome nitride (CrNx), an alloy containing molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

In an embodiment, the oil solution 3540 may include black material. For example, the oil solution 3540 may include black particle capable of absorbing light.

Referring to FIG. 28, when a voltage is applied to the switchable electrode 3520, an organic light emitting display device is operated as a mirror mode.

When a voltage is applied to the switchable electrode 3520, an electric potential is formed on the insulation layer 3530, thereby changing the insulation layer 3530 from hydrophobic to hydrophilic. Thus, the affinity between the insulation layer 3530 and the oil solution 3540 decreases, and instead the affinity between the insulation layer 3530 and the aqueous solution 3550 increases, thereby making the oil solution 3540 unstable. For this reason, the oil solution 3540 concentrates to departing from the unstable state, and the contact area between the insulation layer 3530 and the oil solution 3540 reduces to a minimal amount.

Thus, the oil solution 3540 including black particle capable of absorbing light is condensed, and thus the organic light emitting display device may be operated as a mirror mode.

Referring to FIG. 29, when a voltage is not applied to the switchable electrode 3520, an organic light emitting display device is operated as a non-mirror mode.

The insulation layer 3530 is disposed on the switchable electrode 3520. The insulation layer 3530 may be hydrophobic. Thus, when a voltage is not applied to the switchable electrode 3520, the oil solution 3540 is contacted with upper surface of the insulation layer 3530. The aqueous solution 3550 is separated from the insulation layer 3530 by the oil solution 3540.

The oil solution 3540 may include black particle capable of absorbing light. Thus, oil solution 3540 may block reflection of the reflection member 3350, and thus an organic light emitting display device is operated as a non-mirror mode.

FIGS. 30 to 35 are cross-sectional views illustrating a method of manufacturing the organic light emitting display device of FIG. 28.

Figure 30:
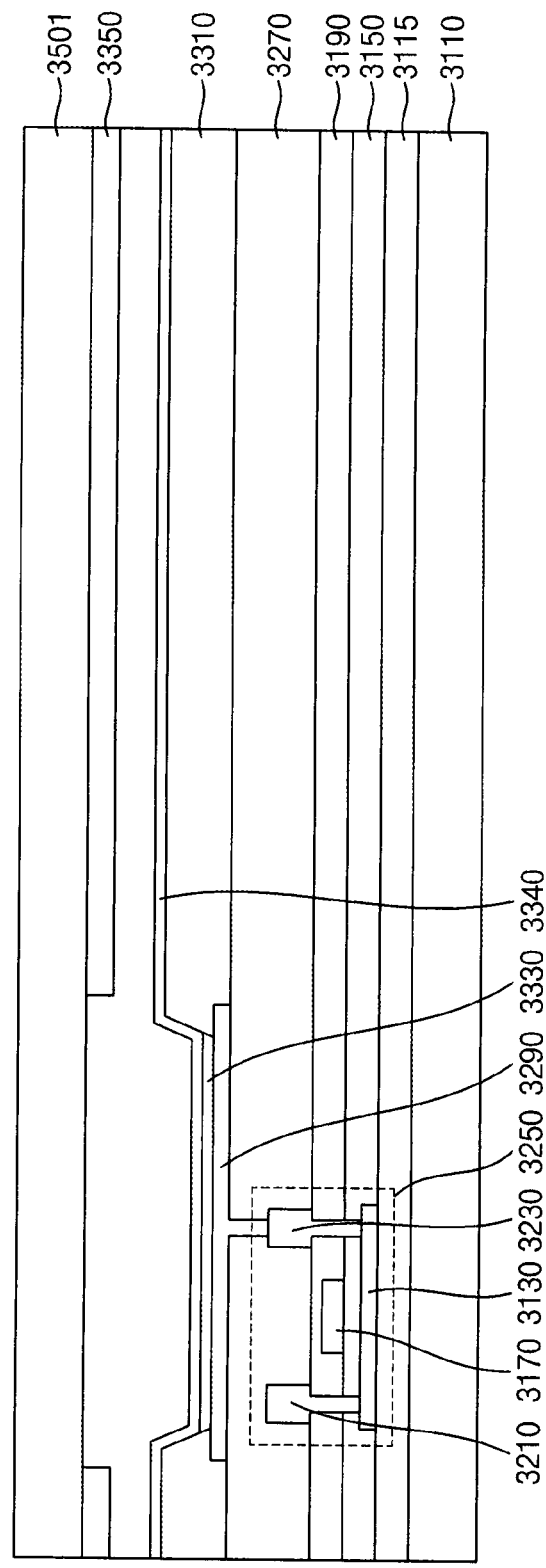
FIG. 30, FIG. 31, FIG. 32, FIG. 33, FIG. 34, and FIG. 35 are cross-sectional views illustrating a method of manufacturing the display device of FIG. 28.

Referring to FIG. 30, a switching element 3250, a first electrode 3290, a light emitting layer 3330 and a second electrode 3340 are formed on the first substrate 3110. Thereafter, the reflection member 3350 is formed on a middle substrate 3501, and the middle substrate 3501 is coupled to the first substrate 3110.

The method of manufacturing the organic light emitting display device according to an embodiment is substantially same as the method of manufacturing the organic light emitting display device of FIG. 22 except for a reflection member 3350, and thus repetitive explanation will be omitted.

Figure 31:
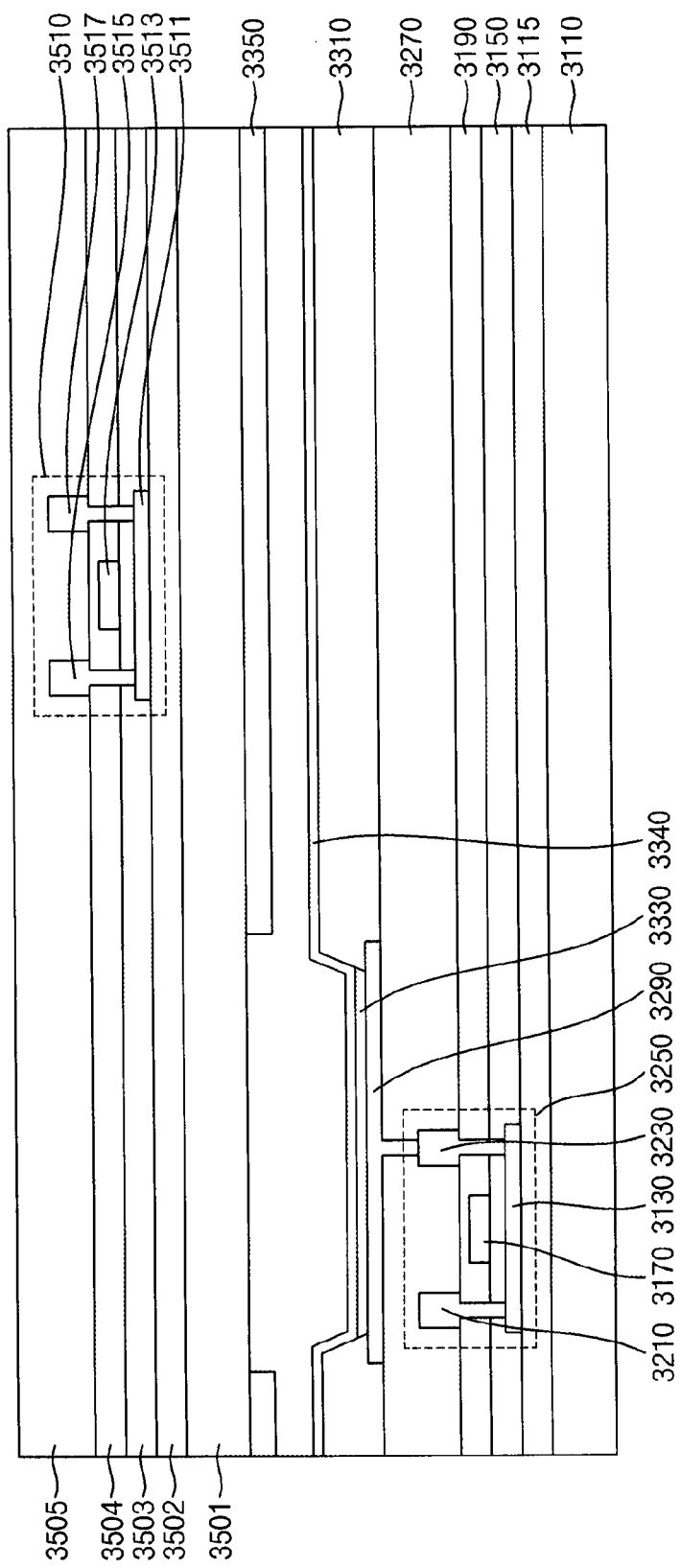

Referring to FIG. 31, a switchable switching element 3510 is formed on the first substrate 3110 on which the middle substrate 3501 is formed.

The method of manufacturing the organic light emitting display device according to an embodiment is substantially same as the method of manufacturing the organic light emitting display device of FIG. 23, and thus repetitive explanation will be omitted.

Figure 32:
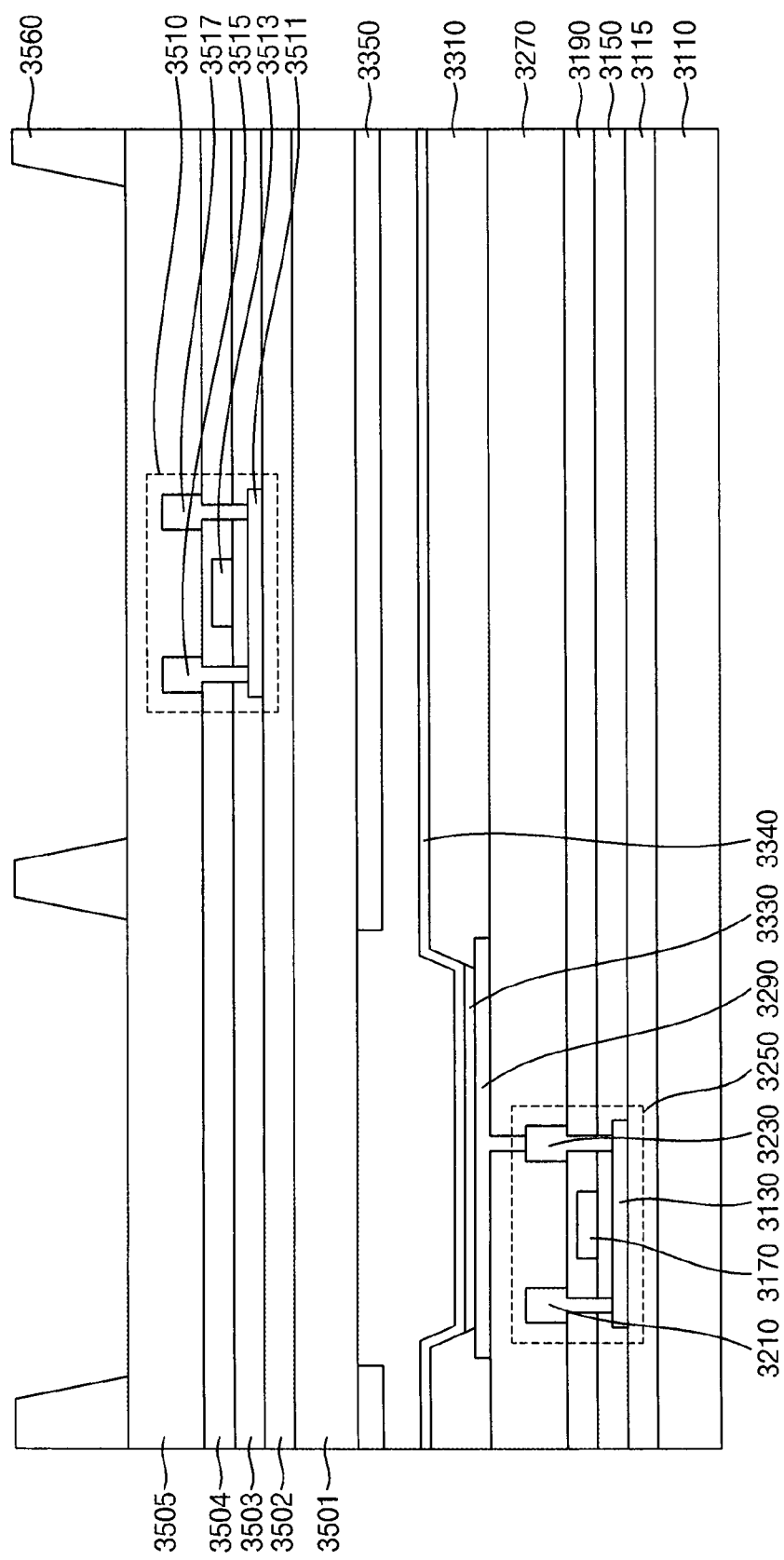

Referring to FIG. 32, a spacer 3560 is formed on the first substrate 3110 on which the switchable switching element 3510 is formed.

The spacer 3560 is disposed on boundary portion of the light-emitting region I and the reflection region II. The spacer 3560 may prevent from overflowing of the oil solution 3540 and the aqueous solution 3550 to the light-emitting region I.

Figure 33:
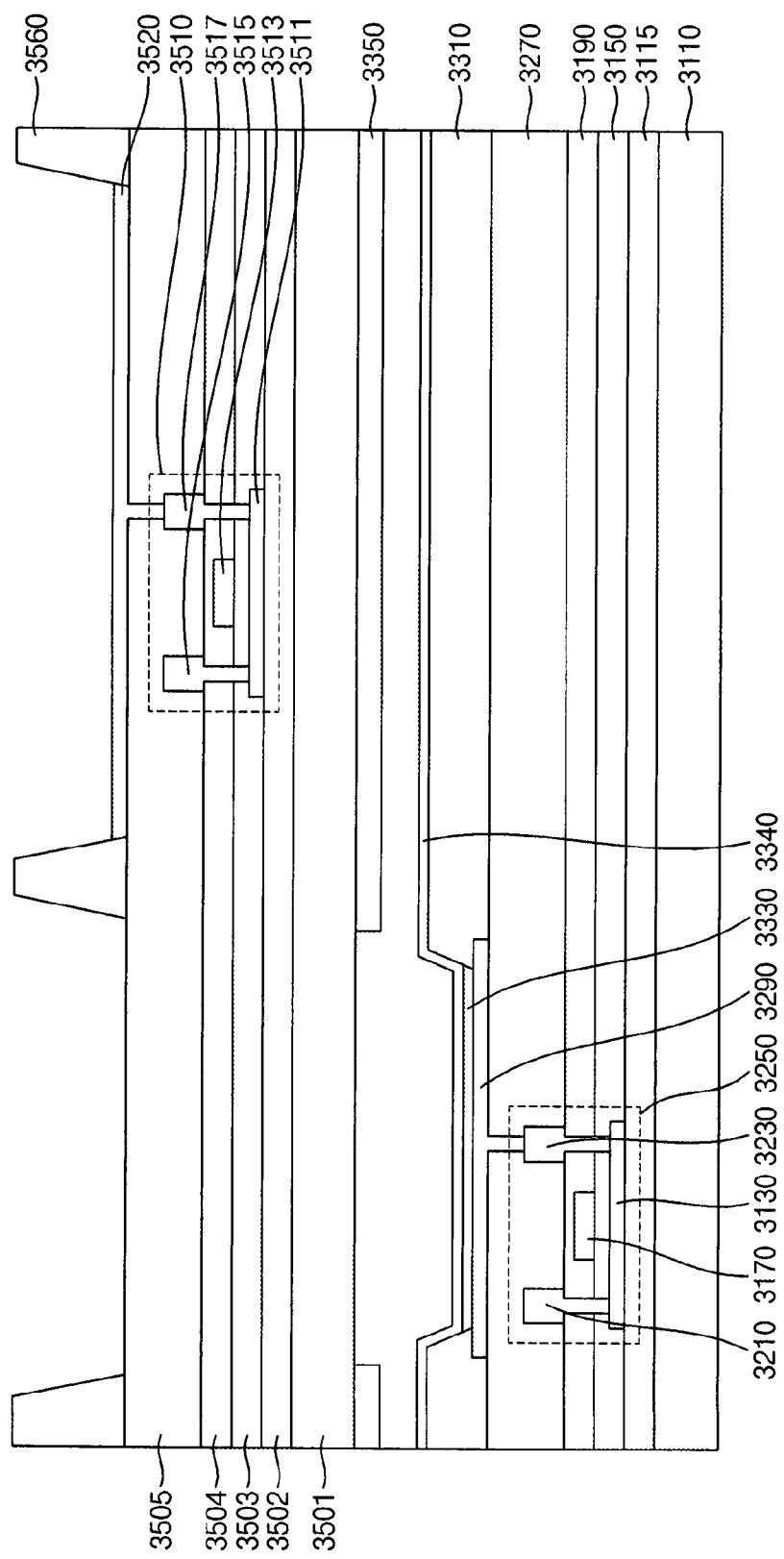

Referring to FIG. 33, a switchable electrode 3520 is formed on the first substrate 3110 on which the spacer 3560 is formed.

The switchable electrode 3520 is electrically connected to the switchable drain electrode 3517. In addition, the switchable electrode 3520 may be electrically connected to the switchable switching element 3510. The switchable electrode 3520 may be formed of a metal, an alloy, metal nitride, conductive metal oxide, transparent conductive materials, etc.

Figure 34:
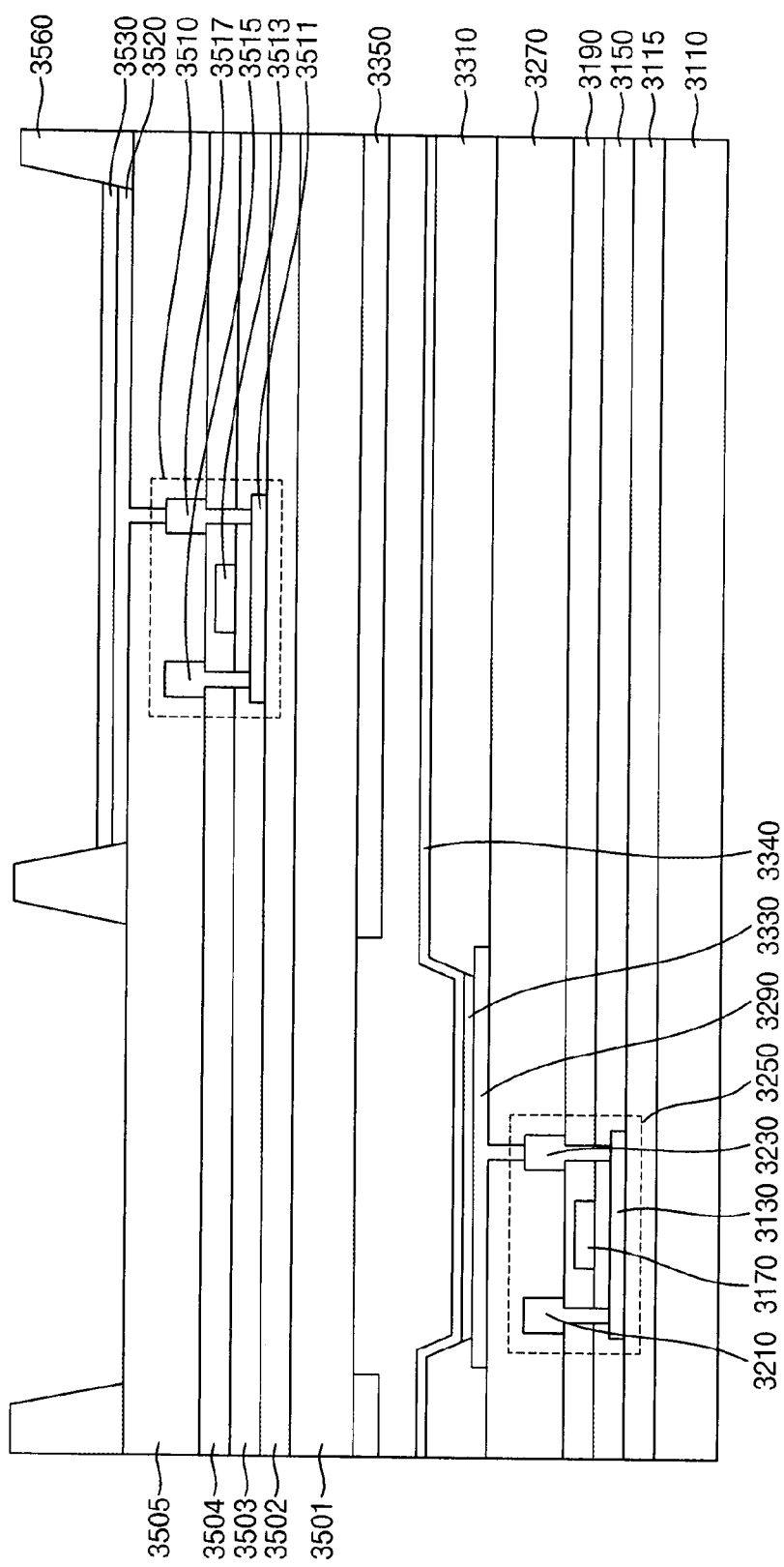

Referring to FIG. 34, an insulation layer 3530 is formed on the first substrate 3110 on which the switchable electrode 3520 is formed.

The insulation layer 3530 may be hydrophobic. Thus, when a voltage is not applied to the switchable electrode 3520, the oil solution 3540 is contacted with upper surface of the insulation layer 3530. The aqueous solution 3550 is separated from the insulation layer 3530 by the oil solution 3540.

Figure 35:
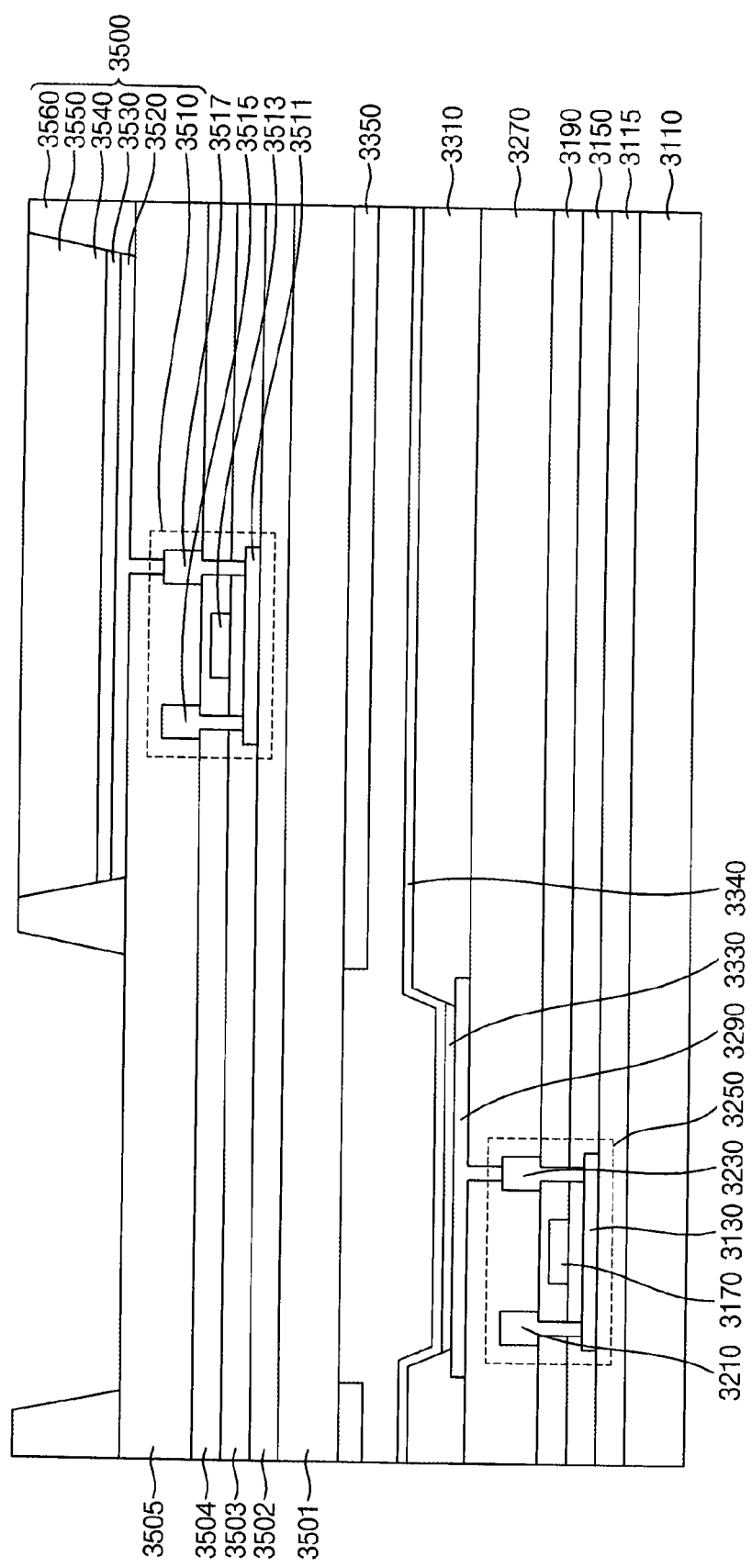

Referring to FIG. 35, an oil solution 3540 and an aqueous solution 3550 are filled on the first substrate 3110 on which the spacer 3560 is formed.

The spacer 3560 is disposed on boundary portion of the light-emitting region I and the reflection region II. A side surface of the spacer 3560 and the insulation layer 3530 may define a space. The oil solution 3540 and the aqueous solution 3550 may be filled to the space defined by the side surface of the spacer 3560 and the insulation layer 3530.

Referring to FIG. 28, the second substrate 3400 is formed on the first substrate 3110 on which the oil solution 3540 and the aqueous solution 3550 is filled.

The second substrate 3400 is formed on the first substrate 3110 on which the spacer 3560 is formed. The second substrate 3400 may cover and encapsulate the space defined by the side surface of the spacer 3560 and the insulation layer 3530.

The second substrate 3400 and the first substrate 3110 may include substantially the same materials. For example, the second substrate 3400 may be formed of quartz, synthetic quartz, calcium fluoride, fluoride-doping quartz, soda-lime glass, non-alkali glass etc. In some example embodiments, the second substrate 3400 may be formed of a transparent inorganic material or flexible plastic. For example, the second substrate 3400 may include a flexible transparent resin substrate. In this case, to increase flexibility of the organic light emitting display device 3100, the second substrate 3400 may include a stacked structure where at least one organic layer and at least one inorganic layer are alternately stacked.

Figure 36:
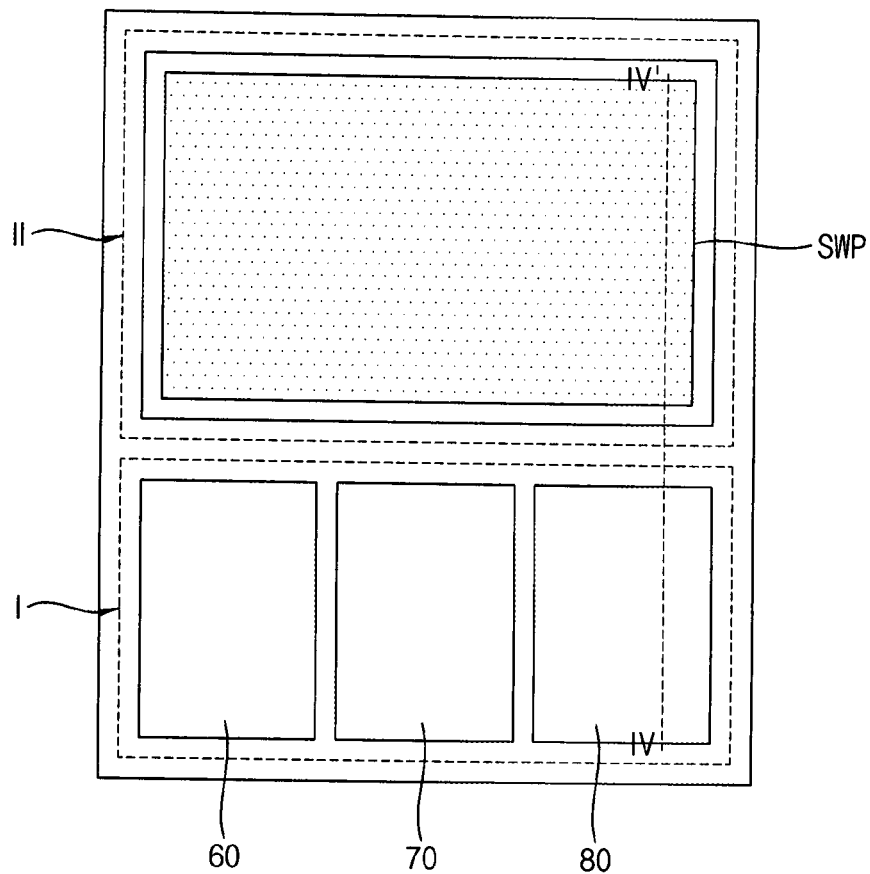
FIG. 36 is a plan view illustrating a display device, e.g., an organic light emitting display device, according to an embodiment.
Figure 37:
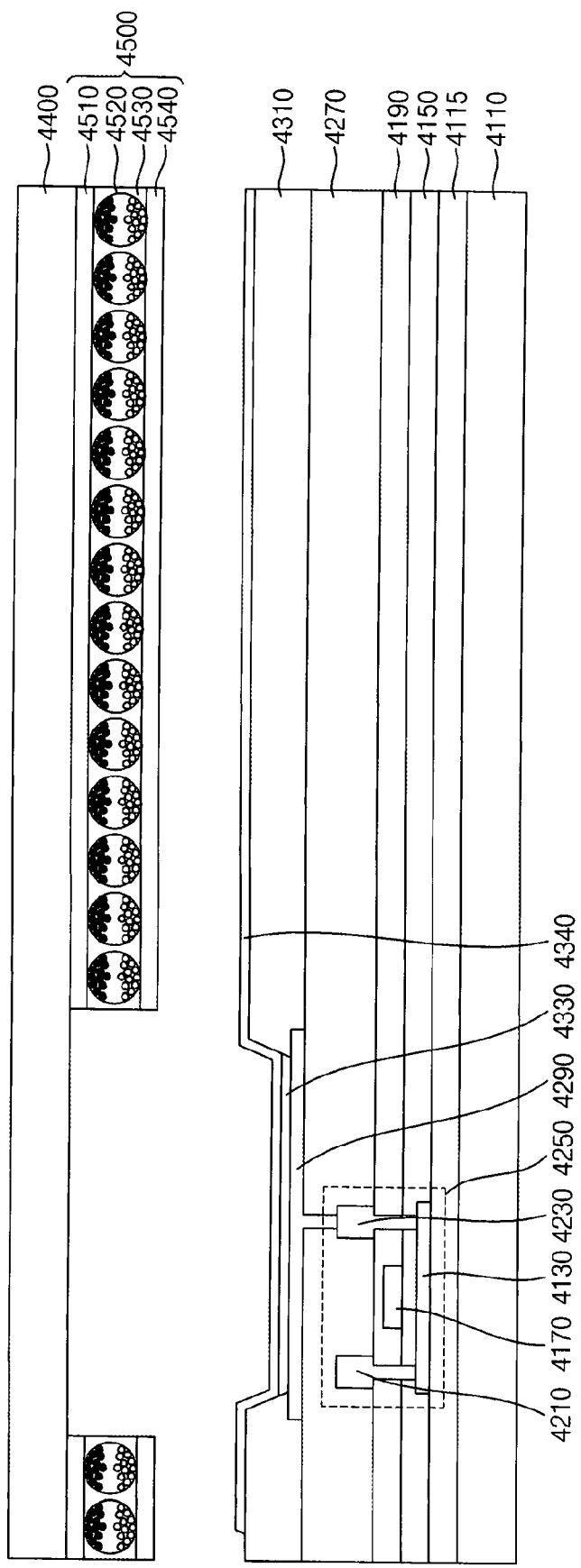
FIG. 37 is a cross-sectional view taken along a line IV-IV' of FIG. 36.
Figure 38:
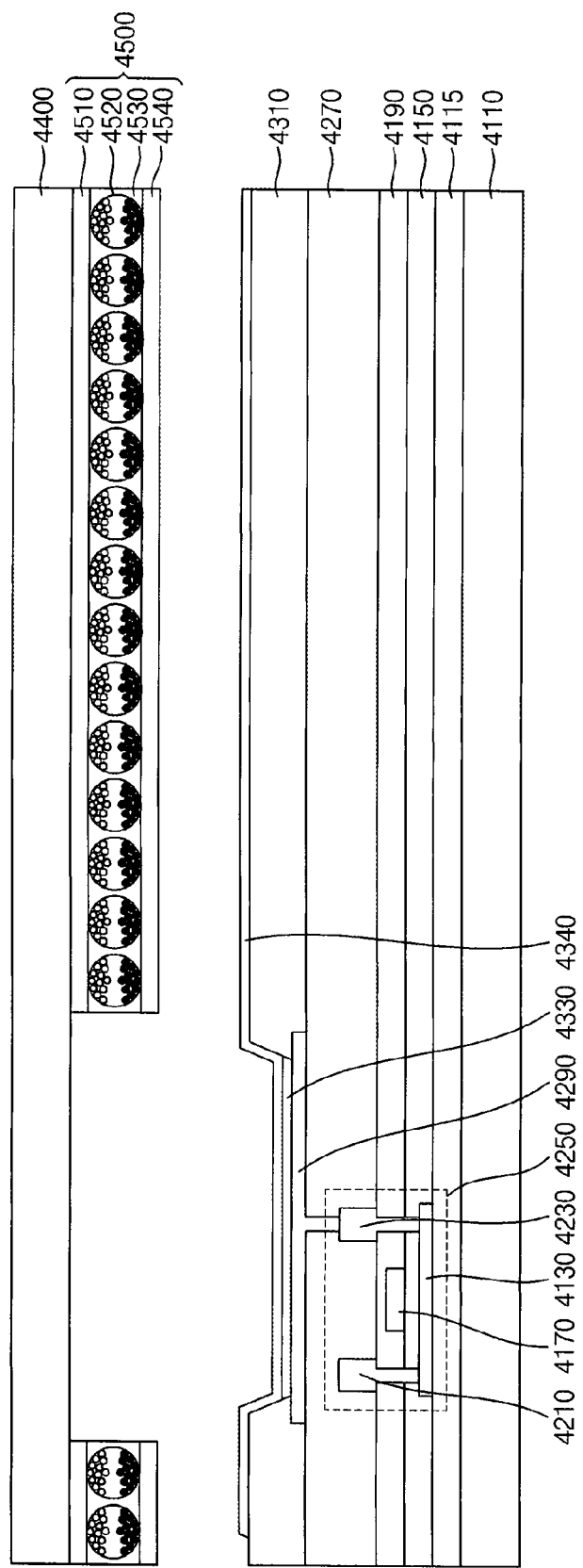
FIG. 38 is a cross-sectional view taken along a line IV-IV' of FIG. 36.

FIG. 36 is a plan view illustrating an organic light emitting display device according to an embodiment. FIG. 37 is a cross-sectional view taken along a line IV-IV' of FIG. 36. FIG. 38 is a cross-sectional view taken along a line IV-IV' of FIG. 36.

Referring to FIGS. 36 and 37, an organic light emitting display device according to an embodiment may include a light-emitting region I and a reflection region II. Pixels 60, 70, and 80 may be positioned in the light-emitting region I, and a transparent window 90 may be positioned in the reflection region II. For example, the pixel 60 may be a pixel emitting a red color, the pixel 70 may be a pixel emitting a green color, and the pixel 80 may be a pixel emitting a blue color.

A switching part SWP may be disposed in the reflection region II. A switchable element 4500 may be disposed in the switching part SWP. Average reflectance (and/or average reflectivity) of the switchable element 4500 in a predetermined direction (e.g., in a direction perpendicular to an image display surface of the display device) may change according to voltages applied to the switching element 4500.

In an embodiment, the switchable element 4500 may use an electronic ink technique. Electronic ink used in electronic ink display devices includes particles. The particles are floatably included and/or may move in a capsulated fluid. The particles have a negative or positive charge so that phoresis and/or movement can be performed to the particles. Accordingly, electronic ink display devices display an image by applying electric fields to the electronic ink and regulating the phoresis and/or movement of the particles in the electronic ink.

An organic light emitting display device according to an embodiment may include a first substrate 4110, a buffer layer 4115, a first insulation interlayer 4150, a second insulation layer 4190, a third insulation layer 4270, a light emitting structure, a pixel defining layer 4310, a switchable element 4500 and a second substrate 4400. Here, the light emitting structure includes a switching element 4250, a first electrode 4290, an emission layer 4330 and a second electrode 4340. The switching element 4250 includes an active member 4130, a gate electrode 4170, a source electrode 4210 and a drain electrode 4230. However, an inventive concept is not limited thereto, an organic light emitting display device according to an embodiment may further include a switchable switching element controlling the switchable element 4500.

The organic light emitting display device 4100 may include a plurality of pixel regions. One pixel region may include the light-emitting region I and the reflection region II. The reflection region II may substantially surround the light-emitting region I. The switching element 4250, the first electrode 4290, the emission layer 4330 and a portion of the second electrode 4340 may be disposed in the light-emitting region I. However, the switching element 4250 may be disposed in the light-emitting region I.

A display image may be displayed in light-emitting region I. An image of an object that is located in the front of the organic light emitting display device 4100 may be reflected in the reflection region II.

The light emitting structure may be disposed on the first substrate 4110. The first substrate 4110 may be formed of transparent materials. For example, the first substrate 4110 may include quartz, synthetic quartz, calcium fluoride, fluoride-doping quartz, a soda-lime glass, a non-alkali glass etc. Alternatively, the first substrate 4110 may be formed of a flexible transparent resin substrate. Here, the flexible transparent resin substrate for the first substrate 4110 may include a polyimide substrate. For example, the polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structure. That is, in example embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the switching element 4250, a capacitor, the first electrode 4290, the light emitting layer 4330, the second electrode 4340, etc.) may be disposed on the insulation layer.

After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may serve as the first substrate 4110 after the removal of the glass substrate. As the organic light emitting display device 4100 includes the light-emitting region I and the reflection region II, the first substrate 4110 may also include the light-emitting region I and the reflection region II.

A buffer layer 4115 may be disposed on the first substrate 4110. The buffer layer 4115 may extend from the light-emitting region I into the reflection region II. The buffer layer 4115 may prevent the diffusion (e.g., an out gassing) of metal atoms and/or impurities from the first substrate 4110. Additionally, the buffer layer 4115 may control a rate of a heat transfer in a crystallization process for forming the active member 4130, thereby obtaining substantially uniform the active member 4130. Furthermore, the buffer layer 4115 may improve a surface flatness of the first substrate 4110 when a surface of the first substrate 4110 is relatively irregular. According to a type of the first substrate 4110, at least two buffer layers may be provided on the first substrate 4110, or the buffer layer may not be disposed.

The switching element 4250 may include the active member 4130, the gate electrode 4170, the source electrode 4210, and the drain electrode 4230. For example, the active member 4130 may be disposed on the first substrate 4110. The active member 4130 may be formed an oxide semiconductor, an inorganic semiconductor (e.g., amorphous silicon, polysilicon, etc.), an organic semiconductor, etc.

The first insulation layer 4150 may be disposed on the active member 4130. The first insulation layer 4150 may cover the active member 4130 in the light-emitting region I, and may extend in the first direction on the first substrate 4110. That is, the first insulation layer 4150 may be disposed on the entire first substrate 4110. The first insulation layer 4150 may be formed a silicon compound, a metal oxide, etc.

The gate electrode 4170 may be disposed on a portion of the first insulation layer 4150 under which the active member 4130 is disposed. The gate electrode 4170 may be formed of a metal, an alloy, metal nitride, conductive metal oxide, transparent conductive materials, etc.

The second insulation layer 4190 may be disposed on the gate electrode 4170. The second insulation layer 4190 may cover the gate electrode 4170 in the light-emitting region I, and may extend in the first direction on the first substrate 4110. That is, the second insulation layer 4190 may be disposed on the entire first substrate 4110. The second insulation layer 4190 may be formed of a silicon compound, a metal oxide, etc.

The source electrode 4210 and the drain electrode 4230 may be disposed on the second insulation layer 4190. The source electrode 4210 may be in contact with a first side of the active member 4130 by removing a portion of the first and second insulation layers 4150 and 4190. The drain electrode 4230 may be in contact with a second side of the active member 4130 by removing a second portion of the first and second insulation layers 4150 and 4190. Each of the source electrode 4210 and the drain electrode 4230 may be formed of a metal, an alloy, metal nitride, conductive metal oxide, transparent conductive materials, etc.

In an embodiment, the gate electrode 4170 is disposed on the active member 4130. However, the gate electrode 4170 may be disposed under the active member 4130.

The pixel defining layer 4310 may be disposed the on third insulation layer 4270 to expose a portion of the first electrode 4290. The pixel defining layer 4310 may be formed of organic materials or inorganic materials. In this case, the light emitting layer 4330 may be disposed on a portion that the first electrode 4290 is exposed by the pixel defining layer 4310.

The light emitting layer 4330 may be disposed on the exposed first electrode 4290. The light emitting layer 4330 may be formed using light emitting materials capable of generating different colors of light (e.g., a red color of light, a blue color of light, and a green color of light). However, the light emitting layer 4330 may stack light emitting materials capable of generating different colors of light to emit white color of light.

The second electrode 4340 may be disposed on the pixel defining layer 4310 and the light emitting layer 4330. The second electrode 4340 may cover the pixel defining layer 4310 and the light emitting layer 4330 in the light-emitting region I and the reflection region II, and may extend in the first direction on the first substrate 4110. That is, the second electrode 4340 may be electrically connected to the first through third pixels. The second electrode 4340 may be formed of a metal, an alloy, metal nitride, conductive metal oxide, a transparent conductive material, etc. These may be used alone or in a combination thereof. The first substrate 4110 may be combined with the second substrate 4400 by using a sealing member. In addition, a filler may be disposed between the first substrate 4110 and the second substrate 4400.

The second substrate 4400 and the first substrate 4110 may include substantially the same materials. For example, the second substrate 4400 may be formed of quartz, synthetic quartz, calcium fluoride, fluoride-doping quartz, soda-lime glass, non-alkali glass etc. In some example embodiments, the second substrate 4400 may be formed of a transparent inorganic material or flexible plastic. For example, the second substrate 4400 may include a flexible transparent resin substrate. In this case, to increase flexibility of the organic light emitting display device 4100, the second substrate 4400 may include a stacked structure where at least one organic layer and at least one inorganic layer are alternately stacked.

The switchable element 4500 includes a micro capsule 4520, a lower electrode 4540 and an upper electrode 4510. The switchable element 4500 is explained referring to FIG. 39 in detail.

Referring to FIG. 37, when a "−" voltage is applied to the lower electrode 4540, an organic light emitting display device is operated as a mirror mode.

The micro capsule 4520 includes first particles including black material and second particles including reflection material. The first particles are charged by different electric charge from the second particles. For example, the first particles may be charged by "+" electric charge and the second particles may be charged by "−" electric charge.

When a "−" voltage is applied to the lower electrode 4540, the second particles are disposed upper portion of the micro capsule 4520 and the first particles are disposed lower portion of the micro capsule 4520. Since the second particles include reflection material, the switchable element 4500 may form a reflection surface on the reflection region II. Thus, the organic light emitting display device may be operated as a mirror mode. However, the first particles may be charged by "−" electric charge and the second particles may be charged by "+" electric charge. At this time, when a "+" voltage is applied to the lower electrode 4540, the organic light emitting display device may be operated as a mirror.

Referring to FIG. 38, when a "+" voltage is applied to the lower electrode 4540, an organic light emitting display device is operated in a non-mirror mode.

The micro capsule 4520 includes first particles including black material and second particles including reflection material. The first particles are charged by different electric charge from the second particles. For example, the first particles may be charged by "+" electric charge and the second particles may be charged by "−" electric charge.

When a "+" voltage is applied to the lower electrode 4540, the first particles are disposed upper portion of the micro capsule 4520 and the second particles are disposed lower portion of the micro capsule 4520. Since the first particles include black material, the switchable element 4500 may not form a reflection surface on the reflection region II. Thus, the organic light emitting display device may be operated as a non-mirror mode. However, the first particles may be charged by "−" electric charge and the second particles may be charged by "+" electric charge. At this time, when a "+" voltage is applied to the lower electrode 4540, the organic light emitting display device may be operated in a non-mirror mode.

Figure 39:
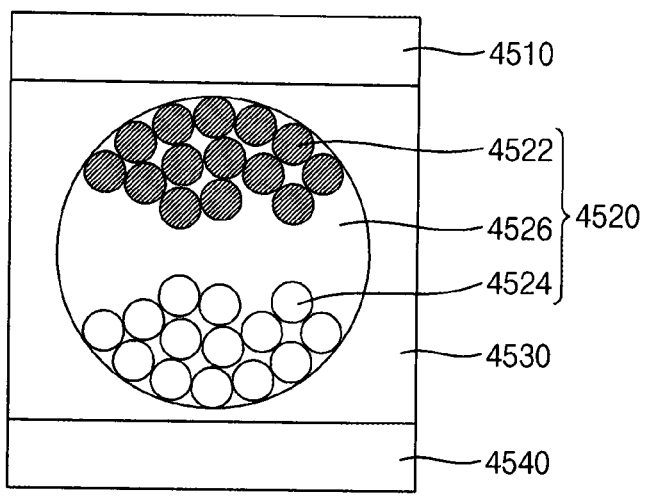
FIG. 39 is a cross-sectional view illustrating a switchable element of a display device, e.g., an organic light emitting display device, according to an embodiment.

FIG. 39 is a cross-sectional view illustrating a switchable element of an organic light emitting display device according to an embodiment.

Referring to FIG. 39, a switchable element of an organic light emitting display device according to an embodiment is illustrated.

A switchable element 4500 of an organic light emitting display device according to an embodiment includes an upper electrode 4510, a micro capsule 4520, a binder film 4530 and a lower electrode 4540.

The upper electrode 4510 is disposed on the binder film 4530. The upper electrode 4510 may be formed of a metal, an alloy, metal nitride, conductive metal oxide, transparent conductive materials, etc.

For example, the upper electrode 4510 may include a transparent conductive material, such as indium tin oxide (ITO) and indium zinc oxide (IZO).

The micro capsule 4520 includes first particles (including black material) 4522, second particles (including reflection material) 4524 and a fluid 4526 filled in the micro capsule 4520.

The fluid 4526 is formed of a transparent material and/or a translucent material having the viscosity that enables phoresis and/or movement of the first particles 4522 and the second particles 4524. The fluid 4526 has a high electrical resistance. In an embodiment, the fluid 4526 may be formed of an inorganic insulating material. In an embodiment, a mixture fluid having at least two mixed materials may be used as the fluid 4526. In an embodiment, the fluid 4526 may be dyed in red, green, and blue according to the sub-pixels. The color of the fluid 4526 may be identical to or analogous to the color of the light emitted by the corresponding light-emitting element in the same sub-pixel.

The first particles 4522 are charged by different electric charge from the second particles 4524. For example, the first particles 4522 may be charged by "+" electric charge and the second particles 4524 may be charged by "−" electric charge. However, the first particles 4522 may be charged by "−" electric charge and the second particles 4524 may be charged by "+" electric charge.

The binder film 4530 fixes the micro capsules 4520 so that the micro capsules 4520 may not move and function as a cross-linker for electrical and physical division. The binder film 4530 is formed of one of dielectric materials such as soluble, water-dispersed, liposoluble, thermosetting, and thermoplastic polymers and/or photo-polymerizable polymers.

The lower electrode 4540 is disposed under the binder film 4530. The lower electrode 4540 may be formed of a metal, an alloy, metal nitride, conductive metal oxide, transparent conductive materials, etc.

For example, the lower electrode 4540 may include metal having low reflectivity in order to decrease reflection of the inside.

Figure 40:
FIG. 40, FIG. 41, and FIG. 42 are cross-sectional views illustrating a method of manufacturing the display device of FIG. 37.
Figure 41:
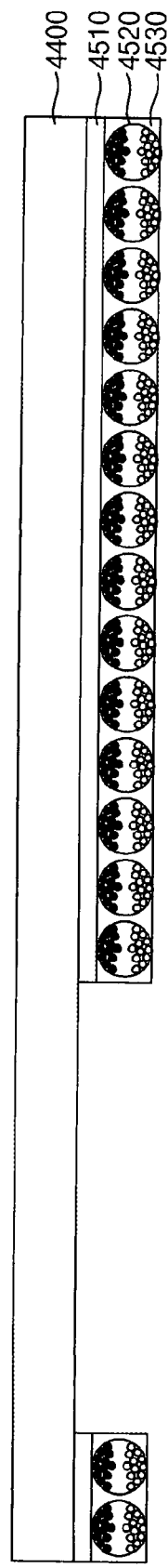
Figure 42:
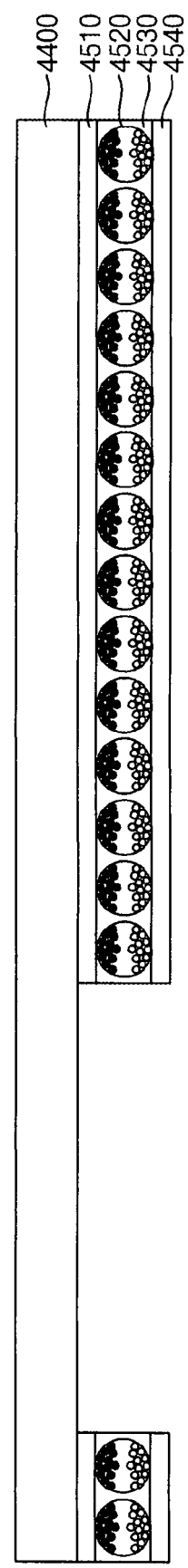

FIGS. 40 to 42 are cross-sectional views illustrating a method of manufacturing the organic light emitting display device of FIG. 37.

Referring to FIG. 40, the upper electrode 4510 is formed on the second substrate 4400.

The upper electrode 4510 is disposed on the second substrate 4400. The upper electrode 4510 may be formed of a metal, an alloy, metal nitride, conductive metal oxide, transparent conductive materials, etc.

For example, the upper electrode 4510 may include a transparent conductive material, such as indium tin oxide (ITO) and indium zinc oxide (IZO).

Referring to FIG. 41, the micro capsule 4520 and the binder film 4530 are formed on the second substrate 4400 on which the upper electrode 4510 is formed.

The micro capsule 4520 includes first particles including black material 4522, second particles including reflection material 4524 and a fluid 4526 filled in the micro capsule 4520.

The fluid 4526 is formed of a transparent and translucent material having the viscosity that enables phoresis of the first particles 4522 and the second particles 4526. The fluid 4526 has a high resistance. Alternatively, the fluid 4526 may be formed of an inorganic material. In other embodiments, a mixture fluid having at least two mixed materials may be used as the fluid 4526. Alternatively, or additionally, the fluid 4526 may be dyed in red, green, and blue according to the sub-pixels.

The first particles 4522 are charged by different electric charge from the second particles 4524. For example, the first particles 4522 may be charged by "+" electric charge and the second particles 4524 may be charged by "−" electric charge. However, the first particles 4522 may be charged by "−" electric charge and the second particles 4524 may be charged by "+" electric charge.

The binder film 4530 fixes the micro capsules 4520 so that the micro capsules 4520 may not move and function as a cross-linker for electrical and physical division. The binder film 4530 is formed of one of dielectric materials such as soluble, water-dispersed, liposoluble, thermosetting, and thermoplastic polymers and/or photo-polymerizable polymers.

Referring to FIG. 42, the lower electrode 4540 is formed on the second substrate 4400 on which the micro capsule 4520 and the binder film 4530 are formed.

The lower electrode 4540 is disposed under the binder film 4530. The lower electrode 4540 may be formed of a metal, an alloy, metal nitride, conductive metal oxide, transparent conductive materials, etc.

For example, the lower electrode 4540 may include metal having low reflectivity in order to decrease reflection of the inside.

Referring to FIG. 37, the second substrate 4400 on which the lower electrode 4540 is formed is coupled to the first substrate 4110 on which the second electrode 4340 is formed.

A process of forming the second electrode 4340 on the first substrate 4110 is substantially same as the method of manufacturing the organic light emitting display device of FIG. 22, and thus repetitive explanation will be omitted.

The first substrate 4110 may be combined with the second substrate 4400 by using a sealing member. In addition, a filler may be disposed between the first substrate 4110 and the second substrate 4400.

Figure 43:
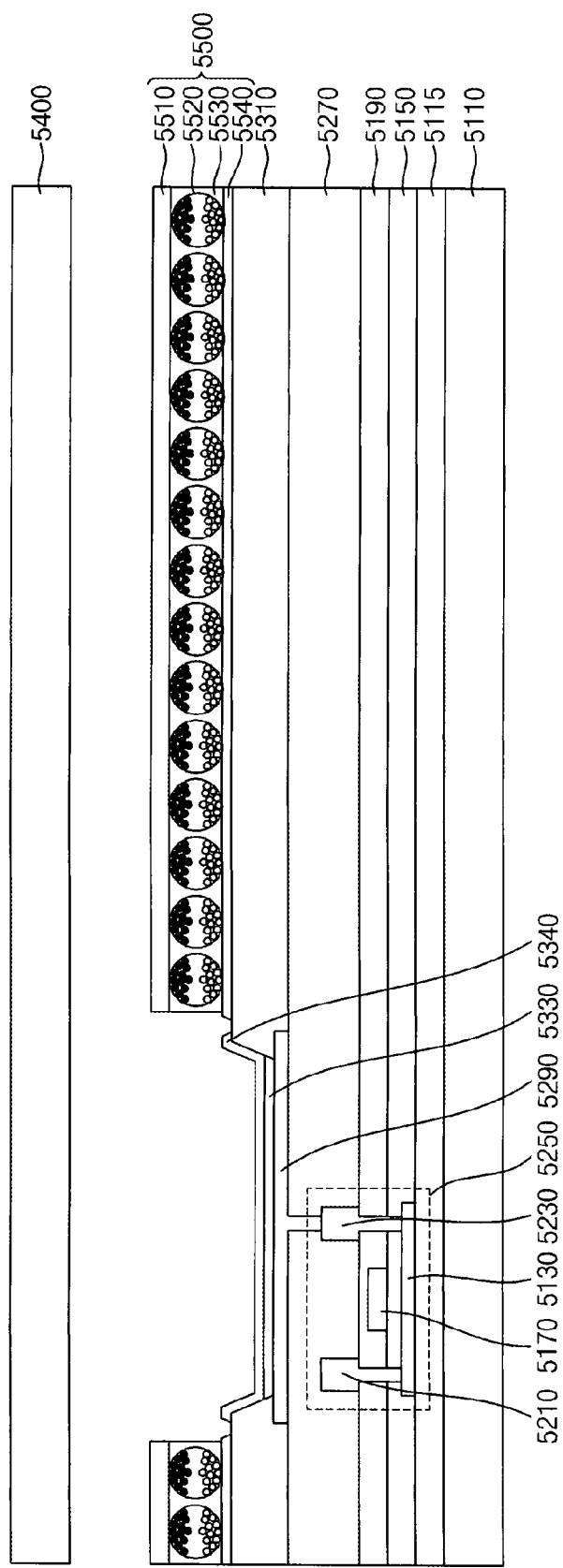
FIG. 43 is a cross-sectional view illustrating a display device, e.g., an organic light emitting display device, according to an embodiment.
Figure 44:
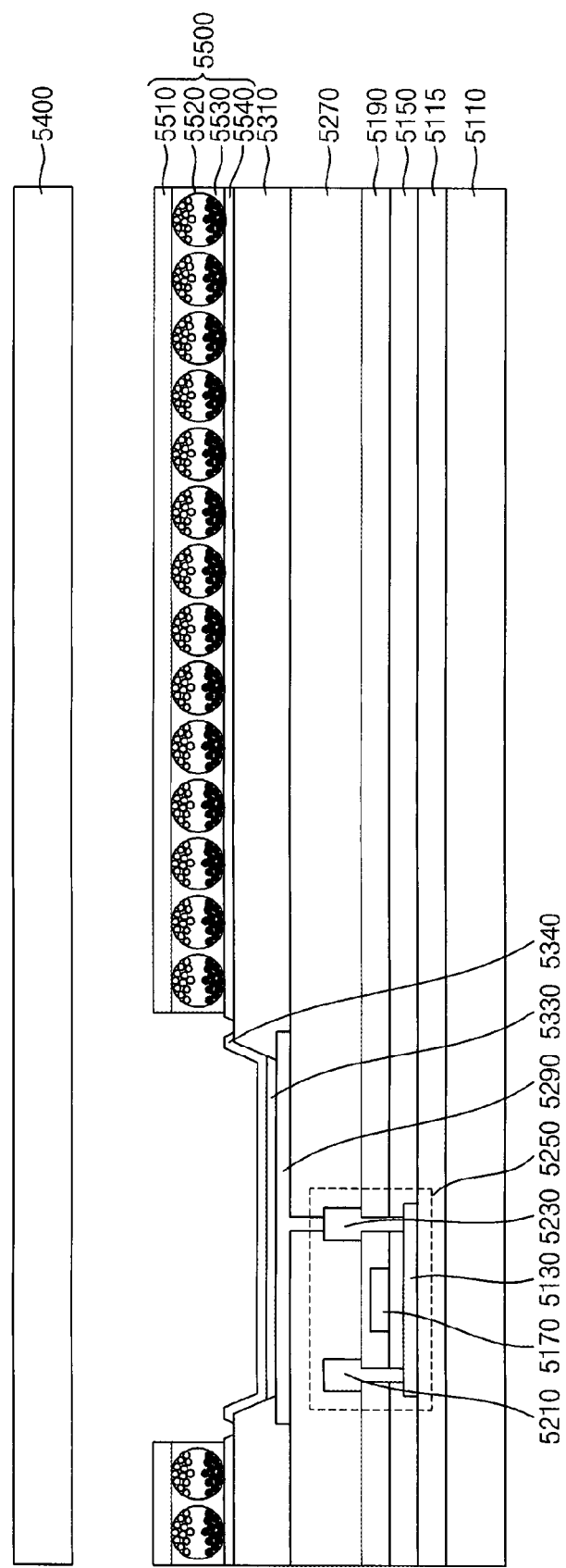
FIG. 44 is a cross-sectional view illustrating a display device, e.g., an organic light emitting display device, according to an embodiment.

FIG. 43 is a cross-sectional view illustrating an organic light emitting display device according to an embodiment. FIG. 44 is a cross-sectional view illustrating an organic light emitting display device according to an embodiment.

The organic light emitting display device according to an embodiment is substantially same as the organic light emitting display device of FIGS. 37 and 38 except for a switchable element 5500, and thus same reference numerals are used for same elements and repetitive explanation will be omitted.

Referring to FIGS. 43 and 44, an organic light emitting display device according to an embodiment includes a switchable element 5500 disposed on a pixel defining layer 5310.

The pixel defining layer 5310 is disposed on the first substrate 5110.

The pixel defining layer 5310 may be disposed the on third insulation layer 5270 to expose a portion of the first electrode 5290. The pixel defining layer 5310 may be formed of organic materials or inorganic materials. In this case, the light emitting layer 5330 may be disposed on a portion that the first electrode 5290 is exposed by the pixel defining layer 5310.

The light emitting layer 5330 may be disposed on the exposed first electrode 5290. The light emitting layer 5330 may be formed using light emitting materials capable of generating different colors of light (e.g., a red color of light, a blue color of light, and a green color of light). However, the light emitting layer 5330 may stack light emitting materials capable of generating different colors of light to emit white color of light.

The switchable element 5500 is disposed on a pixel defining layer 5310.

The switchable element 5500 includes a micro capsule 5520, a lower electrode 5540 and an upper electrode 5510.

The lower electrode 5540 is disposed on the pixel defining layer 5310. The lower electrode 5540 may be formed on the same layer as the second electrode 5340. The lower electrode 5540 may include same material as the second electrode 5340. The lower electrode 5540 may be formed of a metal, an alloy, metal nitride, conductive metal oxide, transparent conductive materials, etc.

The micro capsule 5520 is disposed on the lower electrode 5540. The micro capsule 5520 includes first particles including black material, second particles including reflection material and a fluid filled in the micro capsule 4520.

The upper electrode 5510 is disposed on the micro capsule 5520. The upper electrode 5510 may be formed of a metal, an alloy, metal nitride, conductive metal oxide, transparent conductive materials, etc.

For example, the upper electrode 5510 may include a transparent conductive material, such as indium tin oxide (ITO) and indium zinc oxide (IZO).

Referring to FIG. 43, when a "−" voltage is applied to the lower electrode 5540, an organic light emitting display device is operated as a mirror mode.

The micro capsule 5520 includes first particles including black material and second particles including reflection material. The first particles are charged by different electric charge from the second particles. For example, the first particles may be charged by "+" electric charge and the second particles may be charged by "−" electric charge.

When a "−" voltage is applied to the lower electrode 5540, the second particles are disposed upper portion of the micro capsule 5520 and the first particles are disposed lower portion of the micro capsule 5520. Since the second particles include reflection material, the switchable element 5500 may form a reflection surface on the reflection region II. Thus, the organic light emitting display device may be operated as a mirror mode. However, the first particles may be charged by "−" electric charge and the second particles may be charged by "+" electric charge. At this time, when a "+" voltage is applied to the lower electrode 5540, the organic light emitting display device may be operated in a mirror mode.

Referring to FIG. 44, when a "+" voltage is applied to the lower electrode 5540, an organic light emitting display device is operated as a non-mirror mode.

The micro capsule 5520 includes first particles including black material and second particles including reflection material. The first particles are charged by different electric charge from the second particles. For example, the first particles may be charged by "+" electric charge and the second particles may be charged by "−" electric charge.

When a "+" voltage is applied to the lower electrode 5540, the first particles are disposed upper portion of the micro capsule 5520 and the second particles are disposed lower portion of the micro capsule 5520. Since the first particles include black material, the switchable element 5500 may not form a reflection surface on the reflection region II. Thus, the organic light emitting display device may be operated as a non-mirror mode. However, the first particles may be charged by "−" electric charge and the second particles may be charged by "+" electric charge. At this time, when a "+" voltage is applied to the lower electrode 5540, the organic light emitting display device may be operated in a non-mirror mode.

Figure 45:
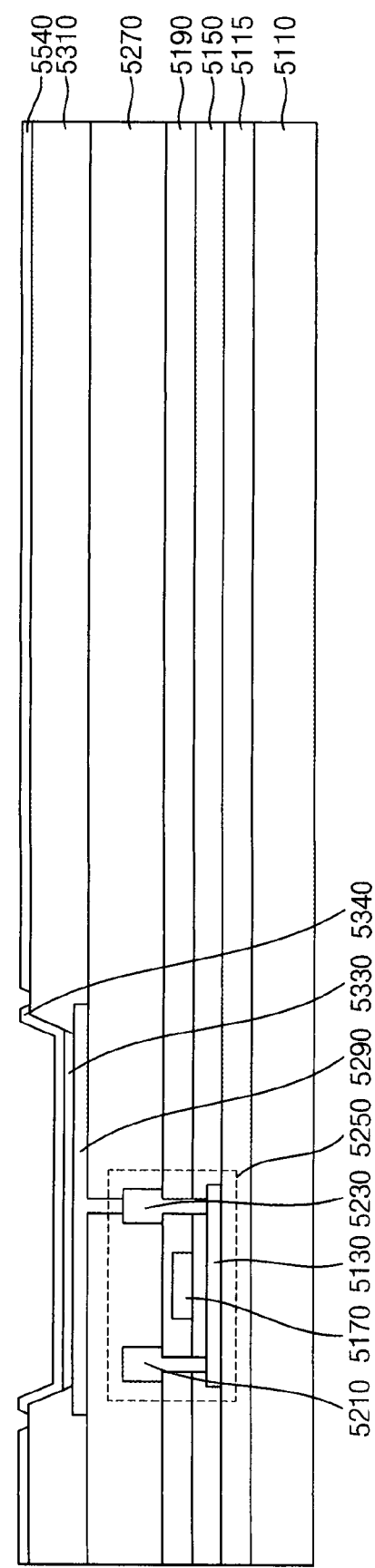
FIG. 45, FIG. 46, and FIG. 47 are cross-sectional views illustrating a method of manufacturing the display device of FIG. 43.
Figure 46:
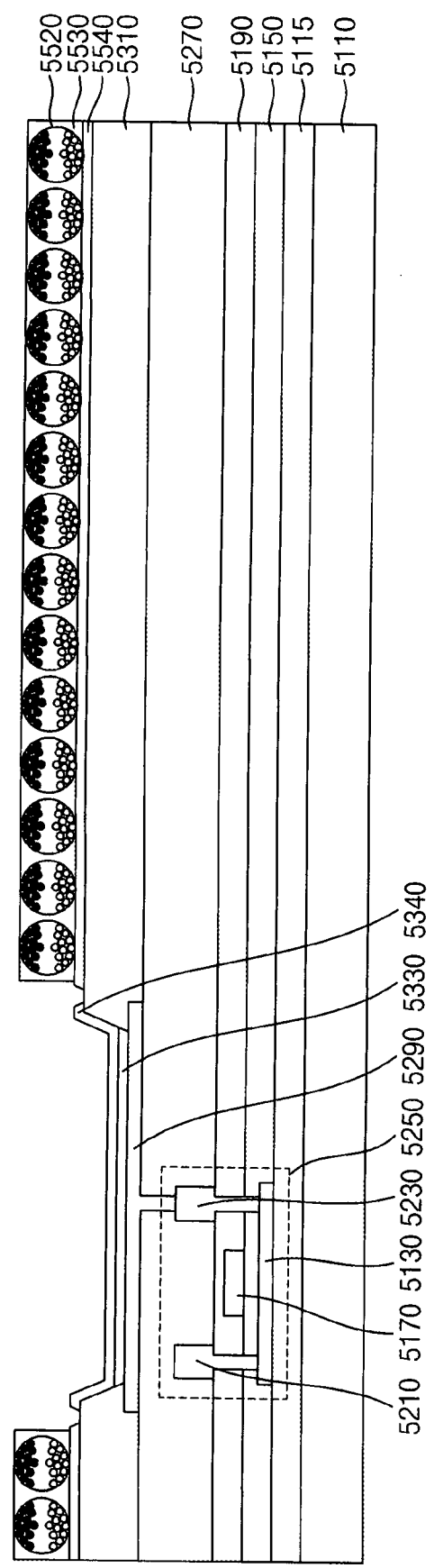
Figure 47:
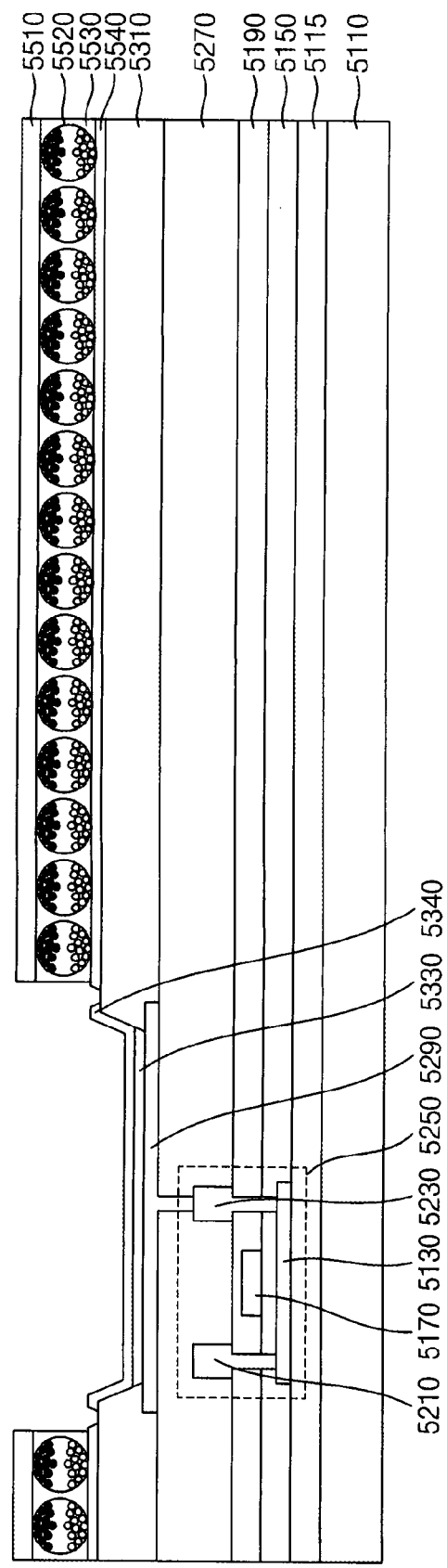

FIGS. 45 to 47 are cross-sectional views illustrating a method of manufacturing the organic light emitting display device of FIG. 43.

Referring to FIG. 45, the second electrode 5340 and the lower electrode 5340 are formed on the first substrate on which the pixel defining layer 5310 and the light emitting layer 5330 are formed.

A process of forming the second electrode 5340 on the first substrate 5110 is substantially same as the method of manufacturing the organic light emitting display device of FIG. 22, and thus repetitive explanation will be omitted.

The lower electrode 5540 may be formed on the same layer as the second electrode 5340. The lower electrode 5540 may include same material as the second electrode 5340. The lower electrode 5540 may be formed of a metal, an alloy, metal nitride, conductive metal oxide, transparent conductive materials, etc.

Referring to FIG. 46, the micro capsule 5520 and the binder film 5530 are formed on the first substrate 5110 on which the lower electrode 5540 is formed.

A process of forming the micro capsule 5520 and the binder film 5530 is substantially same as the method of manufacturing the organic light emitting display device of FIG. 41, and thus repetitive explanation will be omitted.

Referring to FIG. 47, the upper electrode 4510 is formed on the first substrate 5110 on which the micro capsule 5520 and the binder film 5530 are formed.

The upper electrode 5510 is disposed on the micro capsule 5520. The upper electrode 5510 may be formed of a metal, an alloy, metal nitride, conductive metal oxide, transparent conductive materials, etc.

For example, the upper electrode 5510 may include a transparent conductive material, such as indium tin oxide (ITO) and indium zinc oxide (IZO).

Referring to FIG. 43, the second substrate 5400 is formed on the first substrate 5110 on which the upper electrode 5510 is formed.

The second substrate 5400 and the first substrate 5110 may include substantially the same materials. For example, the second substrate 5400 may be formed of quartz, synthetic quartz, calcium fluoride, fluoride-doping quartz, soda-lime glass, non-alkali glass etc. In some example embodiments, the second substrate 5400 may be formed of a transparent inorganic material or flexible plastic. For example, the second substrate 5400 may include a flexible transparent resin substrate. In this case, to increase flexibility of the organic light emitting display device 5100, the second substrate 5400 may include a stacked structure where at least one organic layer and at least one inorganic layer are alternately stacked.

According to embodiments, a display device (e.g., an organic light emitting display device) includes a controllable element (e.g., a switchable element) of which reflectance (and/or reflectivity) in a predetermined direction may be controlled and/or changed through control and/or change of voltage applied to the controllable element. Advantageously, the display device may switch between a mirror mode and a non-mirror mode.

Although a few embodiments have been described, those skilled in the art will readily appreciate that many modifications are possible without materially departing from the novel teachings and advantages of the described embodiments. All such modifications are intended to be included within the scope defined in the claims.

What is claimed is:

1. An organic light emitting display device comprising:
  a first substrate comprising a light-emitting region and a reflection region;
  a light-emitting element disposed in the light-emitting region configured to emit red light, green light or blue light; and
  a switchable element disposed in the reflection region, comprising an oil solution that comprises reflection material, and configured to change reflectivity based on applied voltage.

2. The organic light emitting display device of claim 1, wherein the switchable element further comprises:
  a first switching element connected to a first gate line extending in a first direction and a second data line extending in a second direction crossing the first direction;
  a switchable electrode electrically connected to the first switching element;
  an insulation layer disposed on the switchable electrode;
  a spacer disposed on boundary portion of the light-emitting region and the reflection region; and
  an aqueous solution disposed in a space formed by the insulation layer and the spacer.

3. The organic light emitting display device of claim 2, wherein the oil solution is disposed in the space formed by the insulation layer and the spacer.

4. The organic light emitting display device of claim 2, wherein the insulation layer is hydrophobic.

5. The organic light emitting display device of claim 2, wherein the light-emitting element comprises:

a second switching element connected to a third gate line extending in the first direction and a fourth data line extending in the second direction crossing the first direction;
  a first electrode electrically connected to the second switching element;
  a light-emitting layer disposed on the first electrode; and
  a second electrode covering the light-emitting layer.

6. The organic light emitting display device of claim 5, wherein the first switching element is disposed on the same layer as the second switching element, and the switchable electrode is disposed on the same layer as the first electrode.

7. The organic light emitting display device of claim 5, further comprising:
  a middle insulation layer covering the light-emitting element, and
  wherein the first switching element is disposed on the same layer as the second switching element, and the switchable electrode is disposed on the middle insulation layer.

8. The organic light emitting display device of claim 1, when a voltage is not applied to the switchable element, the switchable element forms a reflection surface on the reflection region.

9. The organic light emitting display device of claim 2, further comprising:
  a second substrate comprising a light-emitting region and a reflection region and facing the first substrate, and
  wherein the light-emitting element is disposed on the first substrate and the switchable element is disposed on the second substrate.

10. An organic light emitting display device comprising:
  a first substrate comprising a light-emitting region and a reflection region;
  a light-emitting element disposed in the light-emitting region configured to emit red light, green light or blue light; and
  a switchable element disposed in the reflection region, comprising an hydrophobic layer, comprising an oil solution disposed on the hydrophobic layer, and configured to change reflectivity based on applied voltage, wherein a material of the oil solution is different from a material of the hydrophobic layer.

11. The organic light emitting display device of claim 10, when a voltage is not applied to the switchable element, the switchable element forms a reflection surface on the reflection region.

12. The organic light emitting display device of claim 9, further comprising:
  a reflection pattern disposed on the reflection region, and wherein the oil solution comprises black material.

13. The organic light emitting display device of claim 12, when a voltage is applied to the switchable element, the switchable element forms a reflection surface on the reflection region.

14. An organic light emitting display device comprising:
  a first substrate comprising a light-emitting region and a reflection region;
  a light-emitting element disposed in the light-emitting region configured to emit red light, green light or blue light; and
  a switchable element disposed in the reflection region and configured to change reflectivity based on applied voltage, wherein the switchable element comprises:
  a micro-capsule comprising a first particle comprising black material and a second particle comprising reflection material;

a lower electrode disposed under the micro-capsule; and
an upper electrode facing the lower electrode and disposed on the micro-capsule.

15. The organic light emitting display device of claim 14, wherein the first particle is charged by "+" electric charge and the second particle is charged by "−" electric charge.

16. The organic light emitting display device of claim 15, when a "−" voltage is applied to the lower electrode, the switchable element forms a reflection surface on the reflection region.

17. The organic light emitting display device of claim 14, wherein the first particle is charged by "−" electric charge and the second particle is charged by "+" electric charge.

18. The organic light emitting display device of claim 17, when a "+" voltage is applied to the lower electrode, the switchable element forms a reflection surface on the reflection region.

19. The organic light emitting display device of claim 14, further comprising:
   a second substrate comprising a light-emitting region and a reflection region and facing the first substrate, and
   wherein the switchable element is disposed on the second substrate.

20. The organic light emitting display device of claim 14, wherein the switchable element is disposed on the first substrate.

* * * * *